(12) United States Patent
Redmond et al.

(10) Patent No.: US 12,395,162 B2
(45) Date of Patent: Aug. 19, 2025

(54) SYSTEM AND METHOD OF QUANTUM STOCHASTIC ROUNDING USING SILICON BASED QUANTUM DOT ARRAYS

(71) Applicant: equal1.labs Inc., Fremont, CA (US)

(72) Inventors: David J. Redmond, Cork (IE); Dirk Robert Walter Leipold, Fremont, CA (US); Imran Bashir, San Jose, CA (US); Robert Bogdan Staszewski, Dublin (IE)

(73) Assignee: Equal1.Labs Inc., Fremont, CA (US)

( * ) Notice: Subject to any disclaimer, the term of this patent is extended or adjusted under 35 U.S.C. 154(b) by 954 days.

(21) Appl. No.: 17/522,873

(22) Filed: Nov. 9, 2021

(65) Prior Publication Data
US 2022/0147314 A1  May 12, 2022

Related U.S. Application Data

(60) Provisional application No. 63/112,843, filed on Nov. 12, 2020.

(51) Int. Cl.
*H03K 3/84* (2006.01)
*G06N 3/04* (2023.01)
(Continued)

(52) U.S. Cl.
CPC ............. *H03K 3/84* (2013.01); *G06N 3/04* (2013.01); *G06N 3/047* (2023.01); *G06N 3/063* (2013.01);
(Continued)

(58) Field of Classification Search
CPC .. H03K 3/84; H03K 3/38; G06N 3/04; G06N 3/047; G06N 3/063; G06N 3/08;
(Continued)

(56) References Cited

U.S. PATENT DOCUMENTS 6,301,029 B1   10/2001   Azuma et al.
6,472,681 B1   10/2002   Kane et al.
(Continued)

FOREIGN PATENT DOCUMENTS

CN   108776582 A   11/2018
EP      1860600     11/2008
(Continued)

OTHER PUBLICATIONS

Xia et al., "Improved Stochastic Rounding," in arXiv preprint arXiv:20067.00489 (2020). (Year: 2020).*
(Continued)

*Primary Examiner* — Ryan C Vaughn
(74) *Attorney, Agent, or Firm* — Zaretsky Group PC; Howard Zaretsky

(57) ABSTRACT

A novel and useful system and method of quantum stochastic rounding using silicon based quantum dot arrays. Unitary noise is derived from a probability of detecting a particle within a quantum dot comprising position based charge qubits with two time independent basis states |0> and |1>. A two level electron tunneling device generates quantum noise and includes a reservoir of particles, a quantum dot, and a barrier used to control tunneling between the reservoir and the quantum dot. A detector outputs a digital stream corresponding to the probability of a particle being detected. Controlling the bias applied to the barrier controls the probability of detection. The probability density function (PDF) of the output unitary noise is controlled to correspond to a desired probability. Unitary noise is used to perform stochastic rounding by controlling the bias applied to the barrier according to a remainder of numbers to be rounded.

20 Claims, 34 Drawing Sheets

(51) Int. Cl.
*G06N 3/047* (2023.01)
*G06N 3/063* (2023.01)
*G06N 3/08* (2023.01)
*G06N 10/40* (2022.01)
*H03K 3/38* (2006.01)
*H10D 48/00* (2025.01)
*H10N 99/00* (2023.01)

(52) U.S. Cl.
CPC .............. *G06N 3/08* (2013.01); *G06N 10/40* (2022.01); *H03K 3/38* (2013.01); *H10D 48/383* (2025.01); *H10N 99/05* (2023.02)

(58) Field of Classification Search
CPC ........ G06N 10/40; G06N 3/045; G06N 3/048; G06N 10/70; G06N 3/084; H10D 48/383; H10D 30/402; H10D 64/27; B82Y 10/00; G06F 7/49947; H10N 99/05; H10N 69/00
See application file for complete search history.

(56) References Cited

U.S. PATENT DOCUMENTS

| | | |
|---|---|---|
| 6,597,010 B2 | 7/2003 | Eriksson |
| 6,635,898 B2 | 10/2003 | Williams et al. |
| 6,657,222 B1 | 12/2003 | Foden et al. |
| 6,720,589 B1 | 4/2004 | Shields |
| 6,787,794 B2 | 9/2004 | Cain |
| 7,026,641 B2 | 4/2006 | Mohseni |
| 7,317,230 B2 | 1/2008 | Lee et al. |
| 7,451,292 B2 | 11/2008 | Routt |
| 7,498,832 B2 | 3/2009 | Baumgardner |
| 7,655,850 B1 | 2/2010 | Ahn |
| 7,659,538 B2 | 2/2010 | Snyder et al. |
| 7,830,695 B1 | 11/2010 | Moon |
| 8,035,540 B2 | 10/2011 | Berkley |
| 8,229,863 B2 | 7/2012 | Amin |
| 8,294,137 B2 | 10/2012 | Jain et al. |
| 8,507,894 B2 | 8/2013 | Morello |
| 8,576,614 B2 | 11/2013 | Heyns |
| 9,093,499 B2 | 7/2015 | Noel |
| 9,126,829 B2 | 9/2015 | Wu |
| 9,153,594 B2 | 10/2015 | Jain |
| 9,269,052 B2 | 2/2016 | Svore et al. |
| 9,502,265 B1 | 11/2016 | Jiang |
| 9,633,313 B2 | 4/2017 | Svore et al. |
| 9,691,033 B2 | 6/2017 | Rogge |
| 9,741,081 B2 | 8/2017 | Alboszta et al. |
| 9,842,921 B2 | 12/2017 | Eriksson |
| 9,858,531 B1 | 1/2018 | Monroe |
| 9,859,409 B2 | 1/2018 | Cheng et al. |
| 9,978,020 B1 | 5/2018 | Gambetta |
| 10,068,903 B2 | 9/2018 | Edwards |
| 10,192,976 B2 | 1/2019 | Petta |
| 10,229,365 B2 | 3/2019 | Fuechsle |
| 10,255,556 B2 | 4/2019 | Hollenberg |
| 10,311,369 B2 | 6/2019 | Epstein |
| 10,332,023 B2 | 6/2019 | Mezzacap |
| 10,340,290 B2 | 7/2019 | Pawlak |
| 10,353,862 B2 | 7/2019 | Henry |
| 10,380,496 B2 | 8/2019 | Elsherbini et al. |
| 10,446,700 B2 | 10/2019 | Wang |
| 10,482,388 B1 | 11/2019 | Jock |
| 10,483,980 B2 | 11/2019 | Sete |
| 10,491,221 B1 | 11/2019 | McKay |
| 10,528,884 B2 | 1/2020 | Morello |
| 10,560,096 B2 | 2/2020 | Raeis |
| 10,565,515 B2 | 2/2020 | Lampert |
| 10,635,989 B2 | 4/2020 | Blais |
| 10,726,351 B1 | 7/2020 | Li et al. |
| 10,763,349 B2 | 9/2020 | Pillarisetty et al. |
| 10,804,399 B2 | 10/2020 | Pillarisetty |
| 10,929,769 B2 | 2/2021 | Pioro-Ladriere |
| 11,031,239 B2 | 6/2021 | Cheng |
| 11,094,716 B2 | 8/2021 | Basu |
| 11,203,526 B2 | 12/2021 | Leipold |
| 11,222,977 B2 | 1/2022 | Glass |
| 2002/0190249 A1 | 12/2002 | Williams et al. |
| 2007/0063182 A1 | 3/2007 | Yang |
| 2008/0172197 A1 | 7/2008 | Skipor |
| 2009/0127542 A1 | 5/2009 | Sugaya |
| 2010/0155808 A1 | 6/2010 | Makihara |
| 2011/0121895 A1 | 5/2011 | Morello |
| 2011/0309236 A1 | 12/2011 | Tian |
| 2012/0212375 A1 | 8/2012 | Depree |
| 2013/0087766 A1 | 4/2013 | Schenkel |
| 2014/0026107 A1 | 1/2014 | Bocharov |
| 2014/0203243 A1 | 7/2014 | Xiao |
| 2016/0021560 A1 | 1/2016 | Reshef et al. |
| 2016/0112066 A1 | 4/2016 | Ashikhmin |
| 2016/0189053 A1 | 6/2016 | Alboszta et al. |
| 2016/0204202 A1 | 7/2016 | Jain |
| 2016/0268406 A1 | 9/2016 | Barraud |
| 2016/0300155 A1 | 10/2016 | Betz |
| 2017/0147939 A1 | 5/2017 | Dzurak et al. |
| 2017/0214070 A1 | 7/2017 | Wang |
| 2017/0300808 A1 | 10/2017 | Ronagh et al. |
| 2018/0122336 A1 | 5/2018 | Kunitake |
| 2018/0260732 A1 | 9/2018 | Bloom |
| 2018/0279429 A1 | 9/2018 | Sadwick |
| 2019/0044049 A1 | 2/2019 | Thomas et al. |
| 2019/0044050 A1 | 2/2019 | Pillarisetty et al. |
| 2019/0044542 A1 | 2/2019 | Hogaboam et al. |
| 2019/0080256 A1 | 3/2019 | Irwin |
| 2019/0130298 A1 | 5/2019 | Pioro-Ladriere |
| 2019/0164959 A1 | 5/2019 | Thomas |
| 2019/0181256 A1 | 6/2019 | Roberts |
| 2019/0198618 A1 | 6/2019 | George |
| 2019/0214385 A1 | 7/2019 | Roberts et al. |
| 2019/0266509 A1 | 8/2019 | Hutin |
| 2019/0266511 A1 | 8/2019 | Pillarisetty |
| 2019/0273197 A1 | 9/2019 | Roberts |
| 2019/0334020 A1 | 10/2019 | Amin |
| 2019/0392341 A1 | 12/2019 | Leipold |
| 2019/0392352 A1 | 12/2019 | Lampert |
| 2019/0392912 A1 | 12/2019 | Leipold et al. |
| 2019/0392913 A1 | 12/2019 | Leipold et al. |
| 2019/0392917 A1 | 12/2019 | Leipold |
| 2019/0393397 A1 | 12/2019 | Leipold |
| 2020/0126980 A1 | 4/2020 | Park |
| 2020/0127096 A1 | 4/2020 | Eendebak |
| 2020/0160205 A1 | 5/2020 | Leipold |
| 2020/0169396 A1 | 5/2020 | Neven et al. |
| 2020/0285947 A1 | 9/2020 | Gunnels et al. |
| 2020/0311525 A1 | 10/2020 | Kachman |
| 2020/0312846 A1 | 10/2020 | Rachmady |
| 2020/0328277 A1 | 10/2020 | Jain |
| 2020/0412532 A1 | 12/2020 | Shi et al. |
| 2021/0342730 A1 | 11/2021 | Redmond |
| 2022/0067563 A1 | 3/2022 | Bonderson |

FOREIGN PATENT DOCUMENTS

| | | | |
|---|---|---|---|
| EP | 2421043 | 2/2012 | |
| EP | 3505490 | 1/2018 | |
| EP | 3869421 | 8/2021 | |
| KR | 20180112833 A | 10/2018 | |
| WO | 2018004554 | 1/2018 | |
| WO | WO-2020033974 A1 * | 2/2020 | ............ G06F 11/004 |
| WO | 2020245013 | 10/2020 | |

OTHER PUBLICATIONS

Vogel et al., "Efficient Hardware Acceleration for Approximate Inference of Bitwise Deep Neural Networks," in Conf. Design and Architectures for Signal and Image Processing (2017). (Year: 2017).*
Morau et al., "Transport spectroscopy of coupled donors in silicon nano-transistors", Scientific Reports 4(2014) 6219.
Hendrickx et al., "Gate-Controlled Quantum Dots and Superconductivity in Planar Germanium", 2018, Arxiv, pp. 1-8 (2018).
Yazdani et al., "A Quantum Physical Design Flow Using ILP and Graph Drawing", 2013, Arxiv, pp. 1-28 (2013).

(56) References Cited

OTHER PUBLICATIONS

Bernardo-Gavito, R., Bagci, I.E., Roberts, J. et al. Extracting random numbers from quantum tunnelling through a single diode. Sci Rep 7, 17879 (2017). https://doi.org/10.1038/s41598-017-18161-9 Dec. 31, 2017 (Dec. 31, 2017).

Hopkins M, Mikaitis M, Lester DR, Furber S. 2020 Stochastic rounding and reduced-precision fixed-point arithmetic for solving neural ordinary differential equations.Phil. Trans. R. Soc. A 378: 20190052. http://dx.doi.org/10.1098/rsta.2019.0052, Jan. 20, 2020 (Jan. 20, 2020).

I. Bashir et al., "A Single-Electron Injection Device for CMOS Charge Qubits Implemented in 22-nm FS-SOI," in SSC Letters, vol. 3, Jul. 2020, pp. 206-209 Jul. 21, 2020 (Jul. 21, 2020).

I. V. P. D. Reyes, A. M. Sison and R. P. Medina, "A Novel Fused Random Pooling Method for Convolutional Neural Network to Improve Image Classification Accuracy," 2019 IEEE 6th International Conference on Engineering Technologies and Applied Sciences (ICETAS), 2019, pp. 1-5, doi: 10.1109/ICETAS48360.2019.9117323. Dec. 31, 2019 (Dec. 31, 2019).

Krishnakumar, R., & Zeng, W. (2021). Quantum Rounding. arXiv preprint arXiv:2108.05949. Aug. 12, 2021 (Aug. 12, 2021).

Xia, Lu, et al. "A Simple and Efficient Stochastic Rounding Method for Training Neural Networks in Low Precision." arXiv preprint arXiv:2103.13445 (2021). Mar. 24, 2021 (Mar. 24, 2021).

Guo et al., "Control and Readout of Software in Superconducting Quantum Computing," https://arxiv.org/abs/1806.04021, Jun. 2018.

Alkhalil et al., "Realization of Fully Tunable FinFET Double Quantum Dots with Close Proximity Plunger Gates," 12th EEE International Conference on Nanotechnology (IEEE-NANO), 2012.

Kuhlmann et al., "Ambipolar quantum dots in undoped silicon fin field-effect transistors," Applied Physics Letters 113 122107, 2018.

Angus et al., "Gate-Defined Quantum Dots in Intrinsic Silicon," Nano Letters, vol. 7, No. 7, pp. 2051-2055, 2007.

Lansbergen et al., "Transport-based dopant metrology in advanced FinFETs," IEEE, 2008.

Zajac et al, "Resonantly driven CNOT gate for electron spins", Science 359, pp. 439-442, 2018.

Veldhorst et al, "A Two Qubit Logic Gate in Silicon", 2014.

Rashba. "Electron spin operation by electric fields: spin dynamics and spin injection," Physica E 20 (2004) pp. 189-195.

Krishnakumar et al., "Quantum rounding," Quantum Physics, 2021.

* cited by examiner

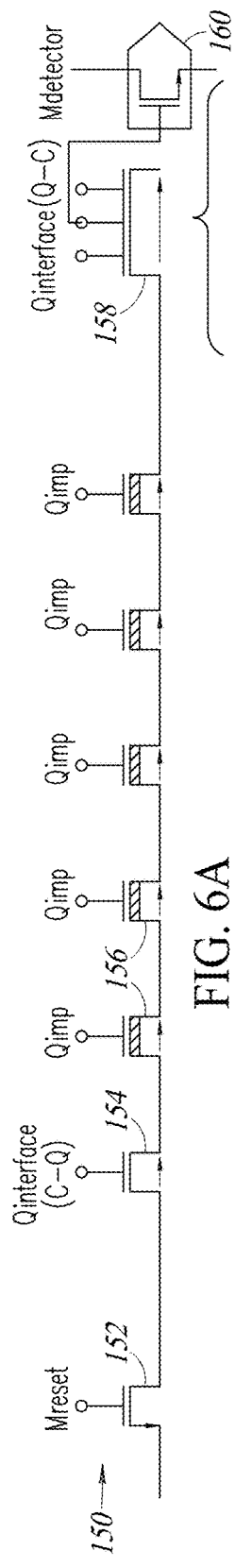
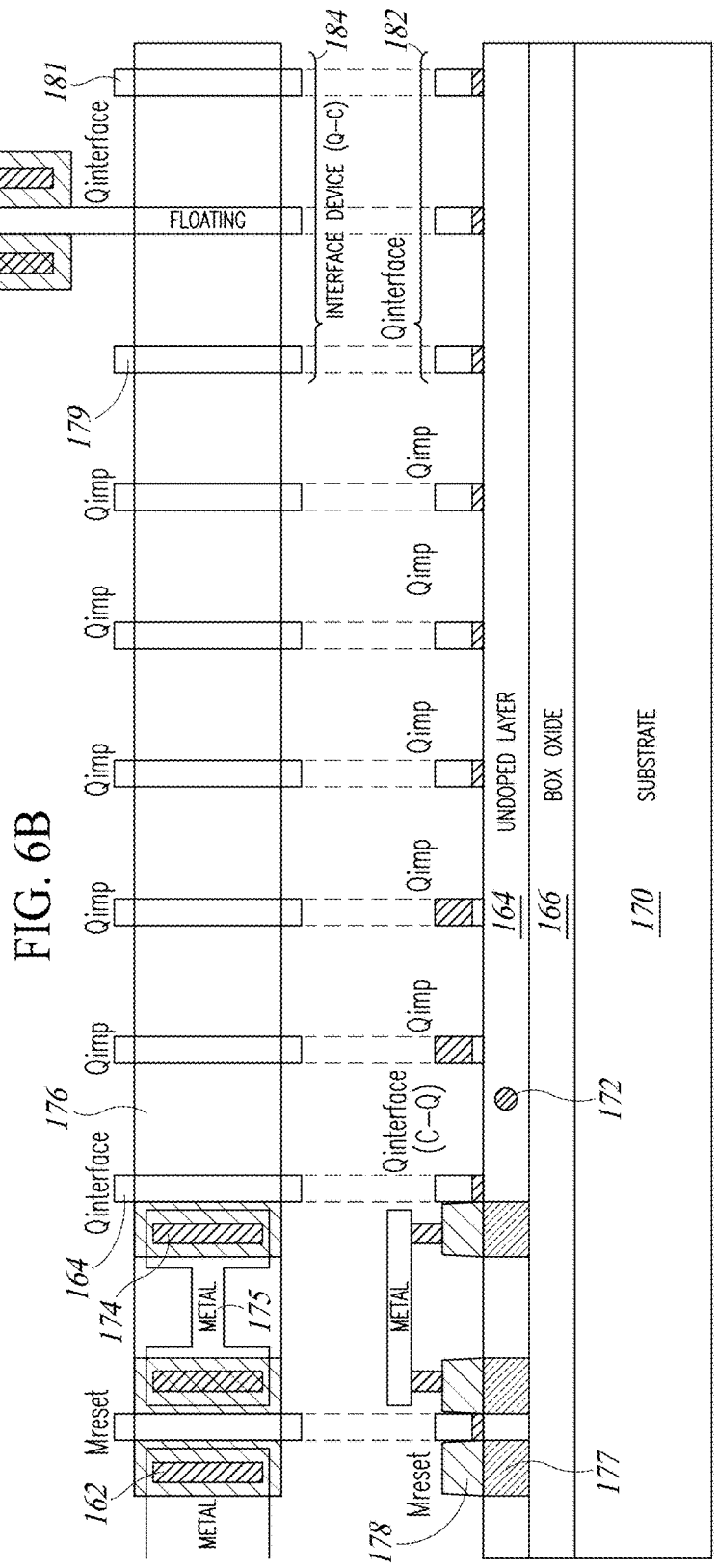
FIG. 6A
FIG. 6B
FIG. 6C

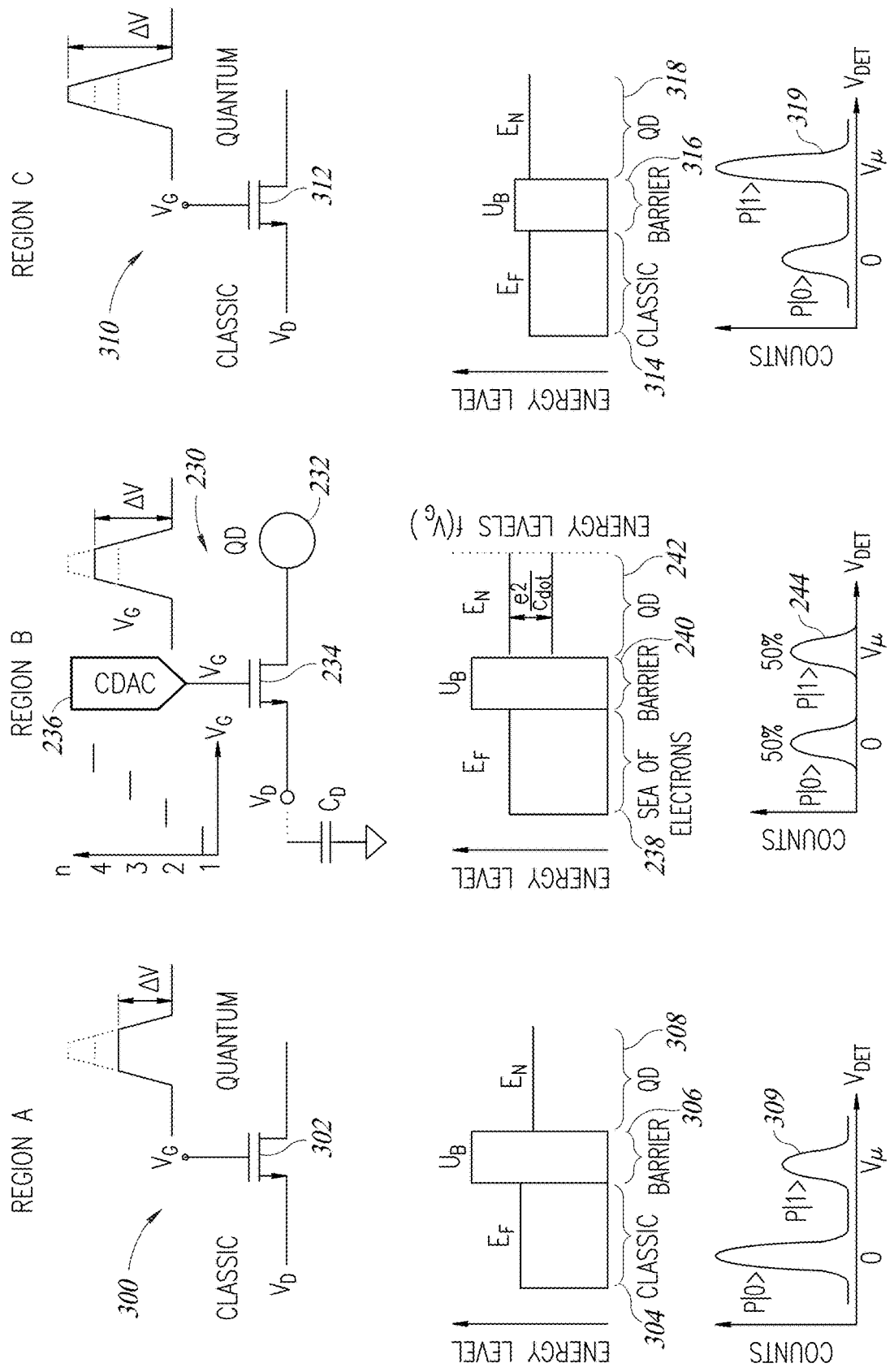

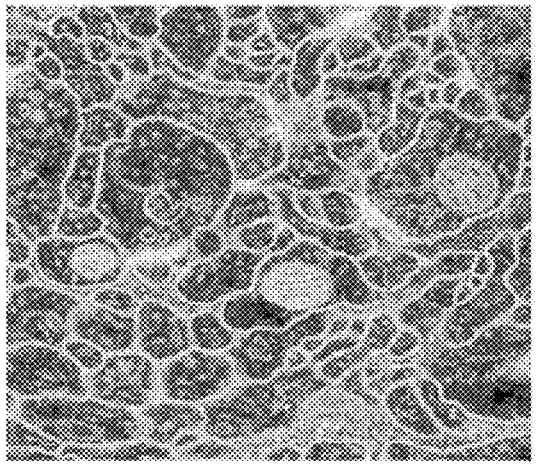
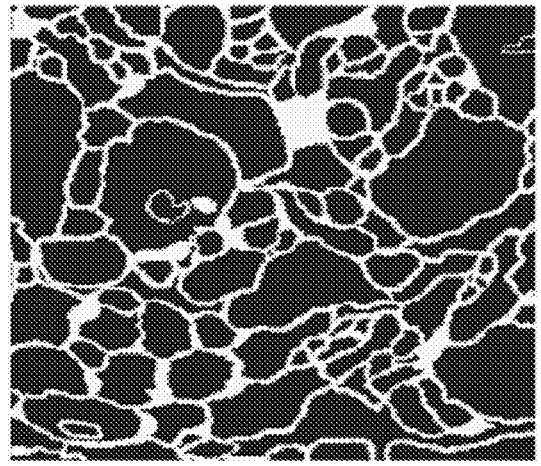
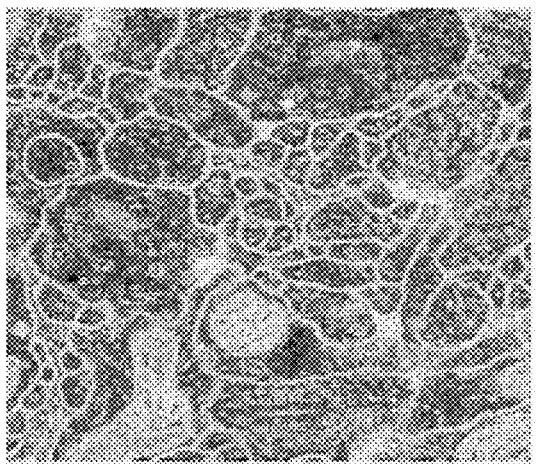
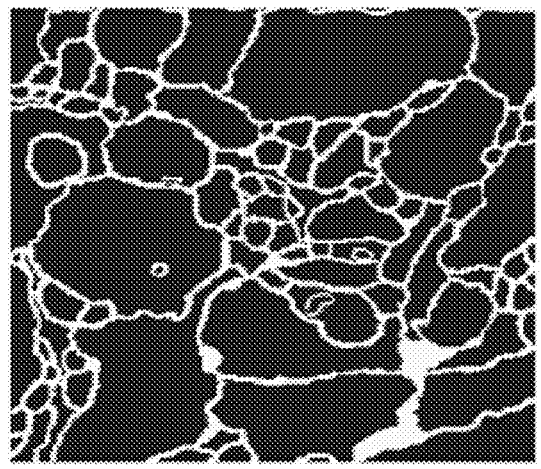
FIG. 36

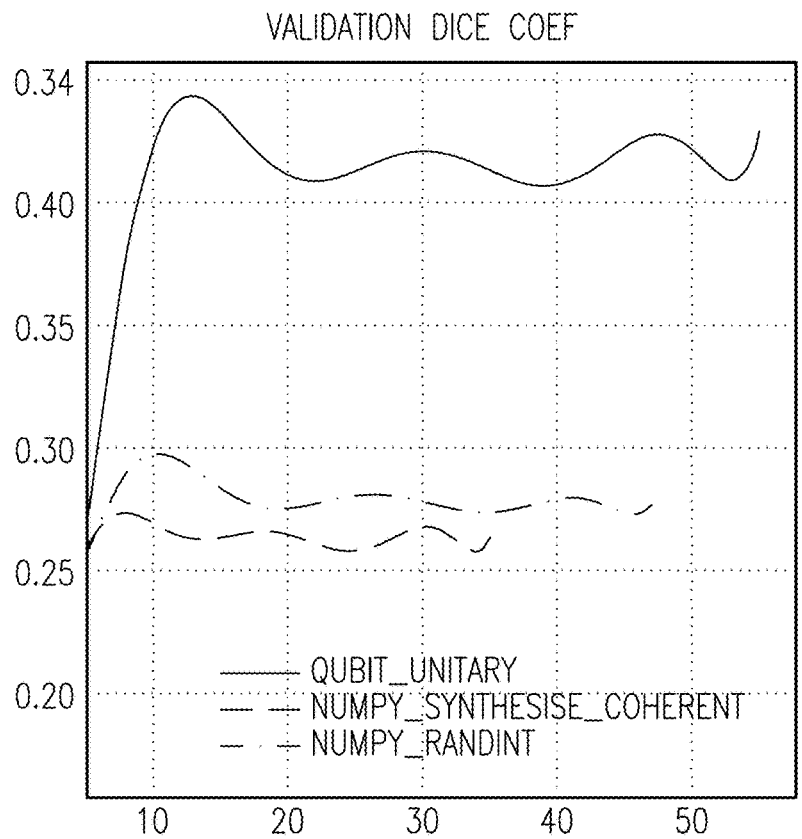
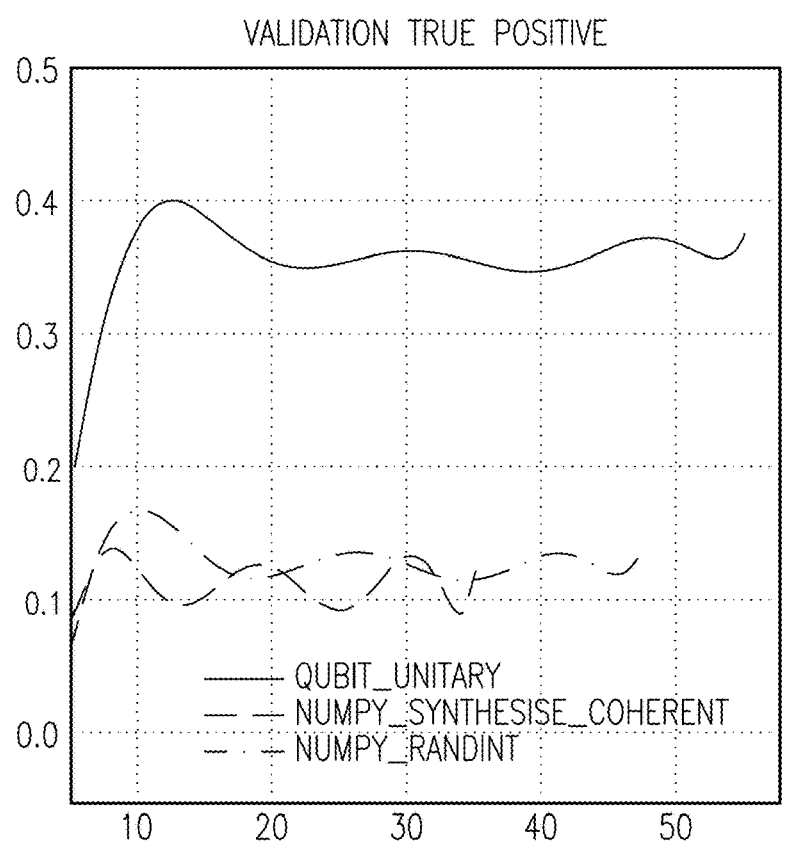
FIG. 45

SYSTEM AND METHOD OF QUANTUM STOCHASTIC ROUNDING USING SILICON BASED QUANTUM DOT ARRAYS

REFERENCE TO PRIORITY APPLICATION

This application claims the benefit of U.S. Provisional Application No. 63/112,843, filed Nov. 12, 2020, entitled "Accelerated Learning In Neural Networks Using Quantum Unitary Noise Generated Using Silicon Quantum Dot Arrays," incorporated herein by reference in its entirety.

FIELD OF THE DISCLOSURE

The subject matter disclosed herein relates to the field of quantum computing and more particularly relates to a system and method of quantum stochastic rounding using silicon based quantum dot arrays.

BACKGROUND OF THE INVENTION

Quantum computing is a new paradigm that exploits fundamental principles of quantum mechanics, such as superposition and entanglement, to tackle problems in mathematics, chemistry and material science that are well beyond the reach of supercomputers. Its power is derived from a quantum bit (qubit), which can simultaneously exist as a superposition of both 0 and 1 states and can become entangled with other qubits. This leads to doubling the computational power with each additional qubit, which can be repeated many times. It has been already shown that quantum computers can speed up some of the algorithms and, potentially, model any physical process.

Currently, modern artificial intelligence (AI) models consume a massive amount of energy, and these energy requirements are growing at a breathtaking rate. In the era of deep learning, the computational resources needed to produce a best-in-class AI model has on average doubled approximately every 3.4 months. This translates to a 300,000× increase between 2012 and 2018. For example, OpenAI built a very large AI model GPT-3 consisting of 175 billion parameters. The previous model GPT-2 had 1.5 billion parameters which took a few dozen petaflop-days to train. The GPT-3 model requires several thousand petaflop-days to train.

A problem with ever larger neural network models is that building and deploying these models entails a tremendous amount of energy which translates to carbon emissions. In addition, the time to train such models is measured in days and weeks. The reason machine learning models consume so much energy is because the datasets used to train these models continue to balloon in size. For example, the BERT model achieved superior natural language processing (NLP) performance after it was trained on a dataset of three billion words. The XLNet model outperformed BERT on a training set of 32 billion words. The GPT-2 model was trained on a dataset of 40 billion words. A weights dataset of approximately 500 billion words was used to train the GPT-3 model.

As another example, consider that the major trend in the medical sector is the increased use of imaging techniques which leads to large amounts of complex data in the form of, e.g., x-rays, CAT scans, and MRIs. While imaging as a technique in medical practice is increasing, and consequently the workload associated with the analysis of this data, the number of trained radiologists stays more or less constant. Research published by IBM estimates that medical images currently account for greater than 90% of all medical data. This amount of data is surpassing the normally available processing power so much of it is largely ignored, and coupled with overworked radiologists, there is a growing gap and need for a workable solution before the problem becomes more acute.

Developments in deep learning models showed that comparable performance with an expert radiologist can be achieved while greatly improving the efficiency of radiologists in clinical practice. Thus AI holds great potential to relieve the pressure of frontline radiologists, improve early diagnosis, isolation and treatment, and thus contribute to the control of the epidemic. Fundamentally, deep learning algorithms excel at automatically learning and recognizing complex patterns in unstructured data. For medical imaging, deep learning is therefore particularly interesting. There are, however, many other inherent problems with medical image datasets as described below.

Regarding training times, deep learning requires very large data sets in order to reach the required levels of accuracy, particularly for a medical diagnosis, and with these large datasets comes the penalty of extremely long training run times, and the need for access to high performance computers. With many new sources of biomedical data becoming available, training cycle times of several days and weeks mean valuable information is lost.

Regarding the accuracy of the model, extracting a diagnosis from biomedical images requires a different metric for classification, given the consequences of the outcome.

Also, privacy is an issue that has been getting much attention recently in almost all areas. In addition, data sharing is a complex issue, especially in the medical sector. The direct impact to AI medical imaging is the sharing of labels in the datasets, which reduces the total amount of useful data on which to train. As part of any natural occurring training set there will be errors in the labelling. These errors actually oftentimes can improve the algorithm, but in a context of medical datasets accuracy of labelling is not always assured. There are also political factors influencing the transparency of labelled data.

The explainability of a deep learning model is hard to uncover and interpret, so the rationale behind the reasoning as to why a particular decision is correct often remains elusive. Recently, a number of prestigious publications that attempted to explain even minor algorithm improvements have been subsequently disproved. This contributes to the difficulty in providing a credible rationale of deep learning's findings.

Development of new models and algorithms is moving at a very high pace with researchers publishing incremental improvements daily. These innovations, however, are not always easy to compare across a broad selection of biomedical images datasets, and the metrics can also be subjective.

Distributed deep learning and similar advanced techniques that employ data and model parallelism provide some speed up in the training. These techniques, however, still struggle with the bottleneck caused by the sequential nature of gradient descent, and are generally beyond the reach of most medical institutions.

Regarding cost and carbon footprint, several cost examples were provided supra. In another example, the cost for an entry level network like ResNet50 ImageNet with 26 epochs ~90 to 100 mins at $11-$16 for a moderate accuracy of ~93%. In addition, the BERT models emit a carbon dioxide footprint of 1438 $CO_{2e}$ at a cloud compute cost of $3,751-$12,571 using a cluster of 64 V100 TPUs.

Note that today's current solutions use large scale training with large datasets that run on distributed deep learning clusters, usually of the latest TPUs often hosted by Google™, Microsoft™, Nvidia™, AWS™, and others. These clusters, however, are very power inefficient, expensive to run, have limited accessibly via batch or queueing systems, do not scale to wide scale deployment where data privacy, proprietary information, or citizens' rights may be a factor.

In operation, neural networks carry out a lengthy set of mathematical operations (both forward propagation and back propagation) for each piece of data they are fed during training, updating their parameters in complex ways. Larger datasets therefore translate to soaring compute and energy requirements.

Also driving AI energy consumption is the extensive experimentation and tuning required to develop a model. Machine learning today remains largely an exercise in trial and error. Practitioners often build hundreds of versions of a given model during training, experimenting with different neural architectures and hyperparameters before identifying an optimal design. For the GPT-3 model, 4,789 different versions were trained, requiring 9,998 total days' worth of GPU time (more than 27 years).

The process of inference whereby AI models are deployed to take action in real-world settings consumes even more energy than training does. It is estimated that 80% to 90% of the cost of a neural network is in inference rather than training. Unlike training, once a network is trained, inference may be performed constantly such as in an autonomous vehicle in order to navigate its environment while the vehicle is in use. The more parameters the model has, the steeper the energy requirements are for the ongoing inference.

Deep learning is a branch of machine learning that uses a layered architecture of data processing stages for pattern recognition. Due to its effectiveness in many applications, deep learning has gained popularity in both academia and industry. Currently, convolutional neural networks (CNNs) are the most successful models for deep learning, and they are used in numerous domains.

In general, convolutional neural networks simulate the way in which human brains process and recognize images. They belong to the family of multi-layer perceptrons (MLP). A MLP is a multi-layer neural network consisting of an input layer, an output layer and multiple hidden layers between the input and output layers. Each hidden layer represents a function between its inputs and outputs that is defined by the layer's parameters.

Convolutional neural networks mainly consist of three types of layers: convolutional layers, pooling layers, and fully connected layers. Each layer may contain hundreds, thousands or millions of neurons. A single neuron takes inputs, optionally adds a bias, applies weights to each input to compute their weighted sum, typically applies a nonlinear function on it, and sends the output to the neurons in the next layer. In this way, distinct layers apply different operations to their inputs and produce outputs for subsequent layers.

Convolutional layers apply convolutions to the input with several filters and add a bias term to the results. Very often, a nonlinear function called an activation function is applied to the results. Convolutional layers exploit spatial connectivity and shared weights. The parameters of a convolutional layer are reduced dramatically compared to a typical hidden layer of a MLP. Convolutional layers are the most computationally intensive layers in CNNs.

Pooling layers perform a nonlinear down-sampling operation on the input. They partition the input into a set of sub-regions and output sampled results from these sub-regions. Based on their sampling method, pooling layers can be categorized into: maximum pooling, average pooling, and stochastic pooling. Pooling layers progressively reduce the number of parameters as well as control model overfitting. Pooling layers are usually placed between two convolutional layers.

Unlike in convolutional layers, neurons in fully connected layers have full connections to all output from the preceding layers. As a consequence, a fully connected layer has many more parameters than a convolutional layer. Nonetheless, since convolution operations are replaced by multiplications, fully connected layers require less computational power.

Using CNNs for machine learning tasks involves three steps: (1) designing the CNN architecture, (2) learning the parameters of the CNN (also called "training"), and (3) using the defined CNN for inference. Since CNNs are backpropagation learning algorithms, their learning phases can be divided into: forward propagation, backward propagation, and weight update. In the forward propagation phase, input data are sent to the neural network to generate the outputs. In the backward propagation phase, the errors between the standard outputs and the produced outputs are propagated in a backward fashion to compute the errors in each layer. These errors, i.e. gradients, in each layer will be used in every weight update. For inference, however, the parameters of the networks are given and there is only forward propagation to produce the prediction.

There is thus a need for a mechanism to drastically reduce the energy consumption a neural network consumes both during training and inference. At the same time, such a mechanism should also reduce the time required for training and inference operations.

SUMMARY OF THE INVENTION

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

A technique is provided to significantly improve performance of a neural network using unitary quantum noise obtained from a position-based charge qubit of a quantum processor unit (QPU). A quantum dot array (QDA) in the QPU is used to generate unitary quantum noise whose probability density function (PDF) can be controlled by appropriate bias signals applied to the qubits in the QDA. The quantum noise can also be used to perform stochastic rounding (also referred to as quantum rounding) in the layers of the neural network. Application of the quantum noise and quantum rounding yields significant improvements in the training accuracy especially for small training sets. This is particularly relevant for biomedical AI and other similar application fields, where there are few reliable resources to perform transfer learning. Hence, very fast training using a relatively small number of labeled images is highly desirable. Introduction of unitary quantum noise to machine learning provides faster and more agile AI applications. The systems and techniques described herein enable reduced training cycle times with higher accuracy obtained sooner.

In addition, the invention can be scaled using multiple qubits to provide multiple independent unitary noise channels for parallel architectures.

Advantages of the mechanism of the present invention include the speed of training and convergence to optimum parameters which allows many new datasets and new architectures to be benchmarked within a fraction of the cost, energy, and time of traditional networks. The consequences are dramatic especially for large super-networks tailored for specific AI applications.

Quantum computers are machines that perform computations using the quantum effects between elementary particles, e.g., electrons, holes, ions, photons, atoms, molecules, etc. Quantum computing utilizes quantum-mechanical phenomena such as superposition and entanglement to perform computation. Quantum computing is fundamentally linked to the superposition and entanglement effects and the processing of the resulting entanglement states. A quantum computer is used to perform such computations which can be implemented theoretically or physically.

Currently, approaches to building a quantum computer are divided into quantum simulation, quantum annealing, and adiabatic quantum computation. Digital quantum computers use quantum logic gates to do computation. Both approaches use quantum bits referred to as qubits.

Qubits are fundamental to quantum computing and are somewhat analogous to bits in a classical computer. Qubits can be in a |0> or |1> quantum state but they can also be in a superposition of the |0> and |1> states. When qubits are measured, however, they always yield a |0> or a |1> based on the quantum state they were in.

One challenge of quantum computing is isolating such nanoscopic particles, loading them with the desired information, letting them interact and then preserving the result of their quantum interaction. This requires relatively good isolation from the outside world and a large suppression of the noise generated by the particle itself. Therefore, quantum structures and computers operate at very low temperatures (e.g., cryogenic), close to the absolute zero kelvin (K), in order to reduce the thermal energy/movement/vibration of the particles to well below the energy/movement/vibration coming from their desired interaction. Current physical quantum computers, however, are very noisy and quantum error correction is commonly applied to compensate for the noise.

Most existing commercial quantum computers use superconducting structures to realize quantum interactions. Their main drawbacks, however, are the fact that superconducting structures are very large and costly and have difficulty in scaling to quantum processor sizes of thousands or millions of quantum-bits (qubits). Furthermore, they need to operate at few tens of millikelvin (mK) temperatures, that are difficult to achieve and where it is difficult to dissipate significant power to operate the quantum machine.

This, additional, and/or other aspects and/or advantages of the embodiments of the present invention are set forth in the detailed description which follows; possibly inferable from the detailed description; and/or learnable by practice of the embodiments of the present invention.

There is thus provided in accordance with the invention, a method of quantum stochastic rounding, said method comprising receiving a plurality of remainder values of input numbers on which rounding operations are to be performed, providing a quantum noise source operative to generate a digital unitary noise output signal, and applying pulsed biasing to said quantum noise source, for each remainder value, via a bias control circuit connected thereto in accordance with the remainder value to yield said unitary noise output signal having a skewed bi-modal probability density function (PDF) corresponding to said remainder value.

There is also provided in accordance with the invention, a method of quantum stochastic rounding, said method comprising providing a semiconductor qubit structure coupled to a detector circuit, said qubit structure including an electron tunneling device having a particle reservoir and a quantum dot and exhibiting at least two possible energy levels, generating an output of said detector circuit corresponding to whether a particle successfully tunneled from said reservoir to said quantum dot, receiving a plurality of remainder values of input numbers on which stochastic rounding operations are to be performed, applying pulsed biasing to said qubit structure, for each remainder value, via a bias control circuit connected thereto in accordance with the remainder value such that the probability of detecting said particle via said detector circuit is skewed in accordance with said remainder.

There is further provided in accordance with the invention, a method of quantum stochastic rounding, said method comprising providing a semiconductor qubit structure coupled to a detector circuit, said qubit structure including a doped region containing a reservoir of particles, a quantum dot, a gate adapted to function as a barrier between said doped region and said quantum dot, wherein said quantum structure exhibits at least two possible energy levels, generating an output of said detector circuit corresponding to whether a particle successfully tunneled from said doped region to said quantum dot, receiving a plurality of remainder values on which stochastic rounding operations are to be performed, applying pulsed biasing, for each remainder, to said qubit structure via a bias control circuit connected thereto in accordance with the remainder such that the probability of detecting said particle via said detector circuit corresponds to said remainder.

There is also provided in accordance with the invention, an apparatus for quantum stochastic rounding, comprising a quantum noise source operative to generate a unitary noise output signal, a first circuit operative to receive a plurality of remainder values of input numbers on which rounding operations are to be performed, and a bias control circuit operative, for each remainder value, to apply pulsed biasing to said quantum noise source such that a bi-modal probability density function (PDF) of said unitary noise output signal is skewed in accordance with each remainder value.

There is further provided in accordance with the invention, an apparatus for quantum stochastic rounding, comprising a semiconductor based electron tunneling device including a substrate, a low doped or undoped layer fabricated on said substrate, a portion of which functions as a quantum dot, a doped region containing a reservoir of particles, a gate fabricated on said low doped or undoped layer whereby said doped region is located of one side of said gate and said quantum dot on another side of said gate, said gate operative to function as a barrier between said doped region and said quantum dot, a circuit operative to receive a plurality of remainder values corresponding to numbers on which rounding operations are to be performed, a bias control circuit coupled to said gate and operative to generate and apply, for each remainder value, one or more pulsed bias control signals to said electron tunneling device in accordance with each remainder such that the probability of detecting said particle via a detector circuit corresponds to each remainder value, and said detector circuit coupled to said doped region and operative to detect for each pulse either said particle tunneling to said quantum dot or said particle not tunneling to said quantum dot and generating a digital output signal accordingly.

BRIEF DESCRIPTION OF THE DRAWINGS

The present invention is explained in further detail in the following exemplary embodiments and with reference to the figures, where identical or similar elements may be partly indicated by the same or similar reference numerals, and the features of various exemplary embodiments being combinable. The invention is herein described, by way of example only, with reference to the accompanying drawings, wherein:

FIG. 6A is a diagram illustrating an example floating gate detection circuit;

FIG. 6B is a diagram illustrating the layout for the example floating gate detection circuit;

FIG. 6C is a diagram illustrating the cross section for the floating gate detection circuit;

FIG. 14 is a diagram illustrating a first example quantum resonant tunneling having skewed bi-modal distribution;

FIG. 15 is a diagram illustrating a second example quantum resonant tunneling having substantially equal bi-modal distribution;

FIG. 16 is a diagram illustrating a third example quantum resonant tunneling having skewed bi-modal distribution;

FIG. 36 is a diagram illustrating example cell membrane training set;

FIG. 45 is a diagram illustrating a second example performance comparison between different noise sources.

DETAILED DESCRIPTION

Figure 1:
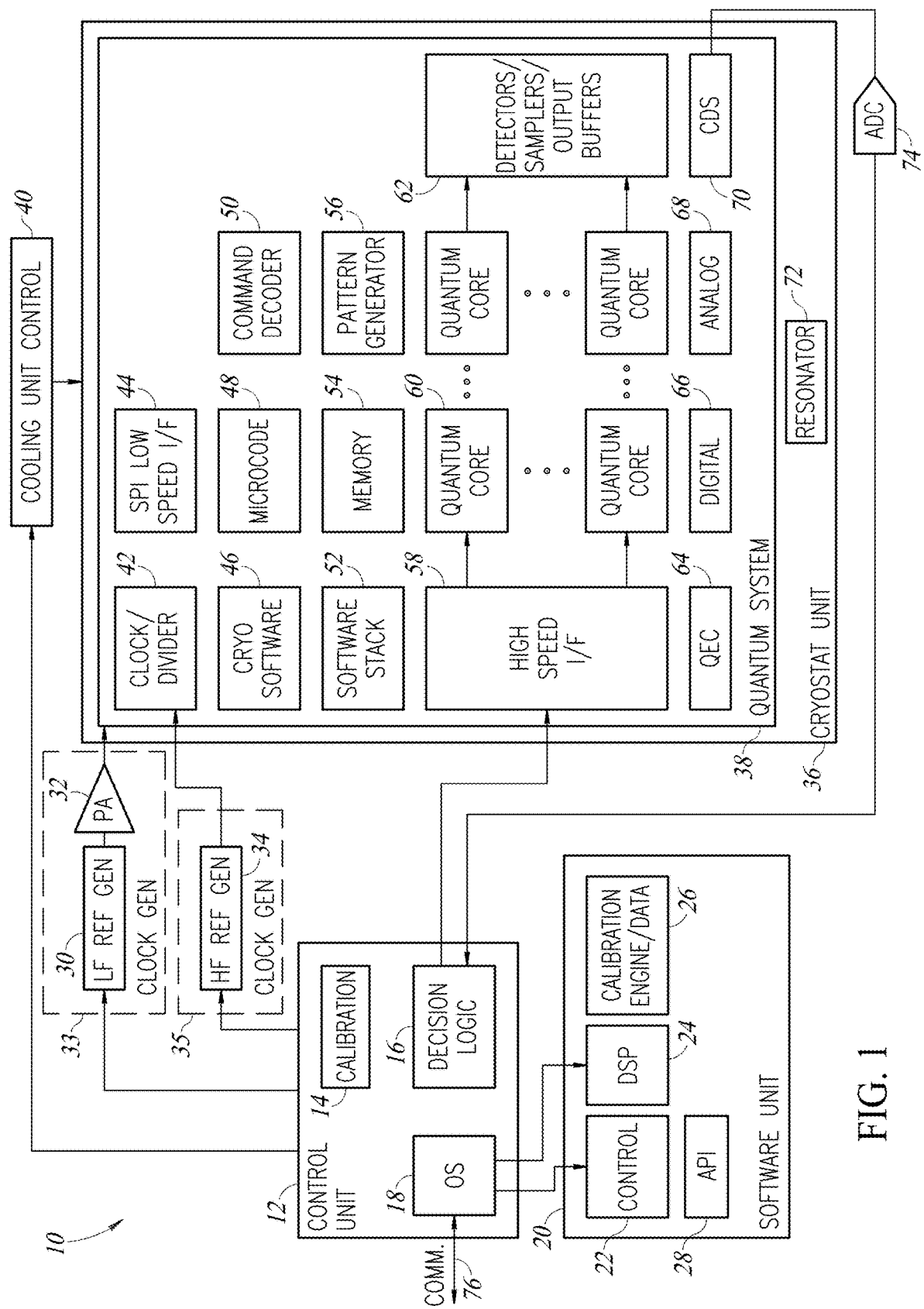
FIG. 1 is a high level block diagram illustrating an example quantum computer system constructed in accordance with the present invention.

In the following detailed description, numerous specific details are set forth in order to provide a thorough understanding of the invention. It will be understood by those skilled in the art, however, that the present invention may be practiced without these specific details. In other instances, well-known methods, procedures, and components have not been described in detail so as not to obscure the present invention.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary, for the understanding and appreciation of the underlying concepts of the present invention and in order not to obfuscate or distract from the teachings of the present invention.

Any reference in the specification to a method should be applied mutatis mutandis to a system capable of executing the method. Any reference in the specification to a system should be applied mutatis mutandis to a method that may be executed by the system.

Throughout the specification and claims, the following terms take the meanings explicitly associated herein, unless the context clearly dictates otherwise. The phrases "in one embodiment," "in an example embodiment," and "in some embodiments" as used herein do not necessarily refer to the same embodiment(s), though they may. Furthermore, the phrases "in another embodiment," "in an alternative embodiment," and "in some other embodiments" as used herein do not necessarily refer to a different embodiment, although they may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

The following definitions apply throughout this document.

A quantum particle is defined as any atomic or subatomic particle suitable for use in achieving the controllable quantum effect. Examples include electrons, holes, ions, photons, atoms, molecules, artificial atoms. A carrier is defined as an electron or a hole in the case of semiconductor electrostatic qubit. Note that a particle's waveform may be split and be present in multiple quantum dots. Thus, a reference to a particle also includes split particles.

In quantum computing, the qubit is the basic unit of quantum information, i.e. the quantum version of the classical binary bit physically realized with a two-state device. A qubit is a two state quantum mechanical system in which the states can be in a superposition. Examples include (1) the spin of the particle (e.g., electron, hole) in which the two levels can be taken as spin up and spin down; (2) the polarization of a single photon in which the two states can be taken to be the vertical polarization and the horizontal polarization; and (3) the position of the particle (e.g., electron) in a structure of two qdots, in which the two states correspond to the particle being in one qdot or the other. In a classical system, a bit is in either one state or the other. Quantum mechanics, however, allows the qubit to be in a coherent superposition of both states simultaneously, a property fundamental to quantum mechanics and quantum computing. Multiple qubits can be further entangled with each other.

A quantum dot or qdot (also referred to in literature as QD) is a nanometer-scale structure where the addition or removal of a particle changes its properties is some ways. In one embodiment, quantum dots are constructed in silicon semiconductor material having typical dimension in nanometers. The position of a particle in a qdot can attain several states. Qdots are used to form qubits and qudits where multiple qubits or qudits are used as a basis to implement quantum processors and computers. Note that a quantum dot also refers to a quantum well.

A quantum interaction gate is defined as a basic quantum logic circuit operating on a small number of qubits or qudits. They are the building blocks of quantum circuits, just like the classical logic gates are for conventional digital circuits.

A qubit or quantum bit is defined as a two state (two level) quantum structure and is the basic unit of quantum information. A qudit is defined as a d-state (d-level) quantum structure. A qubyte is a collection of eight qubits.

The terms control gate and control terminal are intended to refer to the semiconductor structure fabricated over a continuous well with a local depleted region and which divides the well into two or more qdots. These terms are not to be confused with quantum gates or classical FET gates.

Unlike most classical logic gates, quantum logic gates are reversible. It is possible, however, although cumbersome in practice, to perform classical computing using only reversible gates. For example, the reversible Toffoli gate can implement all Boolean functions, often at the cost of having to use ancillary bits. The Toffoli gate has a direct quantum equivalent, demonstrating that quantum circuits can perform all operations performed by classical circuits.

A quantum well is defined as a very small (e.g., typically nanometer scale) two dimensional area of metal or semiconductor that functions to contain a single or a small number of quantum particles. It differs from a classic semiconductor well which might not attempt to contain a small number of particles or/and preserve their quantum properties. One purpose of the quantum well is to realize a function of a qubit or qudit. It attempts to approximate a quantum dot, which is a mathematical zero-dimensional construct. The quantum well can be realized as a low doped or undoped continuous depleted semiconductor well partitioned into smaller quantum wells by means of control gates. The quantum well may or may not have contacts and metal on top. A quantum well holds one free carrier at a time or at most a few carriers that can exhibit single carrier behavior.

A classic well is a medium or high doped semiconductor well contacted with metal layers to other devices and usually has a large number of free carriers that behave in a collective way, sometimes denoted as a "sea of electrons."

A quantum structure or circuit is a plurality of quantum interaction gates. A quantum computing core is a plurality of quantum structures. A quantum computer is a circuit having one or more computing cores. A quantum fabric is a collection of quantum structures, circuits, or interaction gates arranged in a grid like matrix where any desired signal path can be configured by appropriate configuration of access control gates placed in access paths between qdots and structures that make up the fabric.

In one embodiment, qdots are fabricated in low doped or undoped continuous depleted semiconductor wells. Note that the term 'continuous' as used herein is intended to mean a single fabricated well (even though there could be structures on top of them, such as gates, that modulate the local well's behavior) as well as a plurality of abutting contiguous wells fabricated separately or together, and in some cases might apparently look as somewhat discontinuous when 'drawn' using a computer aided design (CAD) layout tool.

The term classic or conventional circuitry (as opposed to quantum structures or circuits) is intended to denote conventional semiconductor circuitry used to fabricate transistors (e.g., FET, CMOS, BJT, FinFET, etc.) and integrated circuits using processes well-known in the art.

The term Rabi oscillation is intended to denote the cyclic behavior of a quantum system either with or without the presence of an oscillatory driving field. The cyclic behavior of a quantum system without the presence of an oscillatory driving field is also referred to as occupancy oscillation.

The state of the quantum system is completely described by the wavefunction w, which for a qubit can be described as a vector on a Bloch sphere. For a multi-state system, the Hilbert space, which is a unitary state, can be used to represent it. Throughout this document, a representation of the state of the quantum system in spherical coordinates of Bloch sphere includes two angles $\theta$ and $\varphi$. The state vector $\Psi$ in spherical coordinates can be described by these two angles. The angle $\theta$ is between the vector $\Psi$ and the z-axis and the angle $\varphi$ is the angle between the projection of the vector on the XY plane and the x-axis. Thus, any position on the sphere is described by these two angles $\theta$ and $\varphi$. Note that for one qubit $\Psi$ representation is in three dimensions. For multiple qubits $\Psi$ representation is in higher order dimensions.

Semiconductor Processing

Regarding semiconductor processing, numerous types of semiconductor material exist such as (1) single main atom types, e.g., Silicon (Si), Germanium (Ge), etc., and (2) compound material types, e.g., Silicon-Germanium (SiGe), Indium-Phosphide (InP), Gallium-Arsenide (GaAs), etc.

A semiconductor layer is called intrinsic or undoped if no additional dopant atoms are added to the base semiconductor crystal network. A semiconductor layer is doped if other atoms (i.e. dopants) are added to the base semiconductor crystal. The type of layer depends on the concentration of dopant atoms that are added: (1) very low doped semiconductor layers having high resistivity, i.e. n-type denoted by n-- and p-type denoted by p--, having resistivities above 100 Ohm·cm; (2) low doped semiconductor layers, i.e. p-type denoted with p- and n-type denoted with n-, having resistivities around 10 Ohm·cm; (3) medium doped layers, i.e. p for p-type and n for n-type; (4) high doped layers, i.e. p+ and n+; and (5) very highly doped layers, i.e. p++ and n++.

Note that introducing dopants in a semiconductor crystal likely results in defects that introduce energy traps that capture mobile carriers. Traps are detrimental for semiconductor quantum structures because they capture and interact with the quantum particles resulting in changed states and decoherence of the quantum information. For realizing semiconductor quantum structures undoped semiconductor layers are preferred.

Classic electronic devices use mostly low, medium, high and very highly doped semiconductor layers. Some layers are ultra-highly doped to behave as metals, such as the gate layer.

Semiconductor processing is typically performed on large semiconductor wafers which have a given thickness for mechanical stability. Circuitry is fabricated on a very thin layer on the top of the wafer where the unused thick portion of the wafer is termed the substrate. In a bulk process, devices are fabricated directly in the semiconductor body of the wafer.

An insulating layer (e.g., oxide) isolates from the substrate the devices used to create circuitry. Semiconductor on insulator process, e.g., silicon on insulator (SOI), uses a layer of insulator (e.g., oxide) between the thin top semiconductor layer where devices are realized and the substrate. To improve circuit performance, the wafer is processed such that the devices are realized on top of an insulator substrate, e.g., semiconductor-on-glass, semiconductor-on-organic material, semiconductor-on-sapphire, etc.

Alternatively, the semiconductor substrate is eliminated and replaced with a nonelectrical conducting material such as a polymer or other material compatible with a semiconductor process (e.g., substrate-replacement processes). Substrate replacement in realizing semiconductor quantum structures significantly reduces or eliminates substrate decoherence.

High resistivity (i.e. very low doped) substrates are the next best substrate choice for semiconductor quantum structures. Although intrinsic substrates are also suitable for semiconductor quantum structures, there are specific limitations that prevent the use of intrinsic substrates.

Thus, in accordance with the invention, semiconductor quantum structures can be realized in (1) bulk processes, (2) SOI processes, (3) substrate replacement processes, or (4) semiconductor on other materials.

Regarding processing, (1) planar processes may be used where layers have predominantly one orientation, i.e. horizontal; and (2) three-dimensional processes (3D) allow layers with both horizontal and vertical orientation, realizing more complex 3D structures. It is appreciated that although layers are shown in the figures as rectangular prisms for simplicity, physically the layers have more complicated structures. For example, corners are often rounded and distortions are present due to the masking process. In depth dimension, layers tend to have a trapezoidal shape instead of the ideal rectangular one. The semiconductor quantum structures of the present invention can be realized in either planar or 3D processes.

In one embodiment, the quantum system of the present invention comprises a quantum dot array having a plurality of semiconductor quantum structures. A silicon-on-insulator (SOI) or fully depleted SOI (FD-SOI) process may be used in which the substrate is low doped (i.e. high resistivity) and is isolated from the quantum device with a buried oxide layer (BOX). This reduces the decoherence of the quantum particle. In one embodiment, the semiconductor quantum device employs tunneling through the local depleted region. In another embodiment, tunneling occurs through the oxide layer between the semiconductor well (low doped or undoped) and a partially overlapping gate and oxide layer.

The active layer is isolated using oxide from adjacent structures, e.g., shallow trench isolation (STI), reducing further the quantum particle decoherence.

Note that the substrate may comprise (1) a semiconductor, (2) silicon on insulator (SOI) substrate, where the substrate comprises sapphire, glass, organic material, etc., (3) an insulating substrate replacement, for example, sapphire, glass, organic material, plastic, polymer, etc., or (4) any other insulating material compatible with a semiconductor process.

Note that regardless of the substrate used, the quantum structure must be electrically isolated from the substrate for the structure to operate properly. Otherwise, the quantum particle may escape thus preventing quantum operation of the structure.

Several ways to electrically isolate the quantum structure include: (1) utilizing an SOI or low doped substrate where the oxide layer electrically isolates the quantum structure from the substrate; (2) using substrate replacement such as an insulator material, e.g., polymer, glass, etc.; and (3) using a fixed depletion region, as the quantum particle can tunnel only through a relatively narrow insulating region such as very thin oxide or a thin depletion region. If the depletion region is too wide, the quantum particle is prevented from traveling. Note that this last option can be fabricated using bulk processes.

The quantum operation is controlled by the gate located over the tunneling path that modulates the barrier created by the local depletion region.

Quantum Computing System

A high-level block diagram illustrating a first example quantum computer system constructed in accordance with the present invention is shown in FIG. 1. The quantum computer, generally referenced 10, comprises a conventional (i.e. not a quantum circuit) external support unit 12, software unit 20, cryostat unit 36, quantum system 38, clock generation units 33, 35, and one or more communication busses between the blocks. The external support unit 12 comprises operating system (OS) 18 coupled to communication network 76 such as LAN, WAN, PAN, etc., decision logic 16, and calibration block 14. Software unit 20 comprises control block 22 and digital signal processor (DSP) 24 blocks in communication with the OS 18, calibration engine/data block 26, and application programming interface (API) 28.

Quantum system 38 comprises a plurality of quantum core circuits 60, high speed interface 58, detectors/samplers/output buffers 62, quantum error correction (QEC) 64, digital block 66, analog block 68, correlated data sampler (CDS) 70 coupled to one or more analog to digital converters (ADCs) 74 as well as one or more digital to analog converters (DACs, not shown), clock/divider/pulse generator circuit 42 coupled to the output of clock generator 35 which comprises high frequency (HF) generator 34. The quantum system 38 further comprises serial peripheral interface (SPI) low speed interface 44, cryostat software block 46, microcode 48, command decoder 50, software stack 52, memory 54, and pattern generator 56. The quantum system 38 can be used to implement the neural network training accelerator of the present invention. The clock generator 33 comprises low frequency (LF) generator 30 and power amplifier (PA) 32, the output of which is input to the quantum system 38. Clock generator 33 also functions to aid in controlling the spin of the quantum particles in the quantum cores 60.

The cryostat unit 36 is the mechanical system that cools the quantum system down to cryogenic temperatures. The deep cryogenic temperatures also help to speed up the digital and mixed-signal circuits while reducing their dynamic and static power (lower leakage). Typically, it is made from metal and it can be fashioned to function as a cavity resonator 72. It is controlled by cooling unit control 40 via the external support unit 12. The cooling unit control 40 functions to set and regulate the temperature of the cryostat unit 36. By configuring the metal cavity appropriately, it can be made to resonate at a desired frequency. A clock is then driven via a power amplifier which is used to drive the resonator which creates a magnetic field. This magnetic field can function as an auxiliary magnetic field to aid in controlling one or more quantum structures in the quantum core.

The external support unit/software units may comprise any suitable computing device or platform such as an FPGA/SoC board. In one embodiment, it comprises one or more general purpose CPU cores and optionally one or more special purpose cores (e.g., DSP core, floating point, etc.) that interact with the software stack that drives the hardware, i.e. the QPU. The one or more general purpose cores execute general purpose opcodes while the special purpose cores execute functions specific to their purpose. Main memory comprises dynamic random access memory (DRAM) or extended data out (EDO) memory, or other types of memory such as ROM, static RAM, flash, and non-volatile static random access memory (NVSRAM), bubble memory, etc. The OS may comprise any suitable OS capable of running on the external support unit and software units, e.g., Windows™, MacOS™, Linux™, QNX, NetBSD, etc. The software stack includes the API, the calibration and management of the data, and all the necessary controls to operate the external support unit itself. In one embodiment, the external support unit/software units are adapted to implement the mapping and detection in the classic helper neural networks as described in more detail infra.

The clock generated by the high frequency clock generator 35 is input to the clock divider 42 that functions to generate the signals that drive the quantum system. Low frequency clock signals are also input to and used by the QPU. A slow serial/parallel interface (SPI) 44 functions to handle the control signals to configure the quantum operation in the quantum system. The high speed interface 58 is used to pump data from the classic computer, i.e. the external support unit, to the quantum system. The data that the quantum system operates on is provided by the external support unit.

Non-volatile memory may include various removable/non-removable, volatile/nonvolatile computer storage media, such as hard disk drives that read from or write to non-removable, nonvolatile magnetic media, a magnetic disk drive that reads from or writes to a removable, non-volatile magnetic disk, an optical disk drive that reads from or writes to a removable, nonvolatile optical disk such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like.

The computer may operate in a networked environment via connections to one or more remote computers. The remote computer may comprise a personal computer (PC), server, router, network PC, peer device or other common network node, or another quantum computer, and typically includes many or all of the elements described supra. Such networking environments are commonplace in offices, enterprise-wide computer networks, intranets and the Internet.

When used in a LAN networking environment, the computer is connected to the LAN via network interface 76. When used in a WAN networking environment, the computer includes a modem or other means for establishing communications over the WAN, such as the Internet. The modem, which may be internal or external, is connected to the system bus via user input interface, or other appropriate mechanism.

Computer program code for carrying out operations of the present invention may be written in any combination of one or more programming languages, including an object oriented programming language such as Java™, Smalltalk™, C++, C# or the like, conventional procedural programming languages, such as the "C" programming language, and functional programming languages such as Python™, Hotlab™, Prolog™ and Lisp™, machine code, assembler or any other suitable programming languages.

Also shown in FIG. 1 is the optional data feedback loop between the quantum system 38 and the external support unit 12 provided by the partial quantum data read out. The quantum state is stored in the qubits of the one or more quantum cores 60. The detectors 62 function to measure/collapse/detect some of the qubits and provide a measured signal through appropriate buffering via CDS 70 to the output ADC block 74. The resulting digitized signal is sent to the decision logic block 16 of the external support unit 12 which functions to reinject the read out data back into the quantum state through the high speed interface 58 and quantum initialization circuits. In an alternative embodiment, the output of the ADC is fed back to the input of the quantum system.

In one embodiment, the quantum core comprises quantum dots that exhibit a quantum effect, is capable of forming entangled states, and is capable of performing energy optimization. Ultimately, the minimum energy quantum state is read out of the quantum core and used in subsequent processing.

In one embodiment, quantum error correction (QEC) is performed via QEC block 64 to ensure no errors corrupt the read out data that is reinjected into the overall quantum state. Errors may occur in quantum circuits due to noise or inaccuracies similarly to classic circuits. Periodic partial reading of the quantum state function to refresh all the qubits in time such that they maintain their accuracy for relatively long time intervals and allow the complex computations required by a quantum computing machine.

It is appreciated that the architecture disclosed herein can be implemented in numerous types of quantum computing machines. Examples include semiconductor quantum computers, superconducting quantum computers, magnetic resonance quantum computers, optical quantum computers, etc. Further, the qubits used by the quantum computers can have any nature, including charge qubits, spin qubits, hybrid spin-charge qubits, etc.

In one embodiment, the quantum structure disclosed herein is operative to process a single particle at a time. In this case, the particle can be in a state of quantum superposition, i.e. distributed between two or more locations or charge qdots. In an alternative embodiment, the quantum structure processes two or more particles at the same time that have related spins. In such a structure, the entanglement between two or more particles could be realized. Complex quantum computations can be realized with such a quantum interaction gate/structure or circuit.

In alternative embodiments, the quantum structure processes (1) two or more particles at the same time having opposite spin, or (2) two or more particles having opposite spins but in different or alternate operation cycles at different times. In the latter embodiment, detection is performed for each spin type separately.

Note that in one embodiment the quantum system 38 is fabricated on a single chip and comprises quantum cores 60 and a classical controller comprising a plurality of driver circuits, detector circuits, and complementary metal oxide semiconductor (CMOS) processor. The quantum system is typically in communication with another classical processor for administration, configuration, and control.

As an example of advanced CMOS, the 22 nm FDSOI process is capable of providing scalability of qubits. Similar to an integrated circuit (IC) chip, where a single nanometer-scale CMOS transistor can be reliably replicated billions of times to build a large digital processor, a position-based charge qubit structure, a spin-based qubit structure, or a hybrid thereof which can be realized as a CMOS compatible coupled quantum system (e.g., quantum dot array (QDA)) in a way that satisfies the manufacturer's design rule check (DRC) with possible minor exceptions signed off by process engineers. The qubit structure is replicated thousands or millions of times to construct a single chip quantum processor operating at 4 K where the cooling requirements are modest.

In one embodiment, the quantum system combines the best features of charge (i.e. high-speed operation) and spin (i.e. long coherence times) qubits in a so called hybrid qubit. Such a hybrid qubit can be controlled electrically without the need for microwave pulses but it requires a solid magnet of 0.5-1 T which can be added to a 4 K cryo chamber. The control and detection of quantum spin states can be based on utilizing the Pauli exclusion principle which dictates that two electrons of the same spin cannot occupy the same quantum dot. The required movement of electrons between quantum dots to try to force them into one quantum dot and the subsequent position detection constitutes the part of charge qubit.

Note that the 22 nm FDSOI process has unique benefits for quantum operation. In contrast to bulk CMOS, FDSOI provides a thin semiconductor layer isolated vertically from the substrate by a 20 nm buried oxide (BOX) layer. Therefore, a quantum particle can be strictly confined inside the 5 nm thin semiconductor film where it precisely follows the gate control and is isolated from the substrate impurities to further increase its decoherence time.

In one embodiment, quantum dots are nanoscopic in size. They are constructed in CMOS using the minimum dimensions that the fabrication process allows. They are small enough to accommodate a single quantum particle, i.e. electron or hole, to hold the quantum information either in its magnetic spin (up or down) or position (being present or absent in a given quantum dot). Note that the underlying principle of quantum dot is a Coulomb blockade by exerting a repulsive force preventing other electrons from joining in and occupying the same space. The key parameter is its capacitance to the background. For a quantum dot of small enough capacitance C, a single electron of charge e entering will decrease the electric voltage potential by observable $\Delta V=e/C$, while presenting the energy barrier of $E=e^2/2C$. For example, an island of a 20 aF capacitance, which can be readily created in CMOS by resorting to a minimum size of the diffusion area, exhibits the single electron charging energy of 4 meV. It is an order of magnitude greater than the thermal energy $kT=0.36$ meV at $T=4.2$ K, where k is Boltzmann's constant. This prevents thermally excited electrons from tunneling into the island.

Quantum Operation

To aid in understanding the principles of the present invention, a brief explanation of quantum operation is presented below.

As stated supra, in classic electronics, the unit of information is a bit that can represent only one of the two states "0" and "1" at a given time. Computations in classical computers are performed sequentially and every bit can hold only one state at a time.

As stated supra, quantum electronics uses the quantum behavior of particles to perform computations. The unit of quantum information is a quantum bit or qubit. A qubit has two base states denoted by $\hat{0}$ and $\hat{1}$ (or $|0>$ and $|1>$) (a qudit can have additional states) but in contrast with a classic bit, a qubit can be in a superposed state that contains some percentage (complex-valued amplitude 'a') of state $\hat{0}$, and some percentage (complex-valued amplitude 'b') of state $\hat{1}$ denoted by a state $a\hat{0}+b\hat{1}$. Since a qubit in quantum structures can simultaneously be in multiple superposed states, multiple sets of computations can be performed concurrently, resulting in large quantum computation speed-ups, when compared with classic computations.

A quantum particle is described by its position and/or spin. The particles used in quantum structures are called quantum particles. There are qubits based on the quantum position of the particles, also named charge-qubits, while other qubits use the spin of the quantum particles, also named spin-qubits. In quantum structures, the charge carriers are held in specific regions called quantum dots or qdots. A quantum structure is constructed from one or more qdots.

Performing a quantum computation involves several steps. First the structure needs to be reset, which means that all the free carriers (e.g., electrons or holes) from the structure need to be flushed out. Once the free carriers are removed, the structure is initialized meaning particles are introduced in one of the base states (e.g., $\hat{0}$ or $\hat{1}$). In the case of a charge-qubit (position-qubit) it means that a carrier is loaded in one of the qdots. A free carrier not coming from the quantum initialization process can interact with the quantum particles and result in decoherence, i.e. loss of quantum information. After the particles have been loaded in the corresponding base states they undergo the desired quantum operation under control of gate control terminals. Once the desired quantum operations are complete, a detection is performed whereby the presence or absence of a particle in a given qdot at a given time is tested. Detection is usually destructive which means that the quantum particle's wavefunction and its state collapse. Special nondestructive detection/measurement exists that does not collapse the quantum state. In such cases, multiple measurements of the same quantum state can be performed.

The position of a quantum particle is given by the region where the particle wavefunction is mostly present. In one embodiment, quantum structures use semiconductor qdots realized with semiconductor wells where the particle transport is done through tunneling which is a quantum effect. The tunneling or particle transport is controlled by control terminals. In one embodiment, the control terminals are realized using gates but they may comprise other semiconductor process layers.

Figure 2:
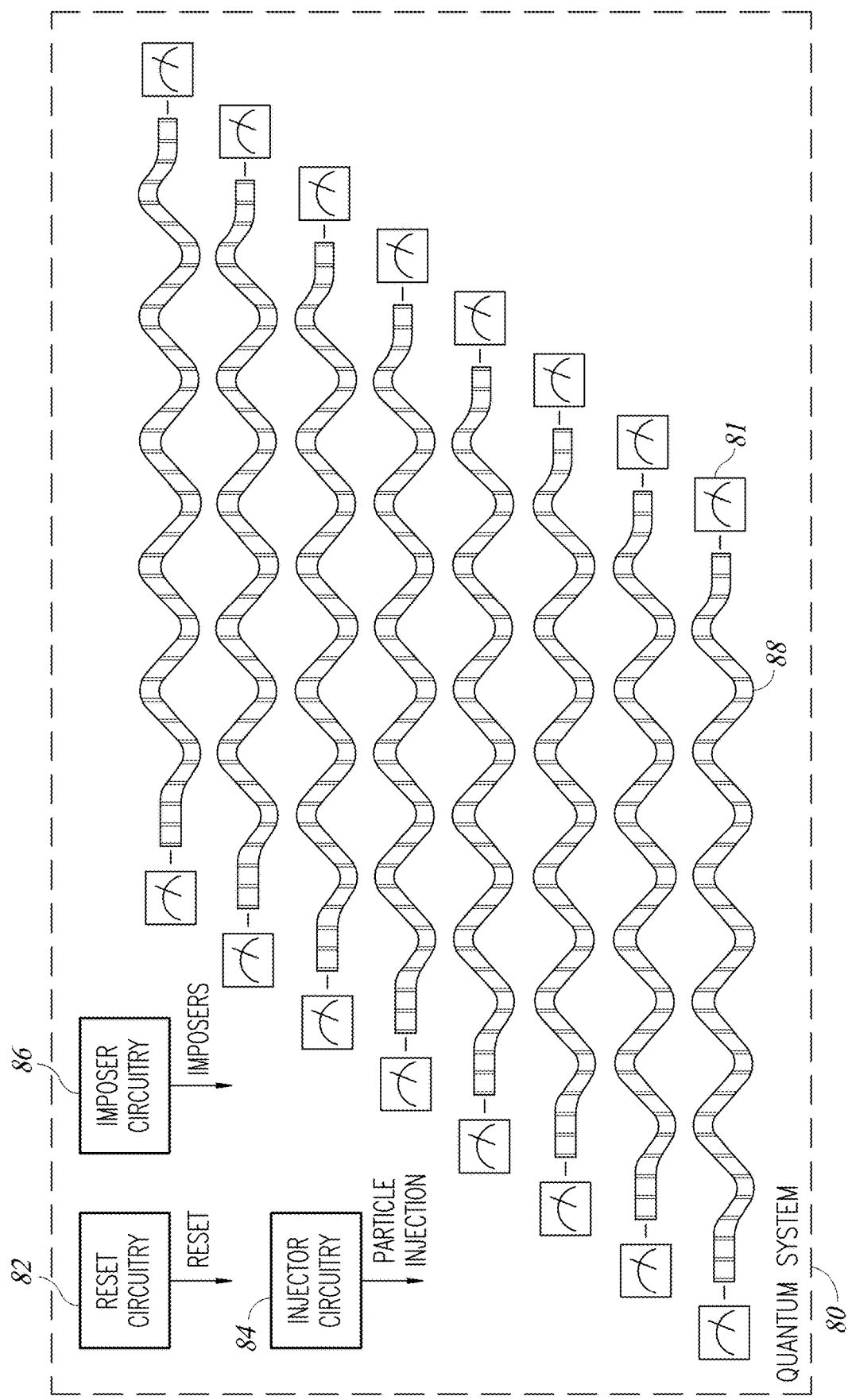
FIG. 2 is a diagram illustrating a first example quantum system arranged in multiple staggered rows of quantum dots.

A diagram illustrating a fourth example quantum system arranged in multiple staggered rows of quantum dots is shown in FIG. 2. The quantum system, generally referenced 80, comprises a plurality of rows of qdots 88 arranged in a staggered formation one atop the other. The qdots are separated from each other by imposers, constructed as metal or polysilicon control gates, which control the amount of tunneling therebetween. The rows are staggered to meet particular process design rules. Each row includes a linear array of qdots arranged in alternating upright and inverse 'V' configurations. This provides close interaction between several qdots in neighboring rows. The quantum system also comprises reset circuitry 82 operative to reset qdots to an initial state, injector circuitry 84 operative to inject one or more particles (e.g., electrons, holes, etc.) into each row, imposer circuitry 86 operative to control and manipulate tunneling between the qdots in each row, and detector circuits 81 connected to the qdots on either end of each row. Note that the qdots may be fabricated using any suitable semiconductor process.

It is appreciated that quantum systems, such as quantum dot arrays or matrices, having an appropriate size may be used with the accelerated training mechanism of the present invention. The size of the quantum system is bound, however, by the constraints of the current state of semiconductor process technology that can support the quantum properties at the expected quality level.

In addition, in one embodiment, the quantum system comprises one or more redundant rows that are reserved as replacements to be used in the event of a failure of one of the rows. One or more individual redundant quantum dots may also be provided to be used in the event of a failure of the quantum dots.

Each row in the quantum system comprises a plurality of quantum dots separated by a gate (also known as imposer). Note that the qdots shown in this quantum system and other quantum systems described herein may be fabricated using any suitable process including planar or 3D using tunneling through depletion or tunneling through oxide. Several processes suitable for use in fabricating quantum systems are described in detail in U.S. Pat. No. 10,903,413, entitled "Semiconductor Process Optimized for Quantum Structures," incorporated herein by reference in its entirety.

Figure 3:
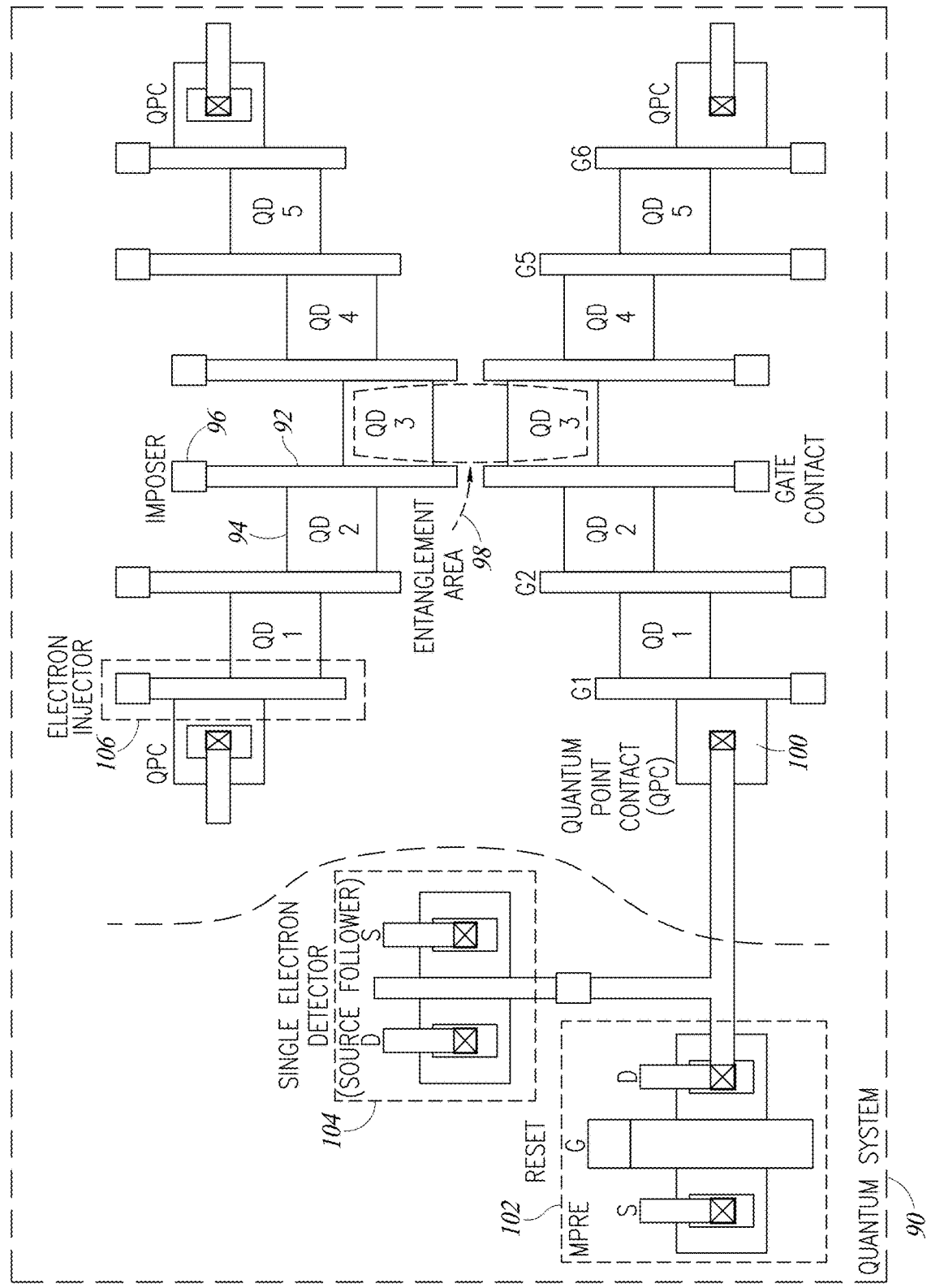
FIG. 3 is a diagram illustrating a third example quantum system arranged in a double 'V' shaped array of quantum dots.

A diagram illustrating a sixth example quantum system arranged in a double 'V' shaped array of quantum dots is shown in FIG. 3. The quantum system, generally referenced 90, was realized in 22 nm FDSOI. It comprises two rows of arrays of five quantum dots (QD) 94 where each row includes imposers having control gates 92 and contacts 96. Each quantum dot is roughly 80×80 nm$^2$ in size, which is the minimum allowed by the process rules. The middle of each quantum dot array (QDA) is a staging area for entanglement 98. The quantum system also comprises a reset circuit 102, single electron detector circuit 104, and electron injector circuit 106. The parasitic capacitance at the quantum point contact (QPC) node 100 is minimized to increase the voltage swing due to the arrival/departure of one electron. Voltage on the control gates "G1" through "G6", as well as the "S" (source) and "G" (gate) terminals of the reset transistor MPRE, can be controlled by capacitive DACs (CDAC).

Figure 4:
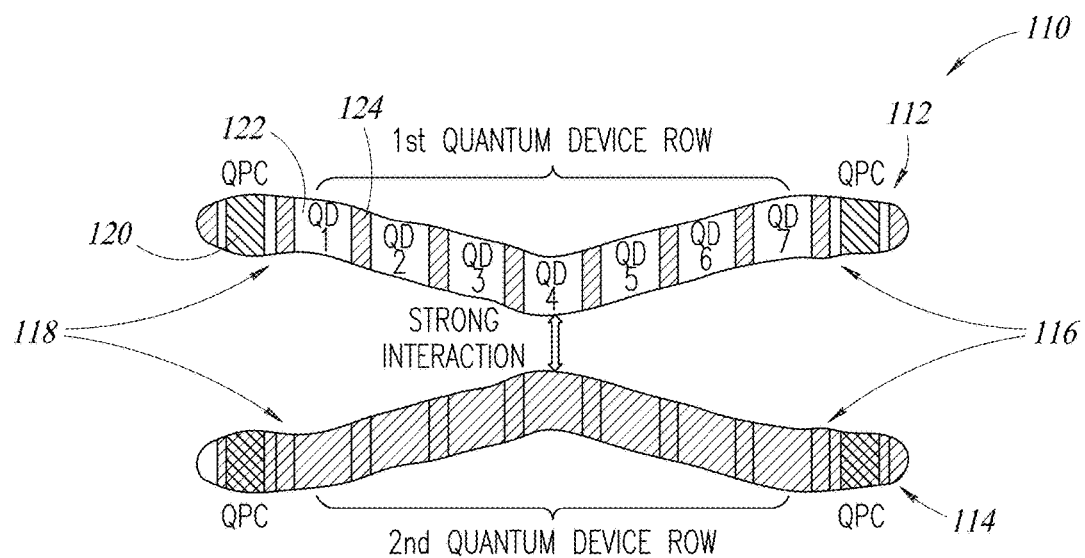
FIG. 4 is a diagram illustrating a top view of the implemented array of FIG. 3.

A diagram illustrating a top view of an implemented double V shaped quantum structure of FIG. 3 with multiple quantum dots, injector and extractor interface devices is shown in FIG. 4. The example structure, generally referenced 110, comprises a first upper quantum device row 112 and a second lower quantum device row 114. Each quantum device row comprises left injector/detector interface devices 118 and right injector/detector interface devices 116. The four relatively wide dark bands 120 represent the raised source/drain diffusion regions in each of the four interface devices. Seven qdots 122 are formed on either side of the gates 124 in the upper and lower quantum device row. Note that this top level view of the double 'V' shaped structure is derived from a transmission electron microscopy (TEM)

photograph of a real world quantum structure constructed in accordance with the invention.

Figure 5:
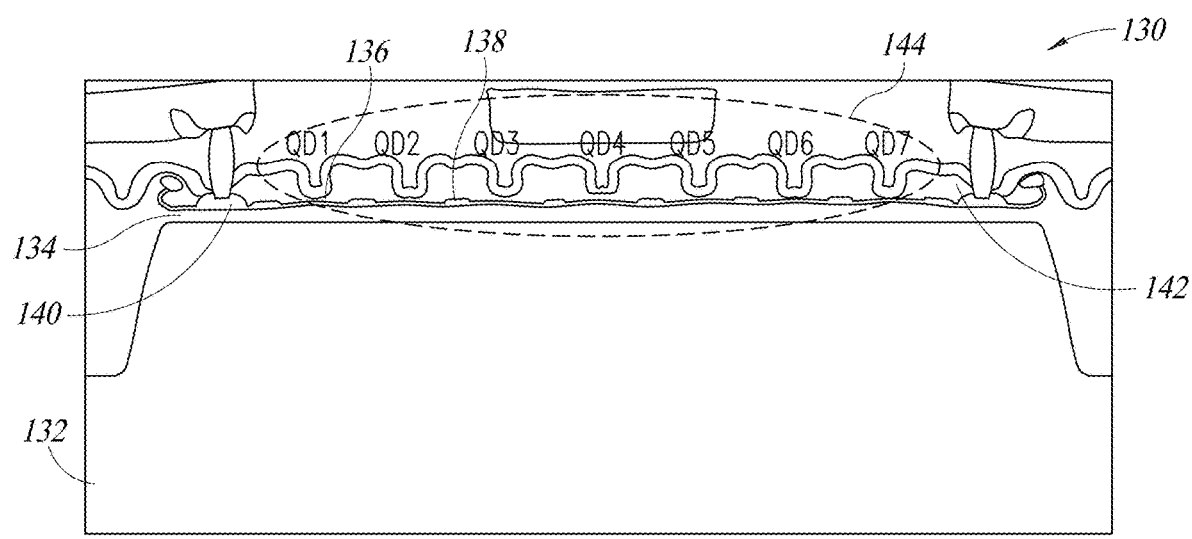
FIG. 5 is a diagram illustrating a cross sectional view of the array of FIG. 3.

A diagram illustrating a cross section of the array of FIG. 4 with multiple quantum dots, injector and extractor interface devices is shown in FIG. 5. The example quantum structure, generally referenced 130, comprises a substrate 132, oxide (BOX) layer 134 providing electrical isolation from the substrate, thin undoped silicon layer (i.e. active) 136, and gate 138 (typically a high k dielectric). Note that in one embodiment, the gate oxide layer under the gate is very thin (i.e. a few atomic layers) and is not shown in FIG. 5. An injector interface device 140 on the left side functions to inject quantum particles (e.g., electrons) into the quantum path 144. Detector interface device 142 on the right side functions to detect the particle after the quantum interaction. The detector and injector, however, can both be connected to both the left and right end of the structure. They use the same structure and their operation can be time shared. The interface device 140 comprises a raised diffusion source/drain, contact (CA), and metal (M1), and dummy gate.

The quantum devices comprise a gate (i.e. control gate) surrounded on both sides by qdots. The gate is fabricated from the silicon dioxide layer between the gate layer 138 and the active layer 136, and is not visible since it is only a few atomic layers thick. The region around 138 shows a silicide layer on top of the silicon dioxide layer, and polysilicon and nitride layers over the silicide layer. In this example structure, seven qdots are shown, labeled QD1 through QD7.

Detection of particles (i.e. minimum energy states) can be either demolition (i.e. destructive, involving collapse of the quantum particle's wave function) or non-demolition (i.e. non-destructive). Non-demolition detection of quantum states uses a floating gate. In this case the classic device of the detector Mdetector is connected to the same floating gate that goes over the quantum well. An equivalent schematic of the quantum circuit, generally referenced 150, together with its associated interface and classic circuits is shown in FIG. 6A. A top plan layout view of the circuit is shown in FIG. 6B and a cross section of the circuit is shown in FIG. 6C. The quantum circuit 150 comprises several layers including substrate 170, BOX oxide 166, and undoped fully depleted layer 164. Doped regions (raised S/D) 178 are fabricated over the fully depleted layer, which can result in some dopant diffusion into region 177.

Similar to floating well detection, the quantum procedure starts with the reset of the structure 150 using one or more classic Mreset devices 152 along with appropriate control of the interface quantum gates (Qinterface) 154 and imposer quantum gates (Qimp) 156 such that all or almost all free carriers in the quantum structure are flushed out. The classic to quantum Qinterface device 154, operative to inject a single carrier 172 into the quantum structure, has a half-classic and half-quantum operation. It comprises a doped and metal contacted classic well 174 on the left side of its gate 164 and a floating quantum well 176 on the other side. In one embodiment, the connection between the Mreset and Qinterface devices on the classic side is realized with contacts and metal layers 175. Note that the Mreset and Qinterface devices may share the same active layer or may be done in separate active layers.

The quantum imposer (Qimp) devices 156 determine the specific quantum computation performed. There is at least one Qimp quantum control gate. Alternatively, the circuit may comprise any number of Qimp devices as large as feasible in the actual implementation using a given semiconductor process.

The last three gates over the quantum well on the right side of the circuit 150 form a quantum to classic Qinterface device 158, 184, 182. Note that alternatively, the Qinterface device may be located in the middle of a quantum well. One of the three gates (180) is the floating gate which connects to the Mdetector classic detector device 160. In one embodiment, the carrier is moved under the floating gate by controlling the potential distribution with the two adjacent gates 179, 181. The presence of the quantum carrier under the floating gate causes a small change of the potential of the quantum gate which is sensed by the Mdetector detector device 160 and amplified further.

After the first measurement is performed, the quantum carrier can be moved away from under the floating gate 180 of the interface device. The floating gate initial potential is set during the reset time to a level that allows the proper operation of the Mdetector classic detector device. Such potential may be reset for example with a second classic Mreset device (not shown) connected to the gate of the Mdetector device.

Figure 7:
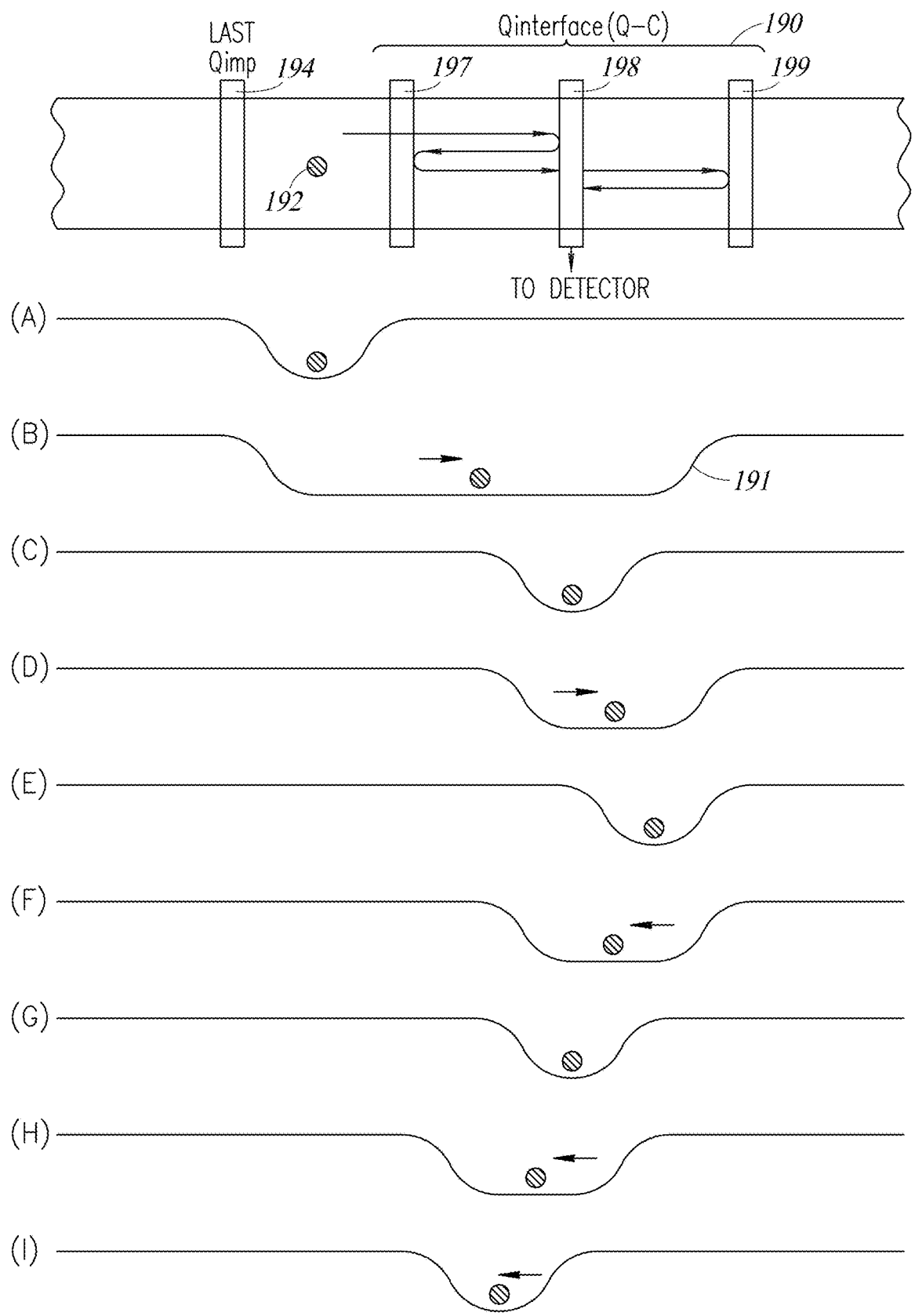
FIG. 7 is an example potential diagram for the floating gate detection circuit.

An example potential diagram for the floating gate detection circuit is shown in FIG. 7. The last quantum imposer gate Qimp 194 together with the three gates 197, 198, 199 of the quantum to classic interface device (Qinterface) 190 are shown. In this example, two 'helper' gates (left gate 197 and right gate 199) are controlled and not floating while only the middle gate 198 is floating and used for actual detection. The middle floating gate 198 is connected to the detector circuit 160 (FIG. 6A). It is appreciated that the Qinterface device may comprise more or fewer than three gates. For example, the detection can be performed using only two interface device gates, i.e. one floating and one controlled.

In operation, the particle is moved one or more times under the floating gate to perform detection (i.e. nondestructive measurement or observation). Multiple measurements are performed under the detection gate for the same quantum experiment. A measurement is made each time the particle moves under the floating gate 198. Note that the movement is speculative in nature since it is not known a priori whether there is a particle present or not as this is what is being measured. If no particle is detected, then of course most likely no movement actually takes place.

With floating gate detection, a gate overlaps the last region of a quantum well where the presence of a particle is to be detected. Note that the potential of the floating well can be set initially, for example during the reset process, to a reference value appropriate for the detector circuitry. It should, however, be subsequently allowed to be floating such that it can sense the presence or absence of a particle under it, e.g., carrier, electron, hole, etc.

In the floating gate detection process the particle represented by the quantum state or qubit is allowed to move under the floating gate. If a particle is present then the potential of the gate changes from the reference potential it was initially set to. While the particle is not present then the potential of the gate does not change due to the quantum state moving under the gate.

Note that in idealized circuits there are no parasitic leakage currents and the potential of a floating gate can remain for relatively long periods, ideally to infinity or until it is again reset to the potential it achieves at the end of processing. In real circuits, however, parasitic leakage currents typically exist (e.g., a gate over a well may have a certain leakage current from the gate to the well). Such current changes the potential of the floating gate independently of the presence or absence of the quantum particle.

To prevent such floating gate potential change due to leakage, numerous well-known circuit techniques can be applied, including performing the detection quickly such that there is not enough time for the floating gate potential to change significantly due to leakage. In this case the significant potential change is a fraction of the potential change determined by the presence of the quantum particle, e.g., 10% or 20%. Another technique is to use a replica floating gate that never gets a quantum particle but has a similar leakage current with the detection floating gate. By measuring the differential signal between the detection floating gate and the replica floating gate, the voltage change due only to the presence or absence of the quantum particle can be detected, while any parasitic voltage change due to leakage current is rejected as a common mode signal.

In one embodiment, the actual operation of the floating gate detection consists in modifying the potential in the proximity of the floating gate such that the quantum particle is moved in a controlled fashion under the floating gate and then away from it.

Since the coupling to the detector is weak and the quantum particle can be moved multiple times under the floating gate and then away from it, this detection is largely non-destructive and can be performed multiple times. By performing the detection multiple times any parasitic effect due to inherent noise in the system is eliminated or attenuated. Note that the number of consecutive non-destructive detections that can be performed, however, depends on the decoherence time of the quantum state in the given process technology and given physical structure.

With reference to FIG. 7, to impact the potential around the floating gate and thus allow the quantum particle to move under the floating gate and then away, multiple additional helper control gates are used. In one embodiment, a single helper control gate is used located on one side of the main floating detection gate. In another embodiment, two helper control gates are used, one on each side of the main detection floating gate, as shown. Alternatively, additional helper control gates can be placed around the main detection floating gate. The further away the helper gate is placed, however, the less impact it has on the potential profile around the detection floating gate. This is why the most effective are the helper gates directly to the left and right of the main detection gate.

A quantum structure includes a number of control gates, also called imposers, that determine the specific quantum operation performed. After the last imposer has performed its function, the desired quantum computation has finished and the quantum state is ready for detection.

In position based semiconductor quantum structures the detection entails determining whether or not the particle is present in the last quantum dot of the structure, past the last imposer. If the quantum state is one of the base states, i.e. particle present or absent, then the detection can be done only once (in the absence of system noise). When noise is present, multiple detections may be desired to reject or attenuate the impact of the system noise.

If the quantum state is a general superposed state, the particle has a certain probability of being present in the last detection quantum dot. To measure the quantum state, the detection is performed multiple times. The percentage of positive (i.e. present) outcomes versus the total number of measurements represents the probability corresponding to the measurement of the corresponding quantum state. Similarly, the percentage of negative (i.e. absent) outcomes may be used.

In trace (A) the control signals on the left and right helper control gates are such that the potential energy profile is high and the quantum particle is not allowed to move towards the floating detection gate. The particles flow towards the positions with lower potential energy. If a voltage potential profile would be drawn instead, the electrons go to higher potential level locations. The situation is reversed for the holes that go to the regions of higher energy. From the voltage potential perspective, the holes go to the lower potential levels.

Trace (B) illustrates the case when the control signals on the left and right helper control gates are modified such that the energy profile level is lowered (191) in the area surrounding the floating detection gate. This allows the quantum particle to extend its wavefunction over the entire physical location where the energy profile is low. This also includes the region under the floating detection gate.

Trace (C) shows the control signals of the left and right helper control gates changed such that the region of low energy profile is restricted to a narrow region essentially under the floating detection gate. Now the quantum particle is localized in a very narrow region under the floating detection gate. This results in a relatively large (i.e. measurable) change in the potential of the floating gate. When the quantum particle is distributed over a wide area, the change in potential is much smaller, making it harder to measure. Having the particle located directly under the floating gate generates a change in potential of the floating gate which can be measured and amplified by the Mdetector circuit 1040 (FIG. 11A) using one or multiple classic FET devices.

The quantum particle is then moved away from the floating detection gate. As shown in trace (D), first the right helper control gate is used to enlarge the area of low energy towards the right side, away from the floating detection gate. In this case the energy profile is still low under the floating detection gate which allows the quantum particle to spread both under the floating gate and away from the floating gate.

In a second step as shown in trace (E), the helper control gates are managed to raise the energy profile in close proximity of the floating detection gate, allowing the quantum particle to extend away from the floating detection gate. In this manner, the quantum particle is moved away from the floating gate and the first detection has ended. The quantum state is still intact. It has not been destroyed (collapsed) through the first detection. A second detection may be performed by moving the quantum particle under the floating detection gate again.

Trace (F) shows how the control signals on the two helper control gates are again enlarging the region with low energy profile, allowing the quantum particle to move again under the floating detection gate. The low energy level area remains wide and the quantum particle wavefunction is spread both under the floating detection gate and away from the floating gate. As such the change in potential of the detection gate is low and harder to measure.

In trace (G) the control signals on the helper control gates again determine the narrowing of the energy valley where the quantum particle is allowed to spread to a relatively narrow region under the main floating detection gate. As such, the quantum particle moves a second time under the gate and a second non-destructive quantum detection is performed.

The detection process can continue with multiple subsequent detections. In trace (H) the helper control gates are used to again widen the low energy level where the quantum particle is present. In this way the quantum particle is spread under and away from the floating detection gate.

In trace (I) the helper control gates restrict the area of low energy level where the quantum particle can be present to a region away from the floating detection gate.

In this manner, the process can continue with further subsequent movements of the quantum particle under the floating detection gate and away from the floating detection gate, both on the left side and on the right side.

A key advantage of floating gate detection is that it allows multiple detections of the same quantum state, without the need of repeating the entire quantum computation since the particle's wavefunction does not substantially collapse in the detection process. Therefore, instead of performing the entire quantum experiment multiple times, the quantum experiment is performed once but the results are measured multiple times. This shortens the overall computation time thus increasing the speed of quantum computation, and thus provides accelerated quantum computation.

In the case of the destructive floating well detection, the quantum particle "quantumness" is lost with each detection. Thus, performing multiple floating well detections require multiple executions of the entire quantum operation, which in turn takes a longer time. The more time spent on detection reduces the speed of quantum operation and thus reduces the effective quantum acceleration factor with respect to a classical computation.

In another embodiment, the floating gate detection may be followed by a floating well detection which finally collapses the quantum state. By using both methods of detection, a more sophisticated detection scheme can be built with a lower error rate. By looking at the correlation between the two types of detections, built-in detection error correction can be realized.

Figure 8A:
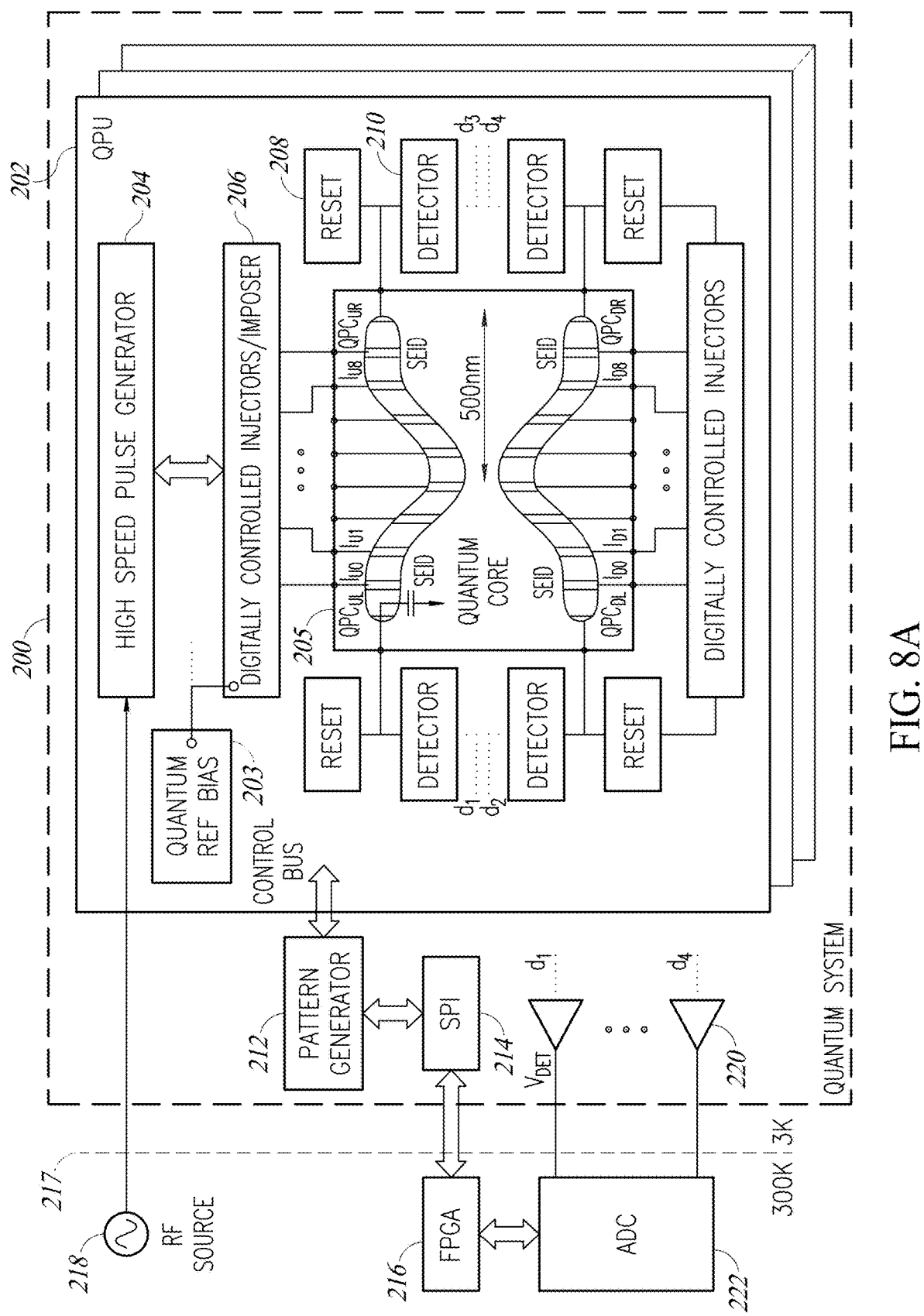
FIG. 8A is a high level block diagram illustrating an example quantum processor unit (QPU)
Figure 8B:
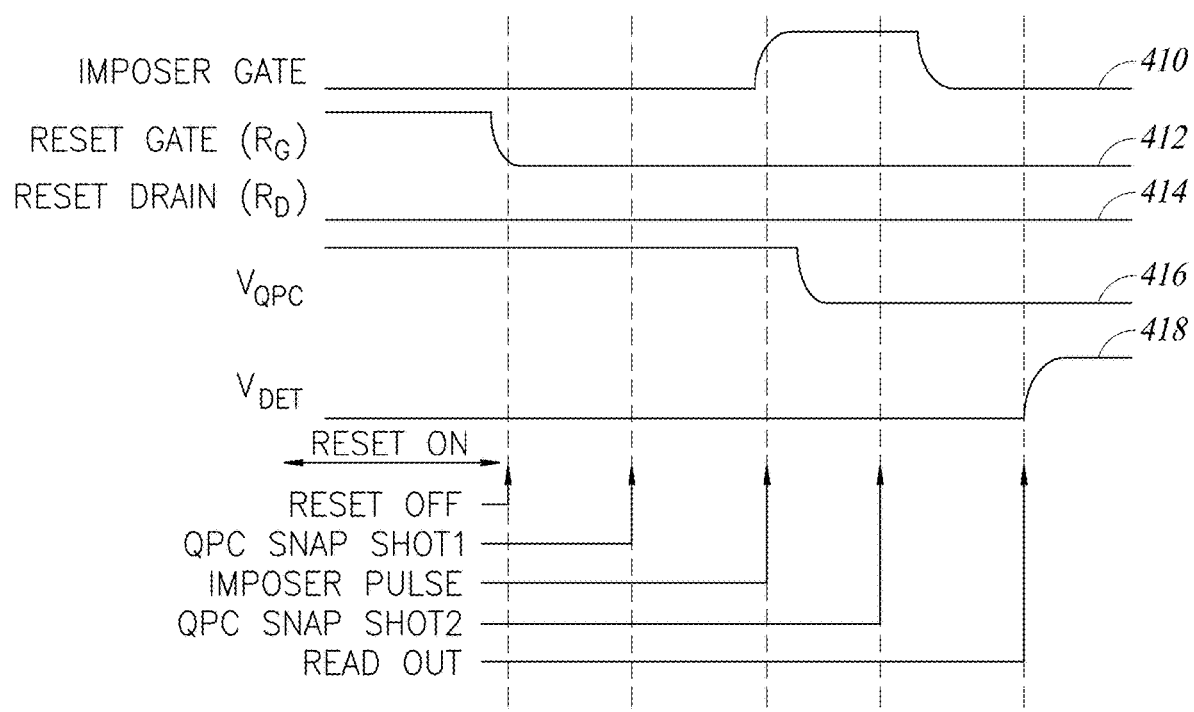
FIG. 8B is a timing diagram of the signals of the quantum core interface circuit of FIG. 8A.

A high level block diagram illustrating an example quantum processor unit (QPU) is shown in FIG. 8A. A timing diagram of selected signals of the quantum core interface circuit of FIG. 8A is shown in FIG. 8B. With reference to FIGS. 8A and 8B, the quantum system, generally referenced 200, comprises a plurality of QPUs 202, pattern generator 212, SPI 214, and drivers/buffers 220. The quantum system 200 is coupled to RF source 218, FPGA 216, and ADC 222. The QPU comprises high speed pulse generator 204, quantum core 205, quantum reference bias circuitry 203, digitally controlled injectors 206, reset circuits 208, and detector circuits 210. The quantum system components to the right of dashed line 217 are cooled to approximately 3 or 4K while the components external on the left side of dashed line 217 can be at room temperature or can be placed at a higher cryogenic temperature within the same cryogenic cooler apparatus, for example at around 70K. A double V structure is shown as an example for the quantum core. It is appreciated that any number of structures arranged as a quantum dot array or otherwise may be fabricated in the quantum core.

The quantum system provides reset, control, single-electron injector and detection. The quantum core comprises a double 'V' shaped QDA of quantum dots shown as single electron transistors (SETs). The quantum dots in the quantum core are controlled by imposers whereby a plurality of CDACs function to generate precise pulses via pulse generator 204 driven by clock source 218 and pattern generator 212 to control the operation of the quantum core. The CDACs are operative to generate reset pulses, single electron injection signals, as well as imposer signals. Detector circuits 210 measure the presence or absence of an electron on either end of the QDA. The quantum system communicates with external field programmable gate array (FPGA) 216 via serial peripheral interface (SPI) 214. Output from the detectors 210 is fed to external analog to digital converters (ADCs) 222 via a plurality of drivers 220.

It is noted that the quantum core is cooled to approximately 4K while the interface circuitry may be at the same or higher temperature. The circuitry external to the quantum system is at room temperature (i.e. 300K) or it could be at a higher cryogenic temperature, for example located in a different cooling stage of the cryogenic refrigerator.

The capacitive DACs (CDACs) 440 (FIG. 10) control the precise amplitude and timing of the pulses for (1) the reset operation ($R_D$ and $R_G$ signals) to ensure the QPC node is free from extra electrons; (2) single-electron injection into the first quantum dot; and (3) imposers to transfer electrons via tunneling between the quantum dots. The example waveforms shown include the imposer gate 410, $R_D$ and $R_G$ signals 412, 414, respectively, voltage $V_{QPC}$ on the QPC 416, and detector voltage $V_{DET}$ 418.

In one embodiment, as shown in FIG. 8A, the cryogenic quantum control and read out system is integrated with a two dimensional (2D) qubit array in a single chip operating at 3K. The chip comprises an array of Quantum Processor Units (QPUs) 202. Each QPU houses a unique Quantum Core or the 2D qubit array. The qubit array is initialized by the reset transistors connected to a Quantum Point Contact (QPC) at the edges of the qubit array (see also FIG. 4). This node is also shared with the detectors utilized during the read out phase of the quantum experiment. The excitation signals for the qubits are sourced from digitally controlled injectors 206 that are clocked by a high speed pulse generator 204. The DC biasing of the qubit array is sourced from the Quantum Reference Bias Circuit (QRBC) 203 coupled to the injectors. A pattern generator 212 acts as a command and control block for all the aforementioned hardware interfacing the qubit array. The localized routing between the cryogenic electronics and the qubit array results in a power efficient control and detection system.

In one embodiment, the quantum core comprises a plurality of qubits which are position based charge qubits. The quantum dots in the qubit array 205 are arranged over two rows in a double-V pattern. In each row, the quantum dots are isolated by a barrier controlled by a control node called an imposer. The QPC acts as a reservoir from which a single electron is tunneled to the first quantum dot (at the left or right edge). The qubits are designed using standard commercial CMOS process without any application specific tailoring of the layer stack or materials. This means that the thin film of Si or the substrate, is not a pure isotope. Additional microscopic impurities will be present at the Si/SiO2 interface. The quantum information is encoded in the position of the electron controlled by a series of excitation signals applied at imposers to control the tunneling process of that electron across multiple quantum dots. In one embodiment, the excitation signal is a pulse or resonant microwave signal. In a pulse driven mode, the width of the pulse controls the evolution of the electron's wave function between the quantum dots while the dc biasing from the QRBC imposes a potential distribution across the wells. In other words, the electron's position or occupancy across quantum dots varies over the duration of the pulse at a rate known as the Rabi frequency. The operation and consequently the control circuit architecture mirrors the simplicity and ease of a DRAM cell. In the microwave driven mode, the excitation frequency is resonant with Larmor frequency which is determined by the difference between the ground and excited energy levels. Once the quantum operation concludes, the read out phase begins. During the read out phase, the final state of the qubit is measured by sensing the charge present on the QPC node.

Figure 9:
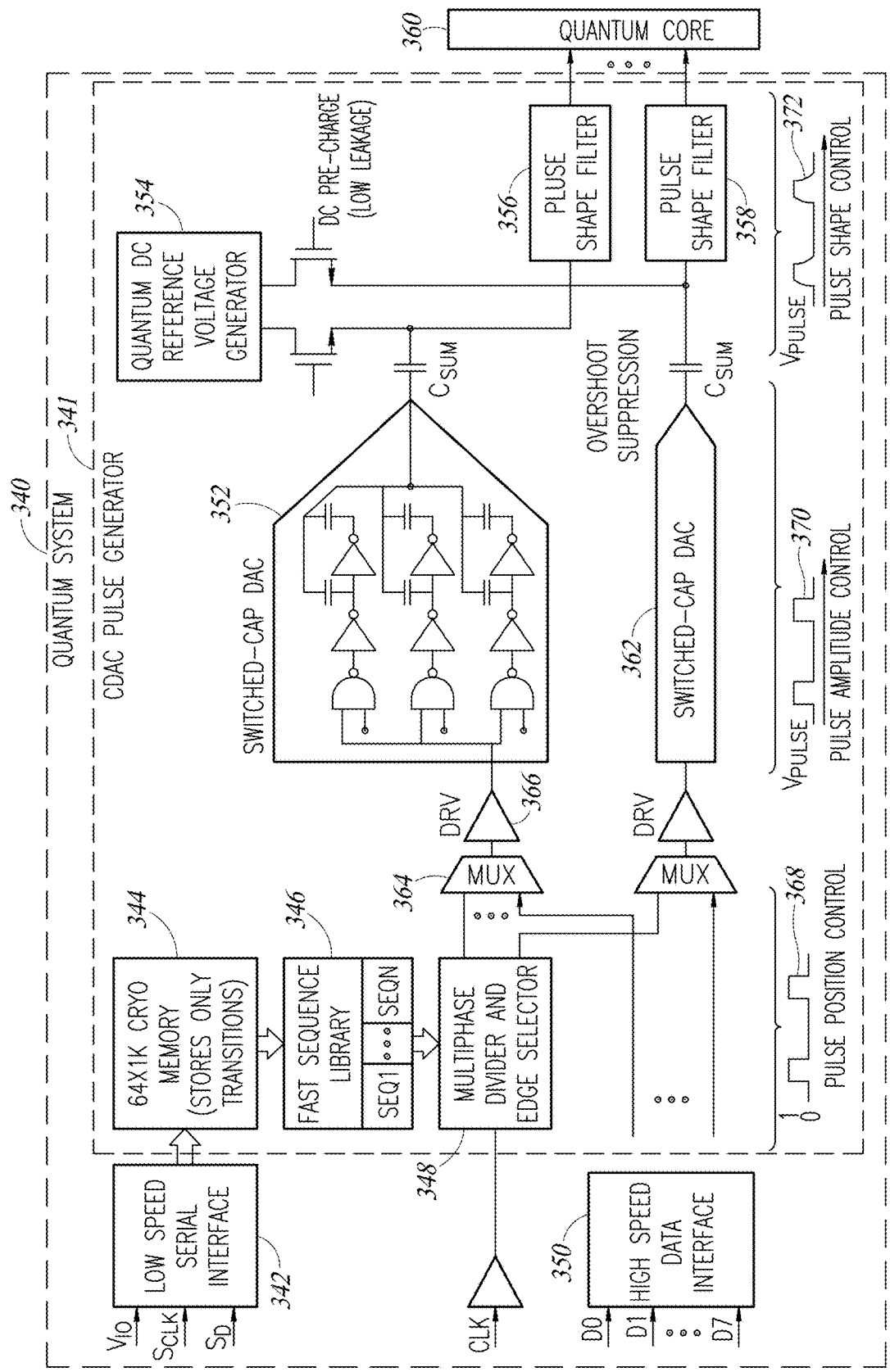
FIG. 9 is a high level block diagram illustrating an example capacitive DAC based pulse generator coupled to the quantum core.

A high level block diagram illustrating an example capacitive DAC based pulse generator coupled to the quantum core is shown in FIG. 9. The quantum system, generally referenced 340, comprises a capacitive digital to analog converter (CDAC) pulse generator circuit 341 coupled to a quantum core 360 that comprises a plurality of qubits. The CDAC pulse generator circuit comprises low-speed serial I/F 342, cryo memory 344, fast sequence library 346, high speed data interface 350, multiphase divider and edge selector 348 that receives a clock and whose outputs feed switched capacitor DACs 352 via multiplexers 364 and drivers 366, quantum DC reference voltage generator 354, and pulse shape filter 356 that outputs the pulses to the quantum core 360. Waveforms 368, 370, 372 show the pulse position control, pulse amplitude control, and pulse shape control, respectively.

In contrast to the conventional creation of quantum dots entirely through process lithography, the quantum dots of the present invention are defined mainly by the applied voltage potentials at the imposers and injectors. Since the control voltages can be precisely set in time and amplitude, the depths of the quantum wells and the tunneling between them can precisely control the movement of individual electrons and their mutual entanglement for the intended quantum operation.

It is noted that the load presented by the QDA is capacitive and is relatively light. Hence, the driving circuits in FIG. 9 are able to dissipate power in the range of tens of microwatts and still operate at the gigahertz rate while providing precisely controlled voltage levels and pulses of ultralow amplitude noise. Note that the tunneling rate is exponentially related to the imposer's voltage.

Figure 10:
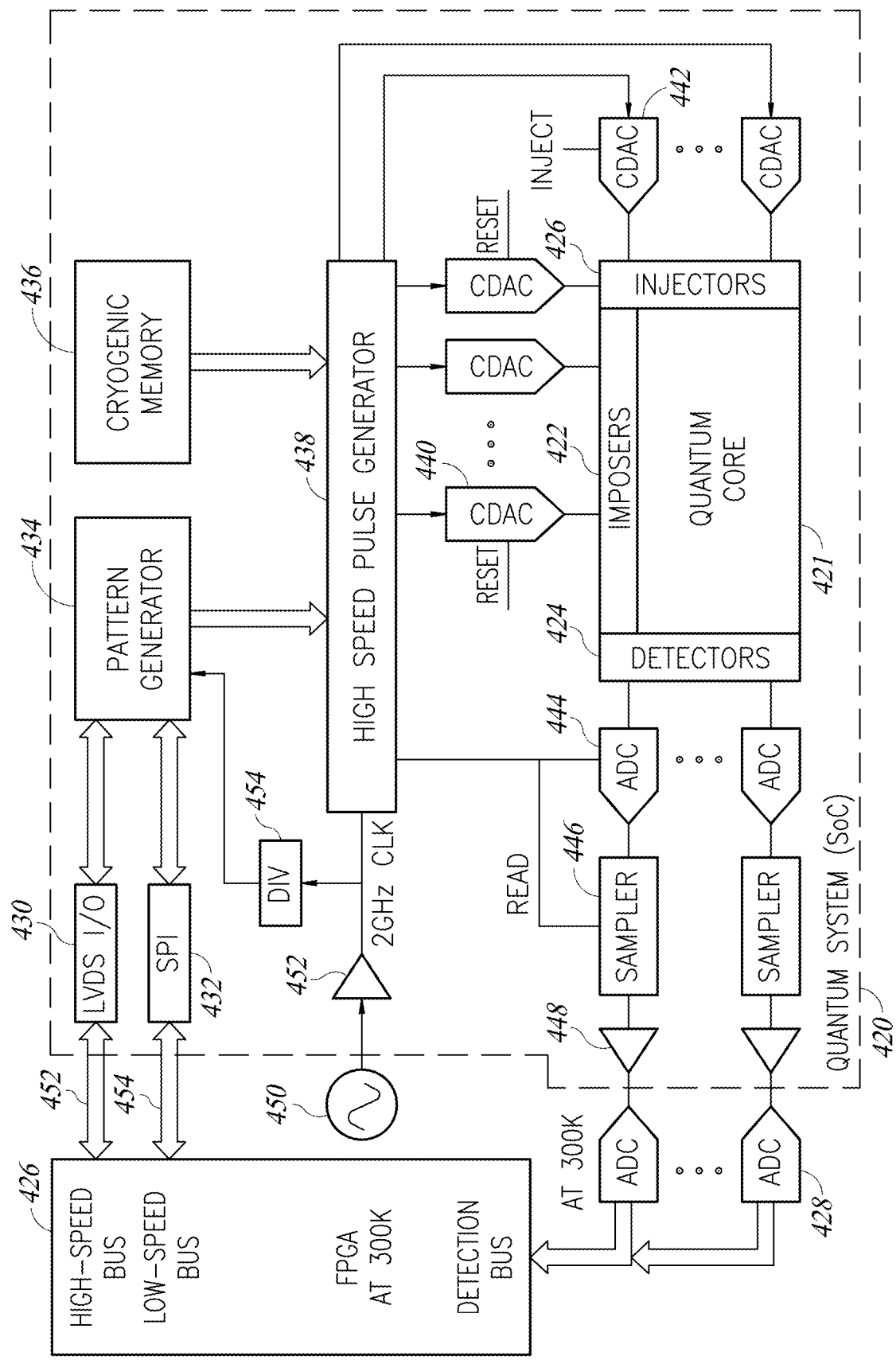
FIG. 10 is a high level top block diagram illustrating an example quantum system on chip (SoC)

A high level top block diagram illustrating an example quantum system on chip (SoC) is shown in FIG. 10. The quantum system, generally referenced 420, comprises quantum core 421 having injectors 426, imposers 422, and detectors 424 controlled by a plurality of CDACs 440, 442 that receive digital signals from pulse generator 438. Data from an external FPGA 426 is transferred over buses 452, 454 to pattern generator 434 via low voltage differential signaling (LVDS) I/O circuit 430, SPI 432, respectively. Output from detectors 424 are sampled by samplers 446 after being converted to digital via ADCs 444 and then fed to the external FPGA via drivers 448 and ADCs 428. High speed pulse generator 438 is driven by clock source 450 via driver 452. Divider 454 feeds a divided clock to the pattern generator.

In one embodiment, the quantum SoC is realized in 22 nm FDSOI and operates at 4 K. A 2 to 6 GHz external clock 450 is buffered and divided down to create a multi-phase system, while the pattern generator core 434 determines the selection of the appropriate clock edges to create the fast and narrow pulses needed to control the quantum structures in the quantum core. The pulse generator 438 provides high resolution pulse width control, while CDACs 440 provide a high resolution amplitude setting for the quantum control pulses. The pulse amplitude sets the Rabi oscillation frequency in the semiconductor quantum structures, while the pulse width determines the particular quantum operation performed, such as quantum CNOT, quantum rotation, Hadamard split, etc. The quantum detectors 444 are followed by correlated double samplers (CDS) 446 that provide first-order correlated noise rejection. After further amplification 448 and analog-to-digital conversion 428, the detected signals are sent to the FPGA board 426. Individual per qubit calibration loops are used to set the appropriate pulse amplitude and width levels for each local quantum structure. This compensates for the CMOS process variation impact on the quantum performance of each qubit.

Quantum Noise Generation

Figure 11:
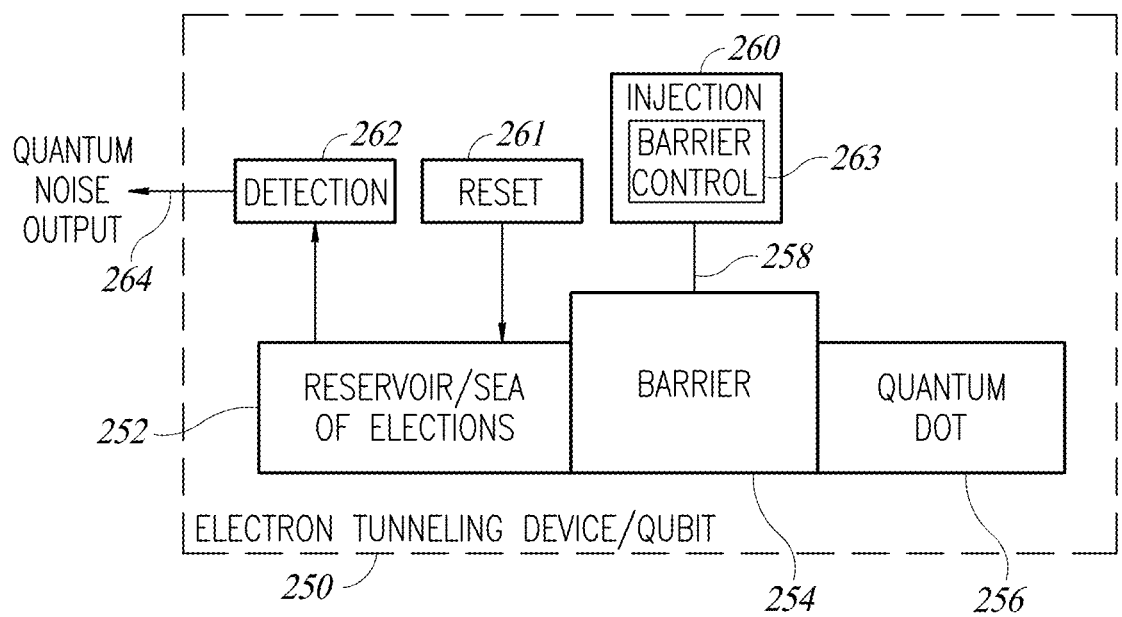
FIG. 11 is a block diagram illustrating a first example electron tunneling device.

A block diagram illustrating a first example electron tunneling device is shown in FIG. 11. The electron tunneling device, generally referenced 250, comprises a reservoir (i.e. sea of electrons) 252, tunneling barrier 254 and injection circuit 260 incorporating barrier control 263 that generates barrier control input 258, quantum dot 256, reset circuit 261, and detection circuit 262. In operation, the barrier is lowered via the barrier control signal to permit a single particle (or a small controllable number thereof) to travel from the reservoir to the quantum dot. The presence or absence of the single particle can be detected via the detector circuit 262 and a stream of output bits is generated. In one embodiment, the barrier control signal can be set such that the probability of detecting the particle in the quantum dot is approximately 50%. In this case, the output 264 of the detector is a random stream of bits with equal probability of 0s and 1s. Alternatively, the barrier control can be set to yield different probabilities other than 50% depending on the application. The random bit stream output of the detector constitutes quantum noise which can be used in numerous applications such as neural networks.

Figure 12:
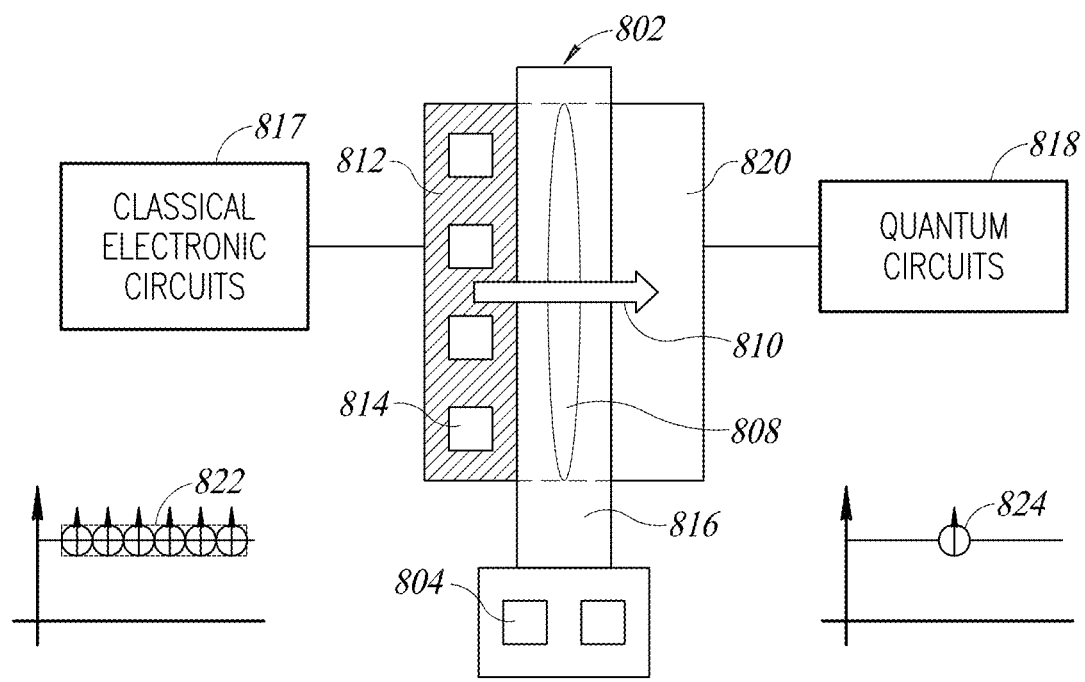
FIG. 12 is a block diagram illustrating a first example interface device.

The interface device of the present invention can also be used to generate quantum noise as described below. A block diagram illustrating a first example interface device is shown in FIG. 12. The device, generally referenced 802, comprises a conventionally doped diffusion region 812 and one or more metal contacts 814, gate 816 and gate contacts 804, and a non-doped (intrinsic or no diffusion) or very low doped (n−−, p−−) region 820 having no or low n− or p-doping, diffusion, and no contacts nor metal. The doped diffusion region 812 is either low doped (n−, p−), medium doped (n, p), high doped (n+, p+), or highly doped (n++, p++). The doped semiconductor side 812 of the gate 816 connects to classical semiconductor electronic circuitry 817, which can comprise a reset controller, a particle (e.g., electron) injector controller, a gate imposer controller, and a particle detector in addition to various other control, detection and processing functionalities. The gate 816 can also connect to classic electronic circuits 817. The non-doped side 820 of the gate 816 connects to quantum semiconductor circuits 818. Thus, half the device contains classic carriers in energy bands, namely conduction and valence bands, and the other half contains quantum carriers in discrete energy levels. The transport of carriers from the classic side to the quantum side of the device is realized through tunneling through highlighted region 808. An appropriate potential applied to the gate is operative to connect a particle from the quantum side to the classic side of the interface device. Note that the labels 'quantum side' and 'classic side' are used for convenience sake since at the fundamental level there is nothing inherently quantum or classic with the two sides of the gate.

In operation, the interface device 802 functions to provide an interface from conventional electronic circuitry located on (or off) the integrated circuit to quantum circuits and vice versa. In particular, the interface device is operative to separate a single quantum particle 824, e.g., electron, etc., from a plurality of particles 822. A single quantum particle is allowed to tunnel (indicated by arrow 810) through the depletion region 808 in an injector mode of operation. An appropriate gate control signal is applied to the gate 816 to establish the energy barrier and to control the tunneling through the depletion region. Note that an appropriate potential might need to be set on doped region 812 prior to this operation. Thus, the interface device functions as an injector tunneling device that allows the tunneling of a single quantum particle, or alternatively a controllable number of particles. When the gate potential is carefully lowered, a single quantum particle (e.g., electron) is allowed to tunnel from the left to the right side of the device.

In addition, in one embodiment, the logical flow of electrons can be provisioned to function in the opposite direction whereby the interface device is part of a circuit that senses and detects the presence of a single particle. In this case, the interface device can serve as the sensor which is coupled to additional classical circuitry (not shown) to detect the presence of a single particle. In particular, if the capacitance on the classic side of the device is sufficiently low, the presence of a single particle (e.g., electron) on the quantum side of the device can be sensed or detected on the classical side of the device using conventional electronic circuitry, such as 817. This is achieved by detecting the rise/fall in voltage magnitude on the classical side caused by the presence of the single particle on the quantum side upon lowering the barrier of the gate 816. Thus, the interface device is capable of operating bidirectionally as both an injector of a single particle and a detector of a single particle.

Note that in operation, on the classic side of the interface device, the quantum particles, e.g., electrons, are in energy bands, i.e. the conduction band and valence band, which enables current flow in classic semiconductor devices. On the quantum side of the interface device, the quantum particle is in discrete energy levels with one or two electrons (spin up and down) in each level. Note that the spin of the particle is controlled by one or more magnetic fields.

Figure 13:
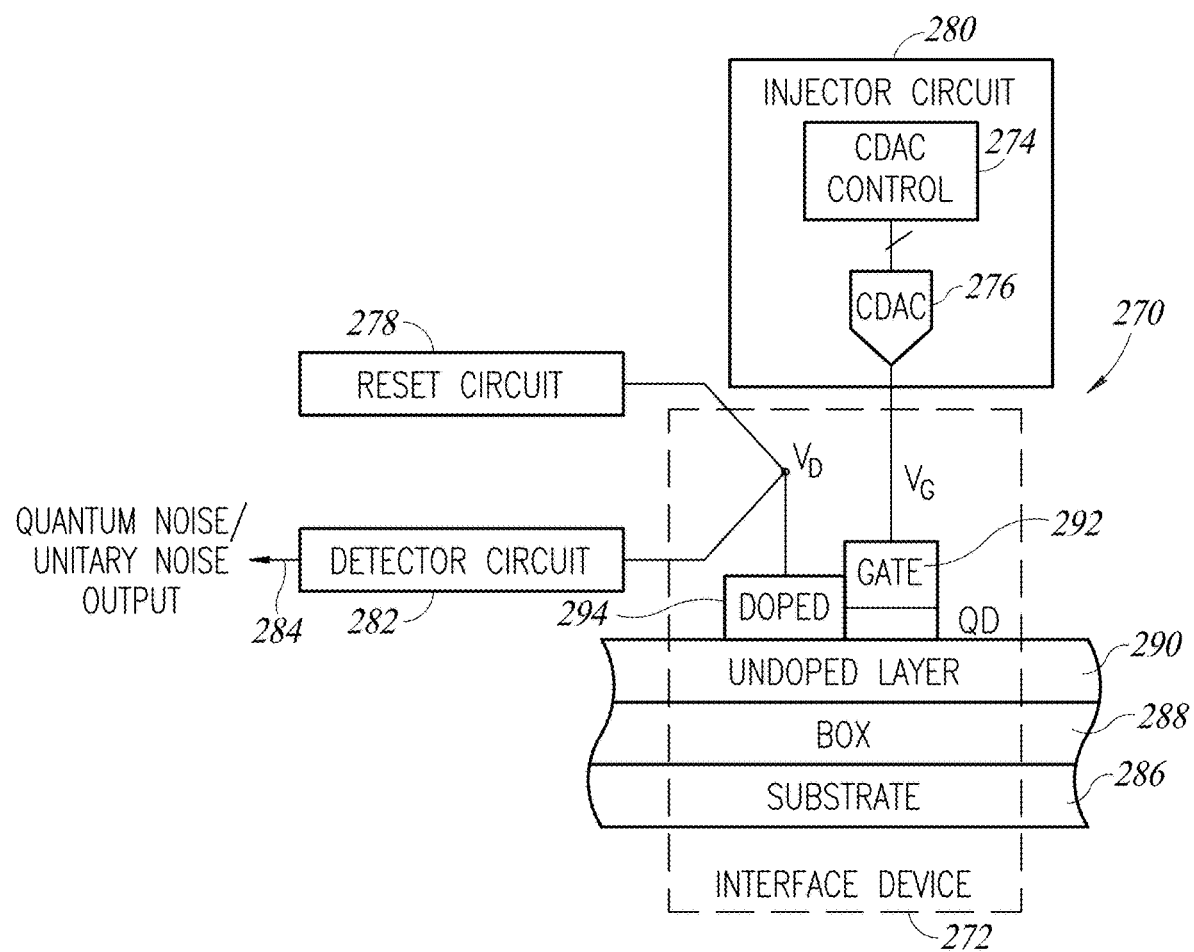
FIG. 13 is a block diagram illustrating a second example interface device.

A block diagram illustrating a second example interface device is shown in FIG. 13. The circuit, generally referenced 270, comprises interface device 272 coupled to reset circuit 278, injector circuit 280, detector circuit 282 that generates a digital unitary noise output signal 284. The injector circuit 280 includes CDAC control 274 and CDAC control 276. The interface device 272 comprises substrate 286, BOX layer 288, undoped or low doped layer 290, doped region 294, and gate 292. The quantum dot lies on the right side of the gate 292 in the undoped layer. The doped region 294 is the reservoir/sea of electrons.

In operation, the gate voltage $V_G$ and drain voltage $V_D$ are biased via the CDAC circuit 276 to lower the barrier imposed by the gate to allow tunneling of a particle from the drain to the quantum dot. The presence or absence of a particle in the quantum dot is measured by the detector circuit. The digital stream output of the detector comprises the unitary noise source 284.

Figure 17:
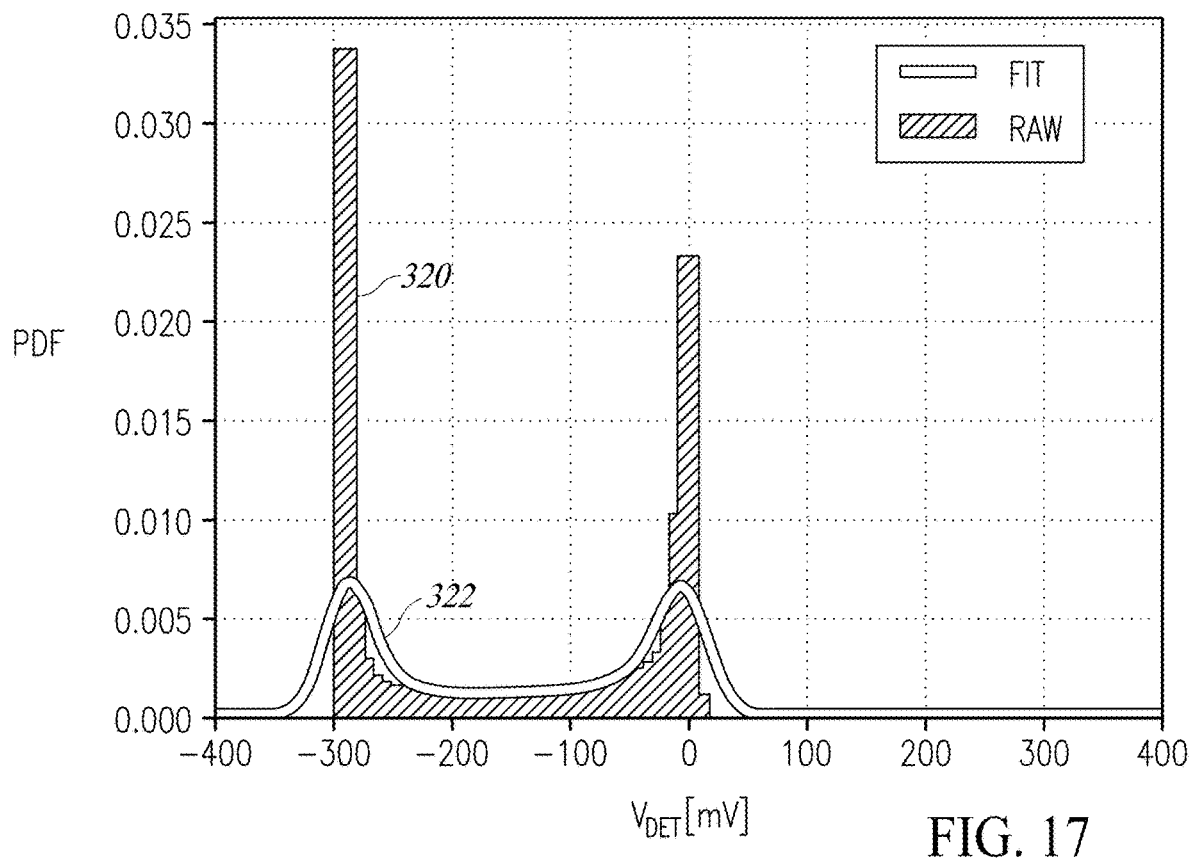
FIG. 17 is a diagram illustrating example bi-modal detector output in a quantum dot array.
Figure 18:
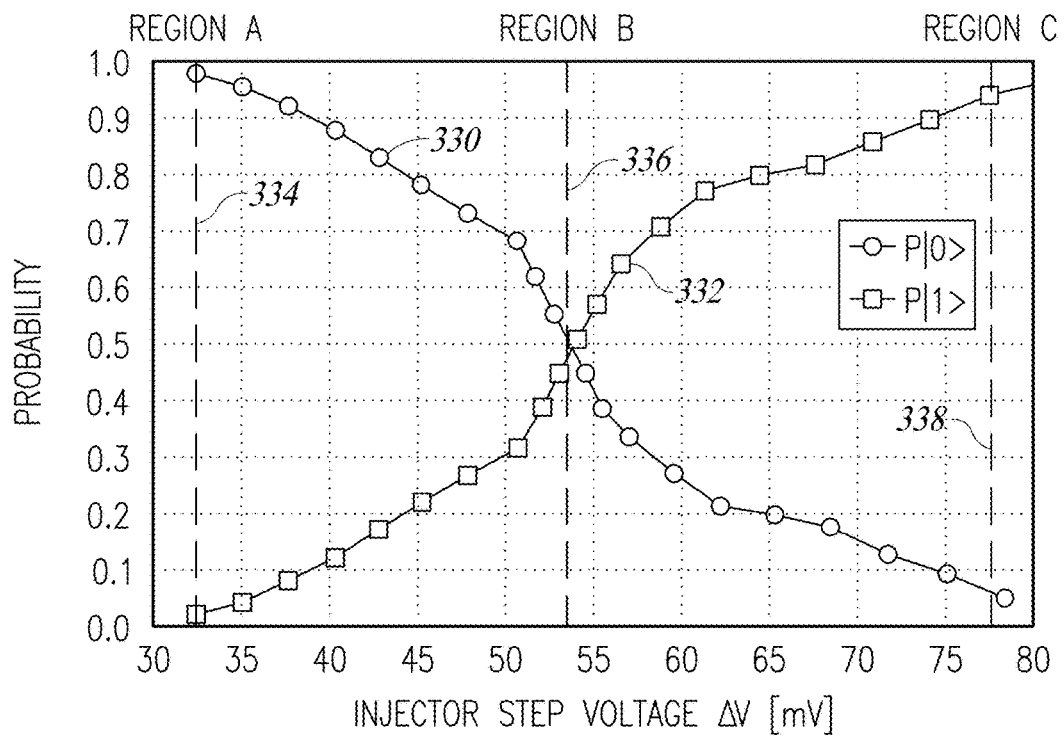
FIG. 18 is a diagram illustrating example P|0> and P|1> probability as a function of injector step voltage.

A diagram illustrating a second example quantum resonant tunneling having substantially equal bi-modal distribution (Region B) is shown in FIG. 15. A diagram illustrating example bi-modal detector output in a quantum dot array is shown in FIG. 17. A diagram illustrating example P|0> and P|1> probability as a function of injector step voltage is shown in FIG. 18. With reference to FIGS. 15, 17, and 18, the circuit 230 comprises interface device 234 shown schematically with the doped region (classic) 238 on the left side of the gate or barrier 240 and the quantum dot 232, 242 on the right side of the gate. The output $V_G$ of the biasing DAC 236 is connected to the gate. The QPC node (see FIG. 4) is initialized by first scanning voltages on the reset transistor gate and drain (only during a calibration phase) in order to find the most optimal conditions. The imposer connected to the interface device or single electron injection device (SEID) is pulsed biased with a set amplitude during this scan. At an appropriate bias point, the conditions for quantum resonant tunneling are met. The detector output distribution 244 shows two distinct peaks when the barrier with potential energy $U_B$ is low while the Fermi energy level $E_F$ at QPC aligns with a discrete energy level in the adjacent quantum dot $E_N$. Note that the outcome of each experiment can have one of two possibilities. In one event, the electron tunnels to the adjacent quantum dot resulting in a drop in the electronic charge at QPC sensed by the detector resulting in an output voltage Vµ. The probability of this event is P|1>. In the other event, the electron does not tunnel, resulting in a detector output at 0 V. The probability of this event is P|0>. FIG. 17 shows the histogram 320 raw/322 fit of the detector output when the reset transistor is biased appropriately and the events associated with the two states, namely |0> and |1>, are visible with a separation of 300 mV between them at the detector output. In this case, the probably density function (PDF) at the output of the detector is roughly 50% for 0s and 1s. The quantum resonant tunneling process is moderately correlated when the lag is short. This unique characteristic is also observed by performing autocorrelation on the time series data of the detector samples and the result is shown in FIG. 17 inset traces 320, 322. P|1> (trace 332) increases with increasing step amplitude of the interface device injector (or CDAC code) while P|0> (trace 330) retrogrades as shown in FIG. 18. This is another characteristic of quantum resonant tunneling. Note that the x-axis in this graph has been translated from CDAC code to a step voltage. Therefore, in this state the electron injection process is precisely controlled by a digitally controlled circuit parameter allowing the quantum information to be manipulated in a single quantum dot or in multiple quantum dots in the 2D qubit array.

A diagram illustrating a first example quantum resonant tunneling having skewed bi-modal distribution (Region A) is shown in FIG. 14. In this example, the circuit 300 incudes interface device 302 that is biased to yield a PDF at the detector output skewed to have a higher probability of 0s as indicated by the histogram 309 with a higher peak for P|0>. In this case, the barrier 306 is set higher than in FIG. 15. Thus, the particle is less likely to successfully tunnel to the quantum dot 308 from the classic side 304.

A diagram illustrating a third example quantum resonant tunneling having skewed bi-modal distribution is shown in FIG. 16. In this example, the circuit 310 incudes interface device 312 that is biased to yield a PDF at the detector output skewed to have a higher probability of 1s as indicated by the histogram 319 with a higher peak for P|1>. In this case, the barrier 316 is set lower than in FIG. 15. Thus, the particle is less likely to successfully tunnel to the quantum dot 318 from the classic side 314.

Figure 19:
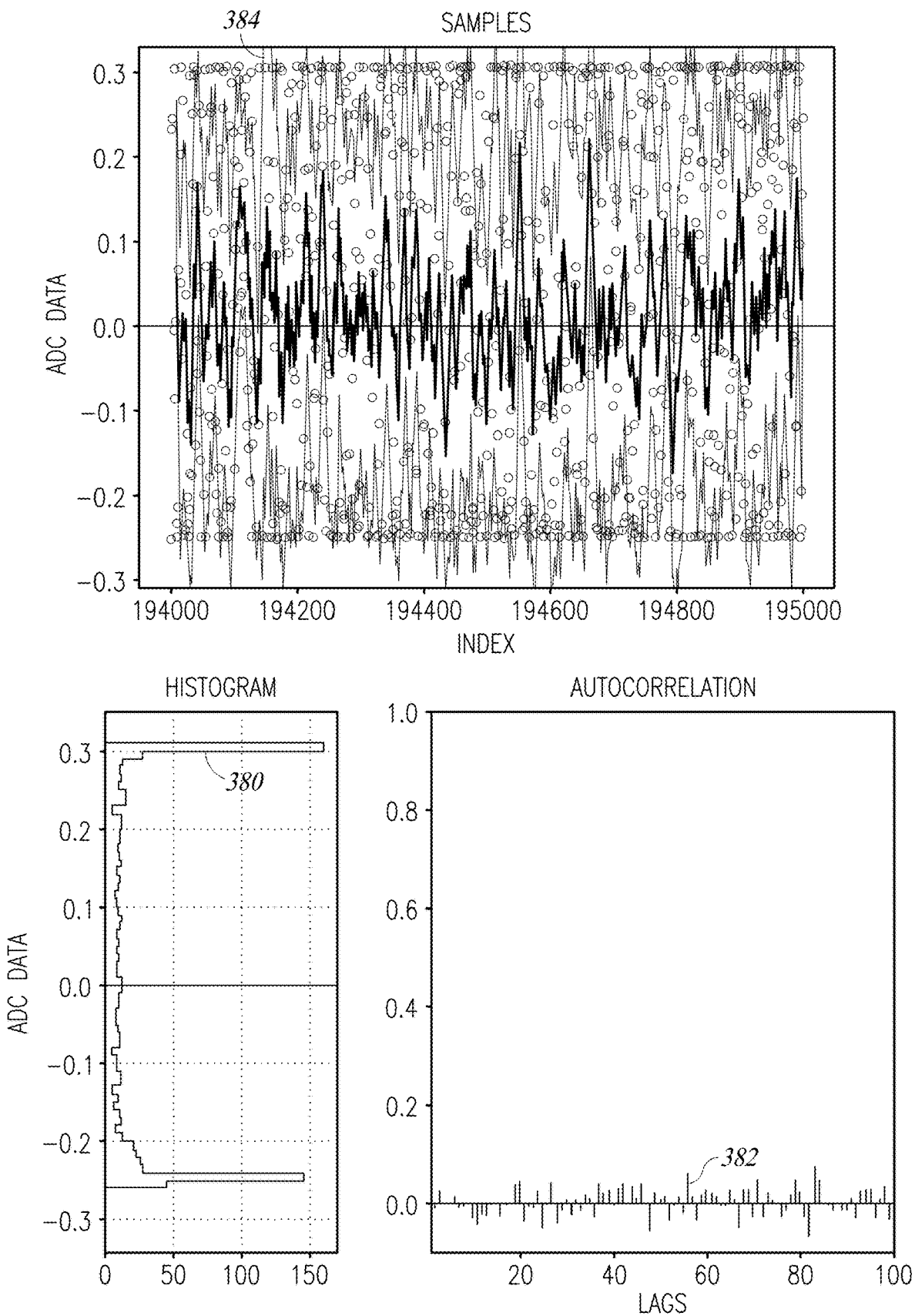
FIG. 19 is a diagram illustrating example quantum noise source, corresponding histogram, and autocorrelation function.

A diagram illustrating example quantum noise source, corresponding histogram, and autocorrelation function is shown in FIG. 19. The plot 384 is of the ADC output of the detector circuit which generates the quantum noise. The source of quantum noise comes from a series of measurements made at one of the detectors in the QPU. To generate random noise, the quantum device (e.g., interface device, etc.) is placed into a state where it provides random noise samples. The sample plot 384, histogram plot 380, and autocorrelation plot 382 show the typical analysis on these measurements that indicate "good" randomness of the noise source, i.e. bi-modal distribution of the histogram, and the relatively flat auto-correlation plot. Note that the quantum unitary noise source has numerous applications including application to neural network accelerated learning as described in more detail infra.

Note also that the QDA may comprise multiple unitary correlated quantum noise channels realized on the same monolithic integrated circuit (IC) with full control of the PDF of each channel. Note that for generation of noise, no data is required to be input to the QDA. In addition, the capture of the noise data can be carried out offline a priori of the ANN. Alternatively, the QDA can be fully integrated with a neural network processor in a common hybrid classic-quantum neural network array, wherein the QDA is used to perform the full convolution operation in a single operation. Such QDAs can be organized in a large array to achieve a significant speedup or fully integrated highly parallel architectures using multiple qubits embedded within an AI accelerator engine giving significant performance enhancements.

Quantum Stochastic Rounding

In one embodiment, the unitary noise generated by the QPU can be used to perform stochastic rounding operations. Quantum rounding is the term used to refer to the use of quantum unitary noise to perform stochastic rounding.

The most common type of rounding is to round to the nearest integer. The rule for rounding is to look at the digits in the tenth's place (for rounding to the nearest integer, for example). If the digit in the tenths place is less than 5, then the number is rounded down, which means the units digit remains the same. If the digit in the tenths place is 5 or greater, then the number is rounded up, which means the unit digit is increased by one.

When doing arithmetic in fixed point machine learning or other hardware compute, fractions are obtained that cannot be represented by the number of bits available irrespective of the bit format. One way to handle these "fractions" is to round to the nearest integer. Conventional round to nearest, however, is deterministic, i.e. given the same number it always produces the same result. For example, consider one decimal place of 1.5*0.6=0.84 which is rounded either up or down, nearest to 0.8 or 0.9. This is the simple or naïve approach to round to the nearest integer, making 0.5 the threshold for rounding up or down.

Nearest integer rounding has inherent issues. For example, consider adding 0.4 to 0.0 one hundred times. With rounding to the nearest integer, the results obtained would be equal to $$100*(\text{round}(0.4)+0)=0 \tag{1}$$

This represents a large cumulative rounding error. In some situations, rounding to nearest integer produces correlated rounding errors that cause systematic error growth. This can happen when we form the inner product of two long vectors x and y of nonnegative elements. If the elements all lie between 0 and 1 then the partial sum can grow monotonically as more and more terms are accumulated until at some point all the remaining terms drop off the computed sum and do not change it and the sum stagnates.

To reduce the error of rounding to the nearest integer, a technique called stochastic rounding can be used. The use of a statistical approach can improve the results. In stochastic rounding, the fraction to be rounded [0.4], also considered the reminder of the number to be rounded, is used as a probability for a Bernoulli random sample of either [0, 1]. Then we would get 60% chance of rounding to 0, and 40% chance of rounding to 1.

Consider $x_1$ and $x_2$ be adjacent numbers (i.e. integers) that are candidates for the result of the rounding. The number x to be rounded lies between these two numbers. In stochastic rounding, we round up to $x_2$ with probability $(x-x_1)/(x_2-x_1)$ and we round down to $x_1$ with probability $(x_2-x)/(x_2-x_1)$; note that these probabilities sum to 1. The probability of rounding to $x_1$ and $x_2$ is proportional to one minus the relative distance from x to each number.

Note that the expected value of the result of stochastically rounding x is x itself, i.e. if $x=(x_1+x_2)/2$, thus the expected error (i.e. bias) is zero. Hence stochastic rounding substantially maintains, in a statistical sense, the information that is discarded by a deterministic rounding scheme.

In one embodiment, stochastic rounding is implemented as quantum rounding on a QPU. In this case, the unitary noise output of the QPU functions as a source of random numbers to perform stochastic rounding. Thus, Equation 1 above becomes $$100*((40\%*1)+(60\%*0)=100*0.4=40) \tag{2}$$

The mathematical notation $\lfloor x \rfloor =$ is the rounding down (or truncation) notation of floor of x (i.e. $[1.2] \Rightarrow 1$, and $[4.6] \Rightarrow 4$). Stochastic rounding of x can be expressed mathematically as follows:

$$\text{Round}(x) = \begin{cases} \lfloor x \rfloor & \text{with probability } 1 - (x - \lfloor x \rfloor) \\ \lfloor x \rfloor + 1 & \text{with probability } x - \lfloor x \rfloor \end{cases} \tag{3}$$

Consider the example below of a matrix of numbers 100×100.

array ([0.8, 0.8, 0.5, . . . , 0.8, 0.7, 0.2],
[0.9, 0.6, 0.3, . . . , 0.7, 0.5, 0.6],
[0.2, 0.2, 0.1, . . . , 0.8, 0.3, 0.1],
[0.3, 0.9, 0.8, . . . , 0.7, 0.4, 0.5],
[0.2, 0.5, 0.1, . . . , 0.6, 0.6, 0.2],
[0.6, 0.2, 0.8, . . . , 0.3, 0.4, 0.4]])

Figure 20:
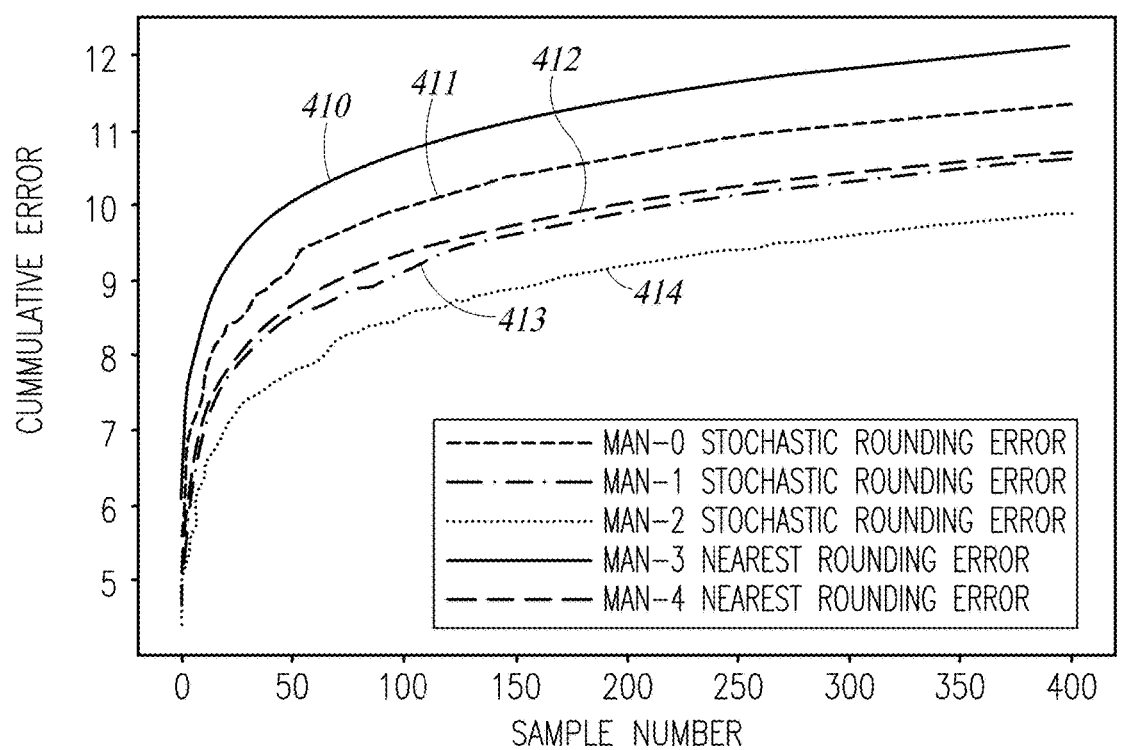
FIG. 20 is a diagram illustrating comparing rounding error for conventional nearest rounding and quantum stochastic rounding.

Each row is summed but the fractions are rounded off first. Then the cumulative error is compared using nearest rounding to integer and stochastic rounding. The results are shown in FIG. 20 with traces 413, 414 representing nearest integer rounding error and traces 410, 411, 412 representing stochastic rounding error. Stochastic rounding yields significantly less rounding error making it superior to nearest integer rounding, especially as the number of samples increases.

Figure 21:
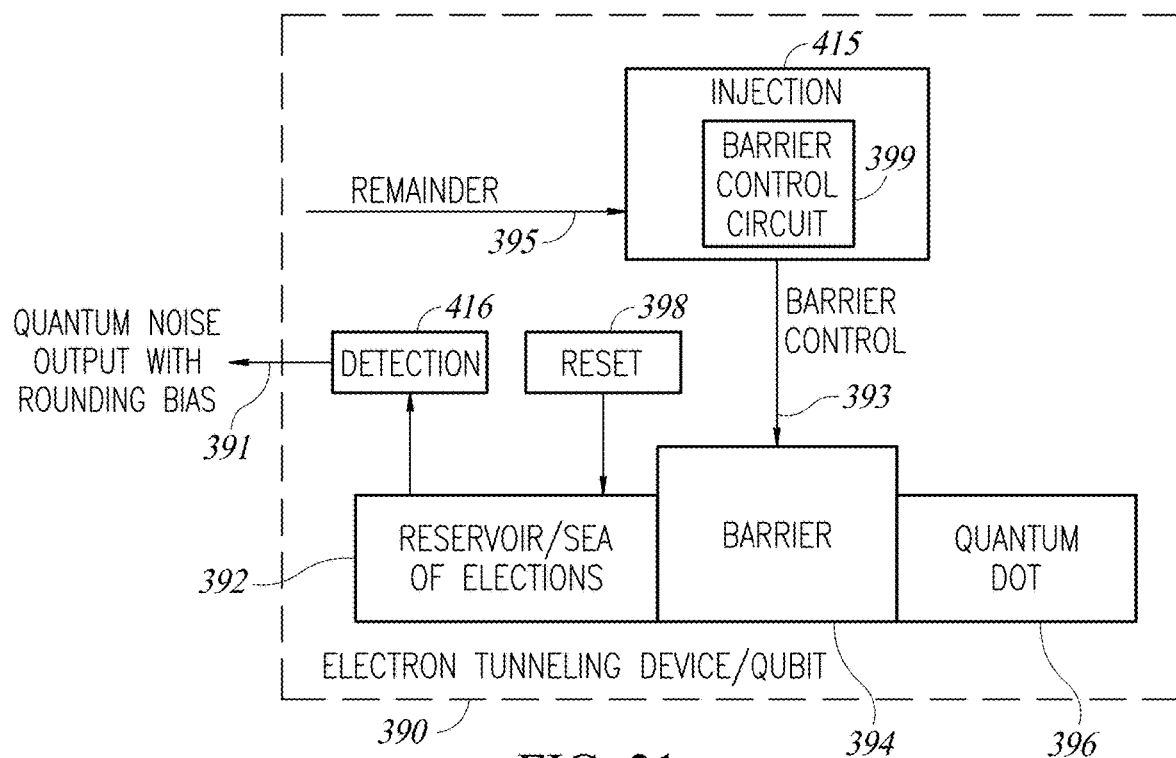
FIG. 21 is a block diagram illustrating a first example electron tunneling device incorporating rounding bias.

A block diagram illustrating a first example electron tunneling device incorporating rounding bias is shown in FIG. 21. The electron tunneling device or qubit, generally referenced 390, comprises reservoir of electrons 392, energy barrier 394, quantum dot 396, injection circuit 415 including barrier control circuit 399, reset circuit 398, and detection circuit 416. In one embodiment, the electron tunneling device, e.g., qubit, is used to realize quantum rounding. Advantage is taken of the ability of the QPU to control the biasing on the barriers (i.e. gates) of the devices.

In operation, the remainder 395 of the number to be rounded is input to the barrier control circuit 399. The barrier control circuit generates a barrier control signal 393 corresponding to the remainder that functions to skew the probability density function (PDF) of the digital unitary noise output 391 of the detector circuit 416. Depending on the barrier control signal, the probability of getting 0s and 1s at the output of the detector can be set in accordance with the value of the remainder. Any probability value between 0 and 1 is possible depending on the remainder value. In addition, any number of measurements by the detector circuit can be performed for each remainder value. In one embodiment, a single detector measurement is performed for each input remainder value. Thus, the random noise generated by the electron tunneling device 390 has a built in rounding bias that can have any desired PDF whether on a bit by bit or multiple bit output basis.

Figure 22:
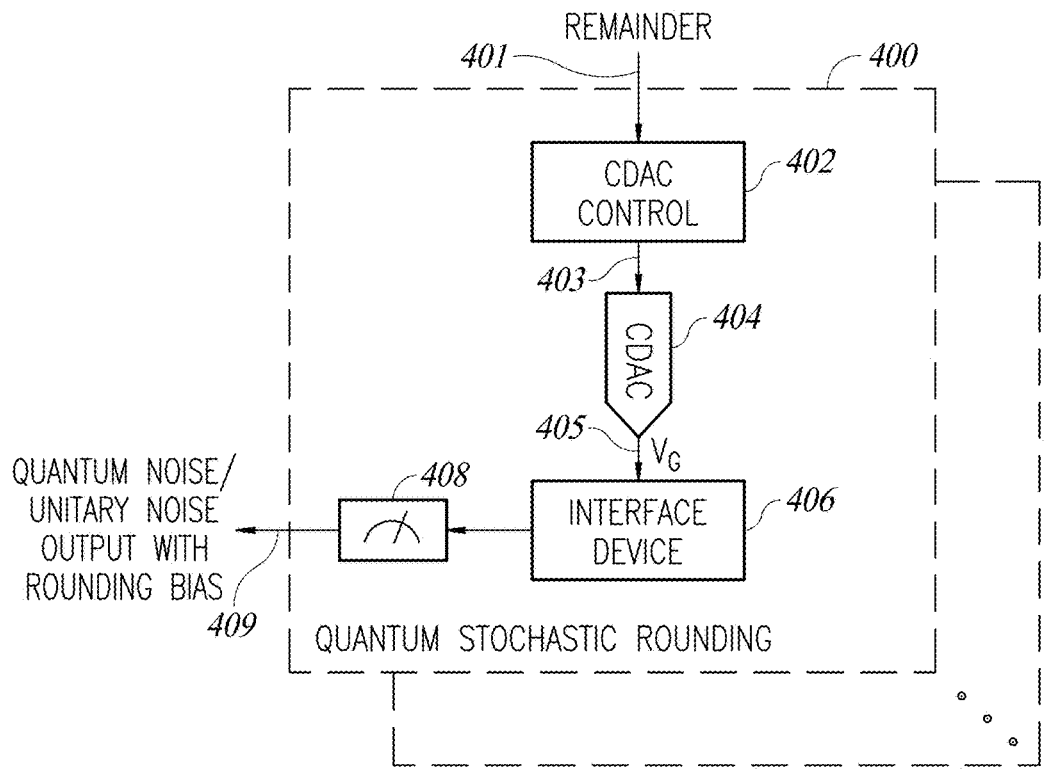
FIG. 22 is a block diagram illustrating a second example electron tunneling device incorporating rounding bias.

A block diagram illustrating a second example electron tunneling device incorporating rounding bias is shown in FIG. 22. The quantum stochastic rounding circuit, generally referenced 400, comprises interface device (such as shown in FIG. 12) 406, DAC circuit 404, DAC control circuit 402, and detector circuit 408. In operation, the remainder 401 of the number to be rounded is input to the DAC control circuit 402. The DAC control circuit generates an appropriate gate voltage $V_G$ 405 (through a predetermined digital to analog mapping) corresponding to the remainder that functions to skew the probability density function (PDF) of the digital quantum noise/unitary noise output 409 of the detector circuit 408. Note that the digital to analog mapping can be an inverse of the probability versus voltage step function illustrated in FIG. 18 discussed supra. Techniques of inverting such a function and predistorting it are well known in the art.

Depending on the gate voltage $V_G$ signal, the probability of getting 0s and 1s at the output of the detector can be set in accordance with the value of the remainder. Any probability value between 0 and 1 is possible depending on the remainder value. In addition, one or more measurements by the detector circuit can be performed for each remainder value. In one embodiment, a single detector measurement is performed for each input remainder. Thus, the random noise generated by the quantum stochastic rounding circuit 400 has a rounding bias built into it that can have any desired PDF whether on a bit by bit or multiple bit output basis.

In one embodiment, the unitary noise can be advantageously derived from a probability of detecting a particle, e.g., electron, within a double quantum dot structure comprising a position based charge qubit with two time independent basis states, $|0\rangle$ and $|1\rangle$. Each state is respectively represented by probability amplitudes $\alpha$ and $\beta$, such that the state of the qubit can be represented in terms of a superposition of the electron's wavefunction pure states. Amplitudes $\alpha$ and $\beta$ are complex numbers so they can be written in a polar format: $\alpha=a^{i\chi}$ and $\beta=be^{i\phi}$. Consequently, the position based qubit can have its state represented by four real valued parameters: a, $\chi$, b, and $\phi$. Due to the need, however, to normalize the wavefunction of an electron in this double quantum dot qubit, a and b are constrained as $a^2+b^2=1$. Furthermore, for a single qubit it is meaningless to consider $\chi$ and $\phi$ as absolute angles, and so only their difference $\chi-\phi$ (periodic over $2\pi$) makes sense. For simplicity, $\chi=0$ is implied in this discussion. Consequently, only two degrees of freedom exist in this structure.

To afford the convenience of using a Bloch sphere to represent the quantum state, we choose $\phi \in [0, 2\pi]$ and $\theta \in [0, \pi]$ as the two independent variables. Furthermore, to constrain the observables to zero mean, we map the typical $|0\rangle$ North pole state to $-1$. As conventionally, the South pole $|1\rangle$ state will collapse to $+1$ at the measurements. The Bloch sphere angle $\theta$ is governed by $\cos(\theta/2)=a$ and $\sin(\theta/2)=b$. The pair $(\theta, \phi)$ is the spherical coordinate of the point on the sphere and will experience a rotation around the sphere due to a Rabi (occupancy) oscillation. The orthogonal state to $|\psi\rangle = a|0\rangle + \beta|1\rangle$ is $[\psi^\perp\rangle = \beta|0\rangle - \alpha|1\rangle$, so an expected observable that is $+1$ will be in the orthogonal state.

$$|\psi\rangle\langle\psi| - |\psi^\perp\rangle\langle\psi^\perp| = \begin{bmatrix}\alpha\\\beta\end{bmatrix}[\alpha^* \ \beta^*] - \begin{bmatrix}\beta^*\\-\alpha^*\end{bmatrix}[\beta \ -\alpha] \quad (4)$$

$$= \begin{bmatrix}|\alpha|^2 - |\beta|^2 & 2\alpha\beta^* \\ 2\alpha^*\beta & |\beta|^2 - |\alpha|^2\end{bmatrix}$$

We can write this as a linear combination of Pauli matrices $\sigma_i$, where $i \in [x,y,z]$, with real valued coefficients $v_i$ satisfying:

$$v_z = |\alpha|^2 - |\beta|^2, v_x + iv_y = 2\alpha^*\beta \quad (5)$$

Considering assumptions $$\alpha = \cos\left(\frac{\theta}{2}\right) \text{ and } \beta = e^{i\phi}\sin\left(\frac{\theta}{2}\right),$$

we find that $$u_z = \cos^2(\theta/2) - \sin^2(\theta/2) = \cos\theta$$

$$v_x = 2\cos(\theta/2)\sin(\theta/2)\cos(\phi) = \sin\theta\cos\phi$$

$$v_y = 2\cos(\theta/2)\sin(\theta/2)\sin(\phi) = \sin\theta\sin\phi \quad (6)$$

The $u_z$, $v_y$, $v_x$ vectors represent the rotating values on the Bloch sphere. These coordinates are synthesized from a uniform random number generator and used to simulate the expected unitary random behavior for a direct comparison with measured results. The time series of $v_z$ represents the oversampled detector measurements of a single qubit from within the QDA structure. Using multiple qubit measurements, unitary noise is generated to fit any desired characteristic, e.g., tensor shape in a neural network.

Figure 23:
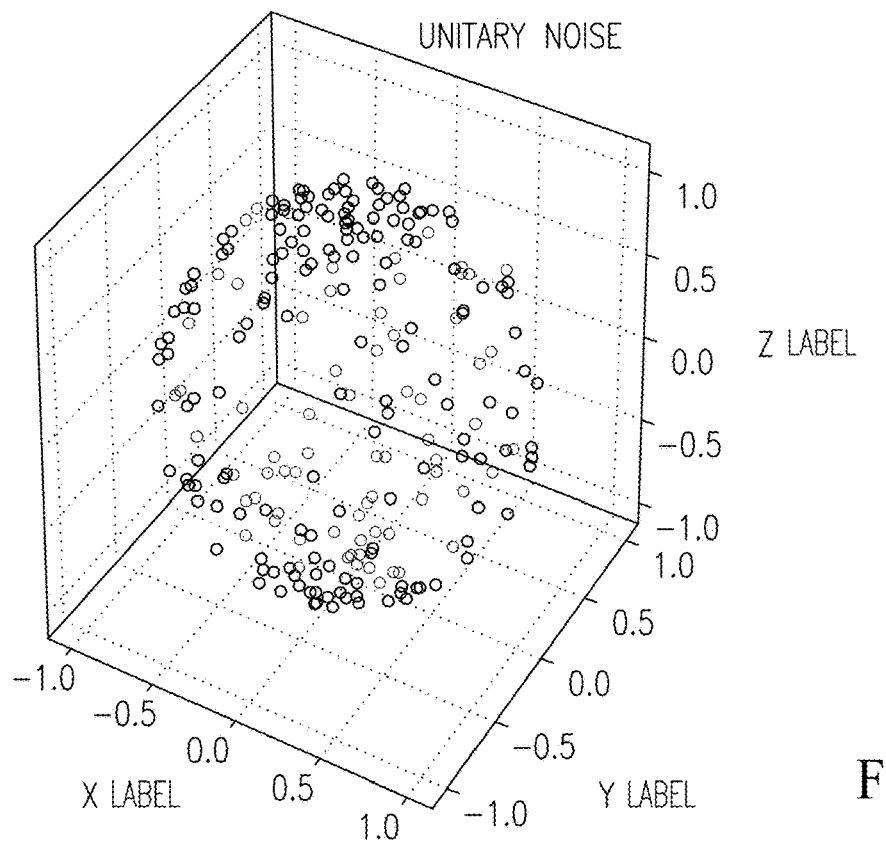
FIGS. 23 and 24 are diagrams illustrating example unitary noise randomness of three orthogonal axis for 500 samples.
Figure 24:
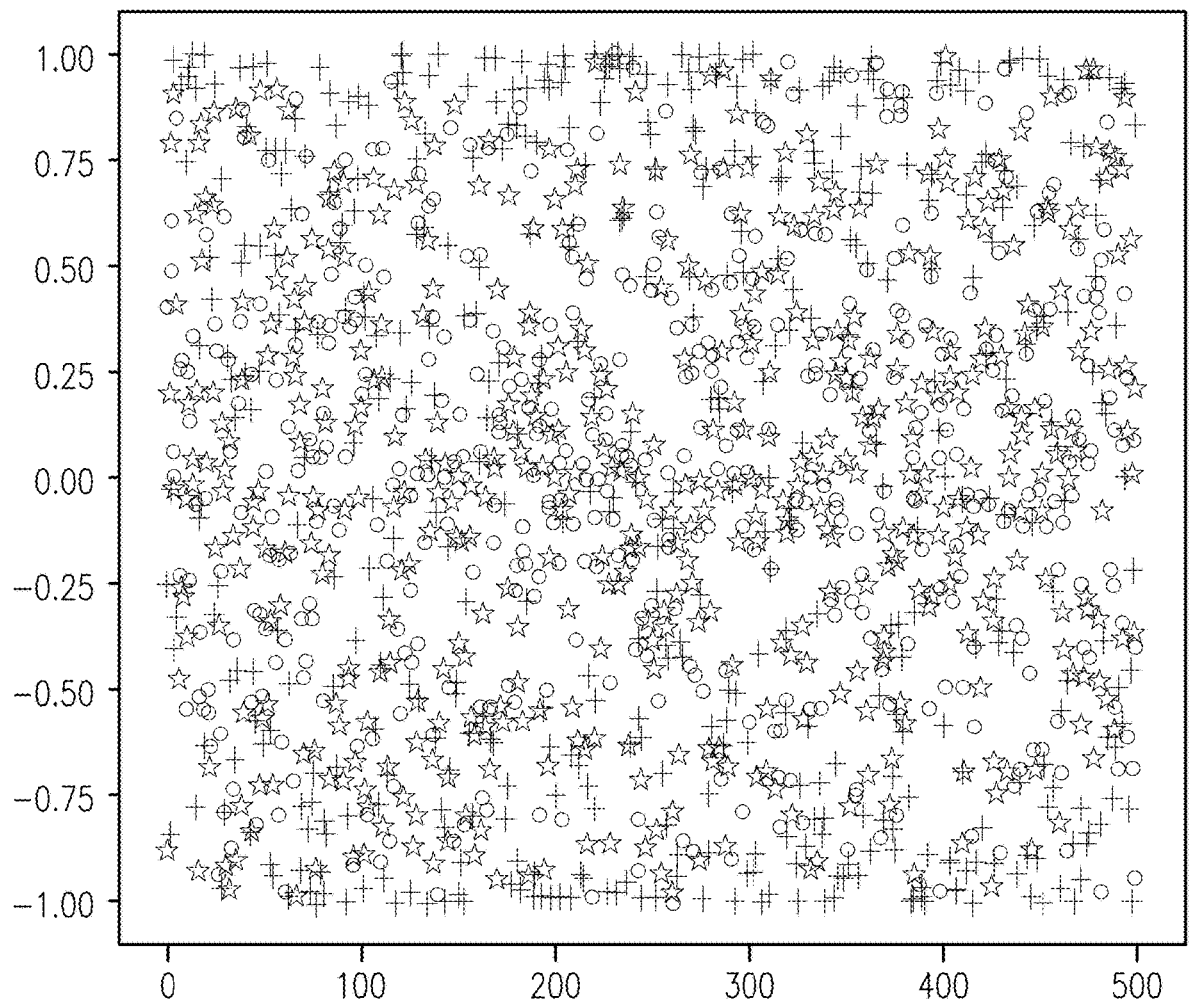

The generated noise terms $u_z$, $v_y$, $v_x$ plotted in a time series in FIG. 23 appear random in nature, but exhibit unitary correlation in a scatter plot shown in FIG. 24 for 500 samples. The source of actual quantum unitary noise comes from direct measurements captured from the QDA structure described supra.

Artificial Neural Network (ANN) Incorporating Quantum Noise and Quantum Stochastic Rounding The technique of introducing noise is a common method for regularizing deep neural networks. In one embodiment, noise is injected onto the raw training dataset images, sometimes including labels, or multiplying and/or adding noise to hidden layers. Alternatively, Gaussian noise is added before or after the nonlinearity layers, yielding additional benefits. Extensive resampling, however, may need to be performed to ensure no unintentional biases are introduced particularly for small datasets with short training cycles. The above techniques require additional computations and longer training times, which in general are undesirable.

In another embodiment, noise generated by a quantum dot array can be shown to improve the training times for CNN architectures without the need for resampling or additional training cycles. Entangled qubits are exploited as a high quality source of unitary quantum noise that is well suited to compression and expansion tasks in the CNN architectures employed for segmentation or object recognition tasks. They act as an L2 regularizing agent preventing the network from overfitting without the loss of feature definition, or the need for oversampling on training datasets.

Figure 25:
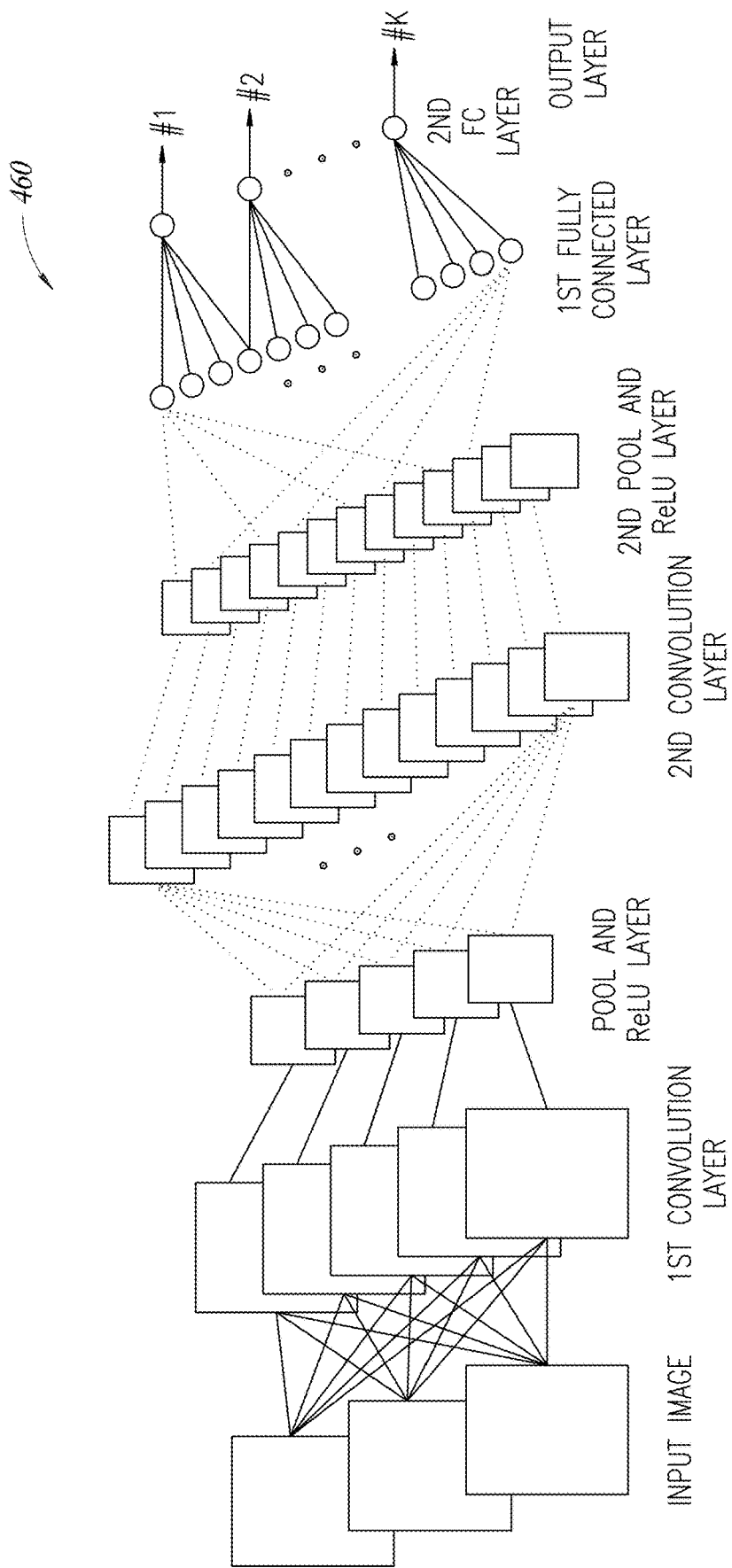
FIG. 25 is a diagram illustrating an example convolutional neural network.

A diagram illustrating an example convolutional neural network is shown in FIG. 25. The example CNN, generally referenced 460, comprises a series of functions including (1) a convolution layer, (2) a pooling layer, and (3) nonlinear activation layer (i.e. ReLU). These layers are repeated many times to make a deep neural network, sometimes with skip or feedforward connections.

Figure 26:
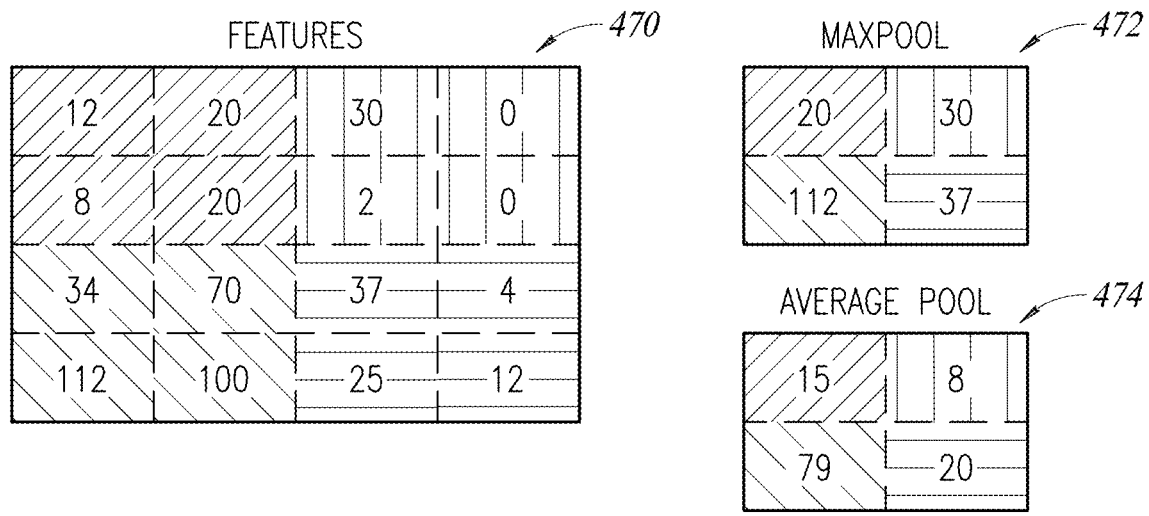
FIG. 26 is a diagram illustrating examples of max pooling and average pooling.

The pooling layer is used to down-sample the outputs of each convolution layer and allows the image tensor volume to be reshaped. Its function is to progressively reduce the spatial size of the representation to reduce the amount of parameters and computation in the network. The pooling layers operate on each feature map independently. Two common techniques of pooling include (1) max pooling and (2) average pooling, as shown in FIG. 26. Applying max pooling to the features 470 yields the block 472 of maximum values from each subgroup of four features. Applying average pooling to the features yields the block 474 of average values from each subgroup of four features.

Figure 27:
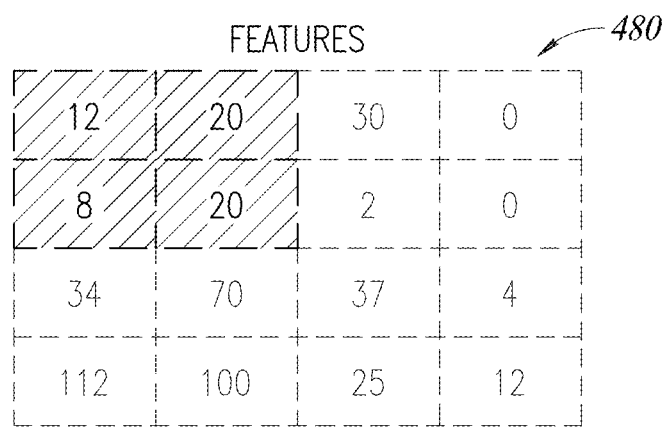
FIG. 27 is a diagram illustrating max pooling with multiple maxima.

Max pooling helps in extracting low level features, such as edges and points, while average pooling favors smooth features. One drawback to max pooling, however, is that it does not distinguish between single and multiple maxima as shown in FIG. 27, i.e. two '20's, or saturated values in this example, wherein there are two maximal values in the stride.

Figure 28:
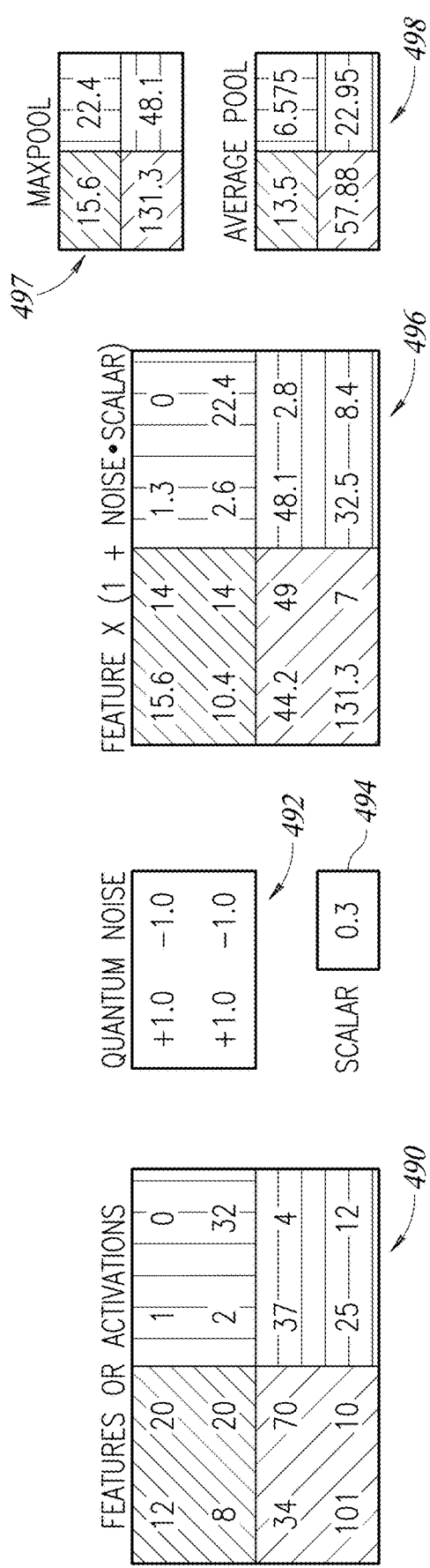
FIG. 28 is a diagram illustrating the effect of unitary noise injected into max pooling layer.

A diagram illustrating the effect of digital unitary quantum noise injected into the max pooling layer is shown in FIG. 28. By introducing a certain amount of noise, the undesired arrangement of multiple maxima can be perturbed and forced to a single maximum value. This has been shown to produce a better result from the max pool layer, thus improving the robustness of the training cycle by making it more general and less dependent on the strong or spurious features that often cause overfitting. If the noise comes from a unitary quantum source and is zero-mean, then this operation can maintain balance from cycle to cycle within the striding pool. As no bias is added, this avoids the need for re-sampling to achieve a zero-mean noise contribution. The standard deviation value acts as a scalar on the amount (i.e. power) of unitary noise and can be adjusted like any other hyperparameter during the training cycle. Similarly, this parameter can be decreased over the training time in much the same way a learning rate parameter would be adjusted.

Note that the quantum unitary noise can be injected into the neural network in any and all layers and in different places within each layer. In one embodiment, the quantum unitary noise is introduced into the neural network at each activation state (or feature) in the layers.

$$\text{activation}=\text{activation}*(1+\text{unitary noise}) \quad (7)$$

Note that in one embodiment, the QDA creates a reservoir of random binary numbers 0 and 1. The 0s and 1s are transformed to −1 and 1 range to give zero mean and balance to the noise. The random number may also be optionally scaled to avoid saturating small values, or zeroing the activation.

$$\text{activation}=\text{activation}*(1+\text{unitary noise}*\text{scaler}) \quad (8)$$

In the example of FIG. 28, quantum unitary noise (492) is scaled via scale factor 494 and applied to features or activations 490. Max pooling 497 or average pooling 498 are applied to the resultant values 496.

Note that the double feature '20' does not result in multiple maxima as described in connection supra with FIG. 26. This is due to the application of the quantum noise to the features or activations.

Note that in one embodiment, the noise derived from the unitary quantum source is zero mean. Thus, the neural network can maintain balance from cycle to cycle within the striding pool. Since no bias is added, there is no need to resample to achieve a zero mean noise contribution. The standard deviation value functions as a scalar on the amount of unitary noise and can be adjusted during the training stage. This parameter can be decreased over the training time similarly to adjustment of a learning rate parameter.

Figure 29:
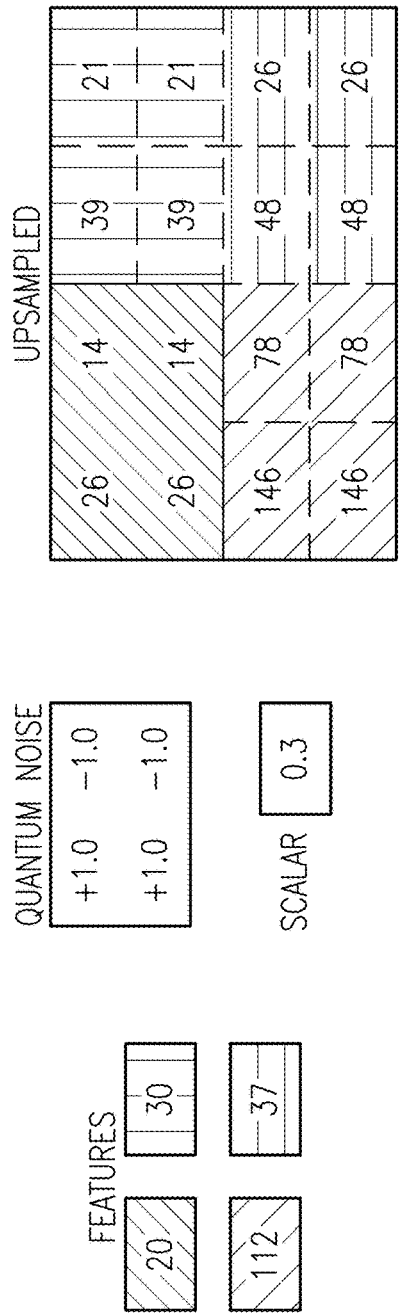
FIG. 29 is a diagram illustrating the effect of unitary noise injected into the up-sampling path.

In a similar manner, by introducing the unitary quantum noise to the up-sampling path, as shown in FIG. 29, a random element is introduced into the broadcasting operation which promotes unique values. This in turn provides a better generalization in the generation of the segmentation pattern without any loss of feature sharpness which comes via the concatenation with the discriminate features. By exploiting the unitary noise, a balanced random distribution is achieved without the need to generate a statistically significant number of samples.

To demonstrate the beneficiary effects of unitary quantum noise, several example segmentation tasks for a number of public datasets are provided where a classic U-Net architecture has been shown to give good performance. The impact of unitary quantum noise in shortening the training cycle of this network topology is highlighted. The U-Net architecture 510, shown in FIG. 30, can be broadly considered as an encoder network or contraction path followed by a decoder network or expansion path. Unlike in the classification where the end result of the deep network score is the sole important outcome, the semantic segmentation not only requires discrimination at the pixel level but also a mechanism to project the discriminative features learned at different stages of the encoder onto the pixel space. In the U-Net architecture shown, unitary quantum noise (UQN) 518 is injected as a layer after the down-sampling, or before the up-sampling layers.

Figure 31:
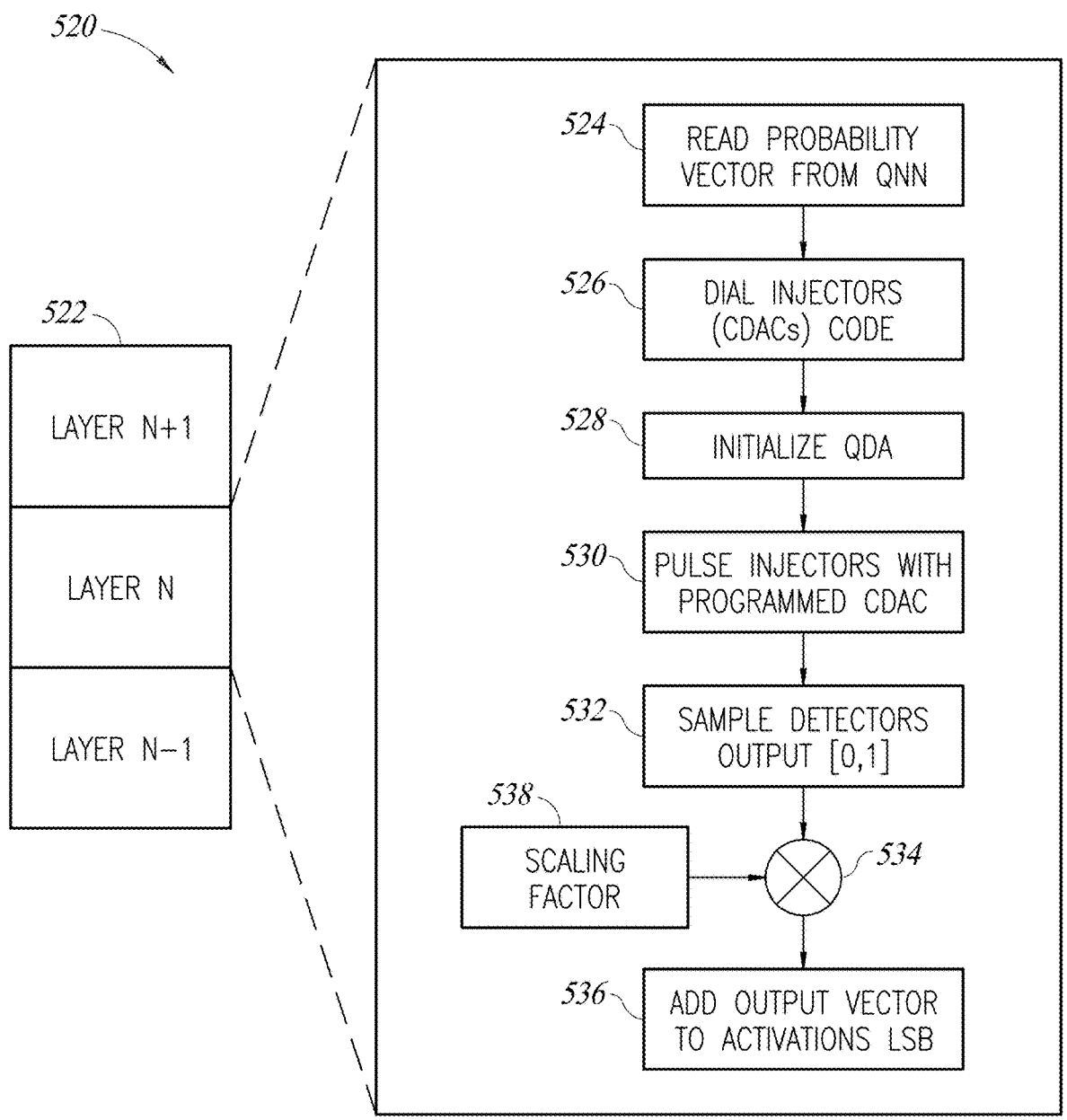
FIG. 31 is a diagram illustrating unitary noise generation and injection to ANN layers.

A diagram illustrating unitary noise generation and injection to ANN layers is shown in FIG. 31. Quantum rounding is employed in one or more layers of the neural network to improve the performance of the network. The example neural network, generally referenced 520, comprises a plurality of layers 522, wherein each layer implements a method of quantum unitary noise injection. In this example, quantum noise is injected to the activations. The quantum noise has a distribution corresponding to an input remainder value. Initially, a probability vector (i.e. remainder) is read from the neural network (or quantum neural network) (step 524). Based on the probability vector read, and knowing the CDAC transfer function, the CDAC code is determined and selected (or 'dialed') into the injector circuit (see, for example, FIGS. 8A and 10) (step 526). The QDA is then initialized (step 528) and each injector is pulse biased with the corresponding output of the programmed CDAC code (step 530). The output of the CDAC controls the barrier height of the gate of the quantum device, e.g., the interface device (see, for example, FIGS. 13 and 22). The presence or absence of the particle due to tunnelling to the quantum dot is then measured by the detector circuit (step 532). The detector output which is either 0 or 1 is sampled. An optional scaling factor and/or range shift (i.e. from 0, 1 to +1,−1) 538 are then applied to the detector output via multiplier 534. The resultant output vector is added to the LSB of the activation (step 536) to effect stochastic rounding.

Figure 32:
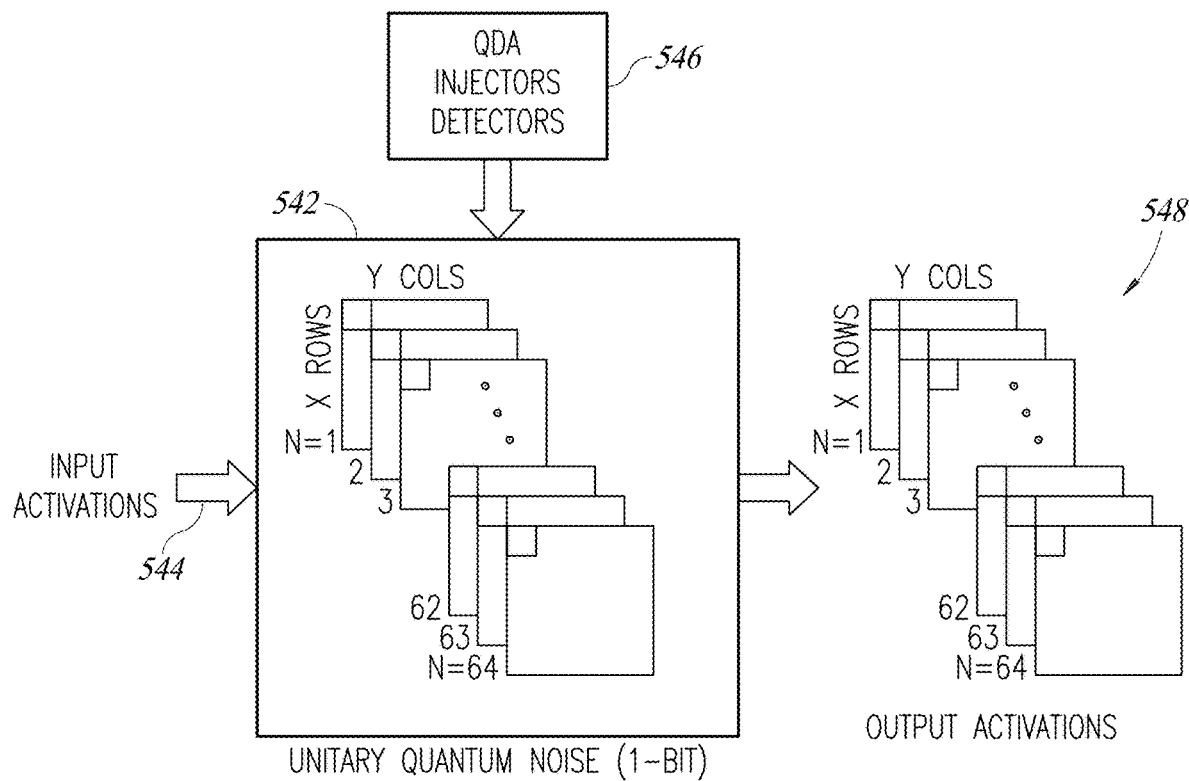
FIG. 32 is a diagram illustrating unitary noise generation and application to activations.

A diagram illustrating unitary noise generation and application to activations is shown in FIG. 32. As described supra, the random unitary quantum noise is generated by one or more quantum devices in the QDA 546. The characteristics of the noise can be configured as desired by controlling the biasing applied to the injectors and imposers in the QDA. Noise having a desired PDF can be generated by appropriate control of the CDACs that provide the gate and drain voltages to raise and lower the tunneling barrier of the quantum devices. The detectors in the QDA measure the presence or absence of a particle and generate a digital output stream therefrom.

The output of the detectors includes a stream of bits that are arranged in multiple arrays of rows and columns 542 to match the input activations 544. In one embodiment, each noise bit is applied to each activation sample. The noise data is applied to yield output activations 548 which are then fed to the subsequent layer in the neural network.

Figure 33:
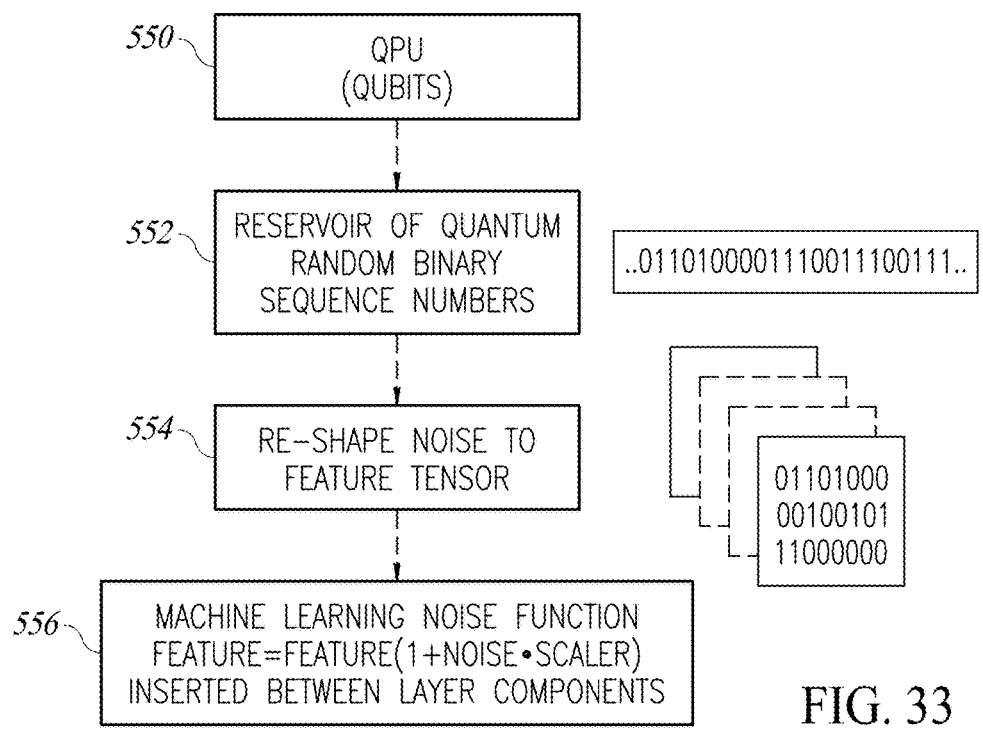
FIG. 33 is a diagram illustrating unitary noise generation and re-shaping.

A diagram illustrating unitary noise generation and reshaping is shown in FIG. 33. The qubits in the QDA in the QPU 550 is the source of the random binary noise sequence of numbers 552 that are derived from the detectors in the QPU. The QPU generates a reservoir of random binary numbers as a sequence. The numbers can be stored for use at a later time or generated on the fly for immediate real time use in an integrated QPU solution. In one embodiment, the random noise sequence is reshaped in accordance with the feature tensors 554 and re-arranged in 2D arrays to match the tensors. For example, the bit sequence is reshaped to match the hardware implementation of the machine learning algorithm. Before applying the noise to the feature tensors, a scale factor is optionally applied (see FIG. 28). The amount or influence the quantum noise has on the features is tuned using a scaling parameter so that different applications require more or less noise introduced into the learning process. Note that the noise is only added during the training stage and set to zero during the validation and inference stages.

After scaling, the machine learning noise function that is applied to the tensors is as follows:

$$\text{feature}=\text{feature}*(1+\text{noise}*\text{scale\_factor}) \quad (9)$$

In one embodiment, the noise is a single bit. Alternatively, the noise may have any number of bits. The noise is inserted between the components of each layer such as before pooling and activation steps 556. It is appreciated that the quantum noise can be inserted at other locations within the layers depending on the particular implementation.

Figure 34:
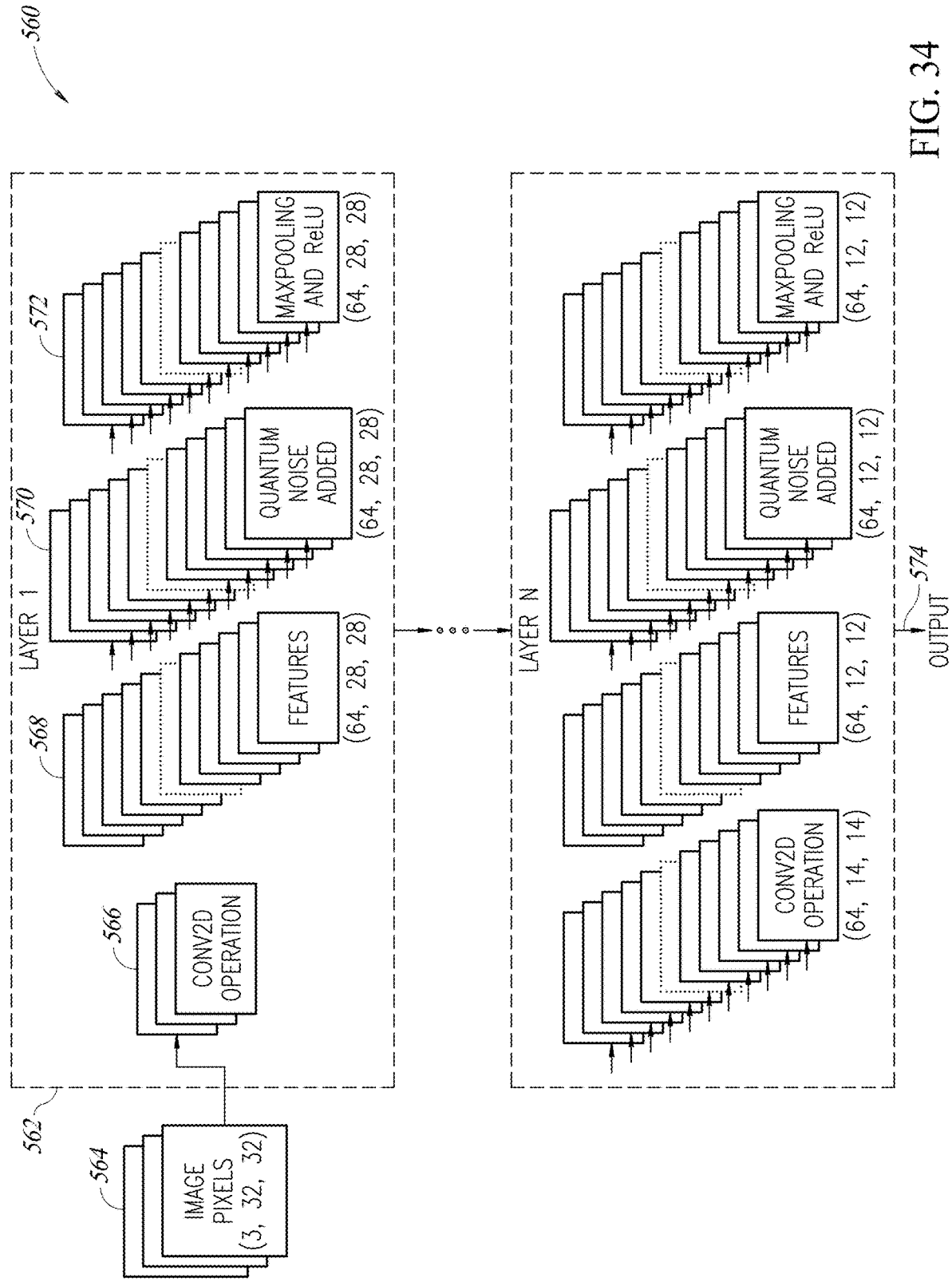
FIG. 34 is a diagram illustrating unitary noise injection to multiple layers in an ANN.

A diagram illustrating unitary noise injection to multiple layers in an ANN is shown in FIG. 34. The neural network, generally referenced 560, comprises a plurality of N layers 562. The network may comprise, for example, the well-known CIFAR-10 (3, 32, 32) dataset. Input image pixels 564 are input to the first layer and output 574 is generated by the last layer. In this example embodiment, the quantum noise 570 is inserted after the features 568 generated by the convolution stage 566 but before max pooling and activation (rectified linear unit or ReLU) stage 572 in each layer 562. This has been shown to improve training for image segmentation or with datasets with only a few labels. The quantum noise generated by the QPU may comprise a single bit or multiple bits. The quantum noise is optionally reshaped to match the tensors for each layer. The noise can be injected into the neural network using, for example, Equation 9 supra.

Figure 35:
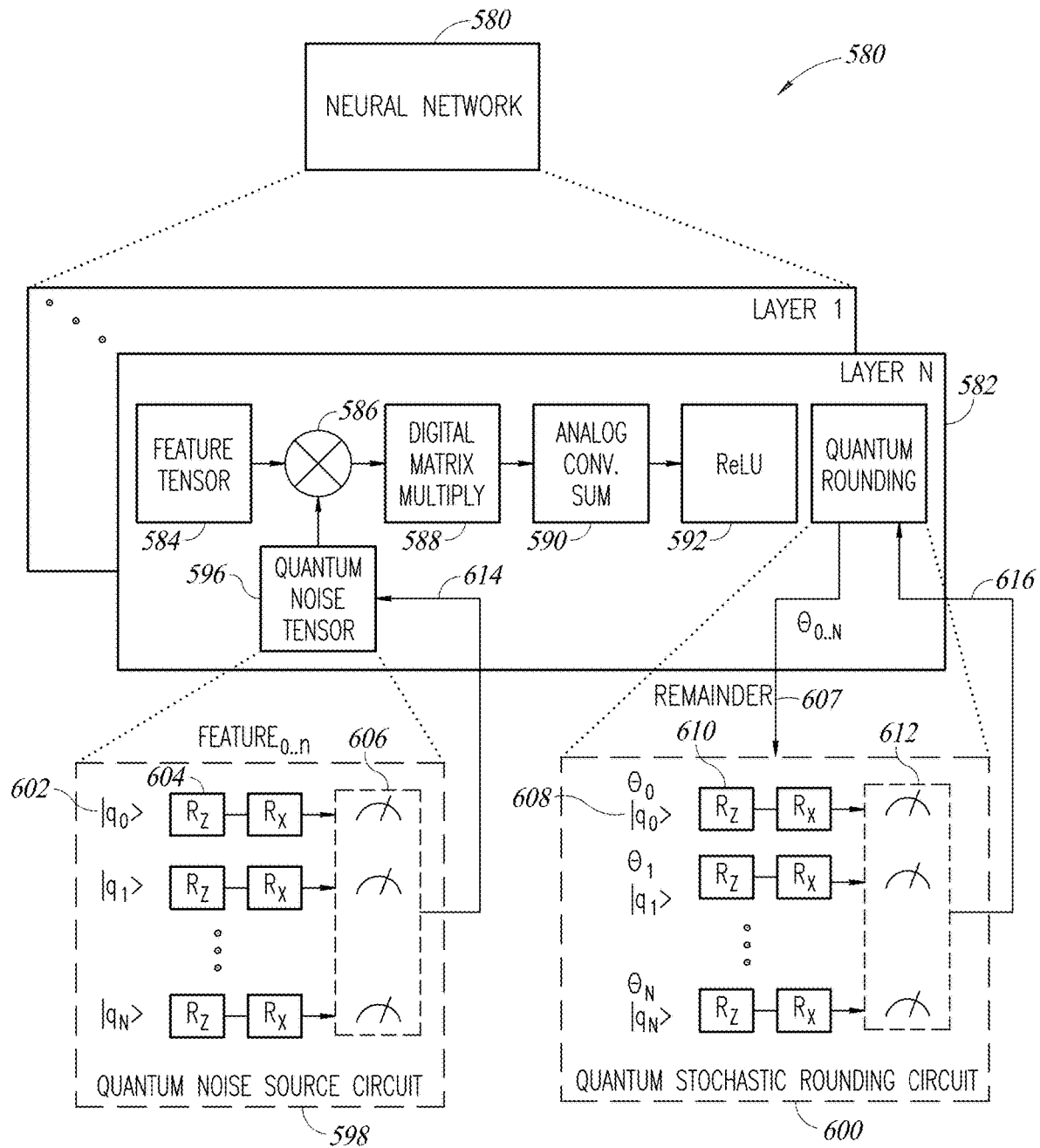
FIG. 35 is a diagram illustrating an example quantum noise source and quantum stochastic rounding in an ANN.

A diagram illustrating an example quantum noise source and quantum stochastic rounding in an ANN is shown in FIG. 35. In one embodiment, both (1) random quantum noise having an approximately equal bi-modal distribution (i.e. 50/50 probability of 0s and 1s) and (2) quantum rounding are applied to the neural network to significantly improve its performance.

The neural network, generally referenced 580, comprises a plurality of layers 1 through N 582. Each layer comprises a feature tensor from a previous layer, injection of random quantum noise 596 via multiplier 586, matrix multiplication 588 in the digital domain, convolutional summing 590 in the analog domain, ReLU stage 592, and quantum rounding stage 600.

In this example, the source for the quantum noise tensor 596 is the quantum noise source circuit 598, i.e. the QDA in the QPU as described in detail supra. The circuit 598 comprises multiple individual qubits $q_0$ to $q_N$ 602 operating in parallel to generate multiple output noise channels. The $R_z$ and $R_x$ blocks 604 represent optional rotations applied to the qubits. Measurements are then taken via detector circuits 606 coupled to each respective qubit to generate the random binary noise sequence 614. The noise is then applied to the features 584.

In addition to injecting the random binary noise sequence, quantum rounding is also applied in each layer. The quantum stochastic rounding circuit such as shown in FIG. 22 described supra can be used to generate the stochastic rounding. In operation, remainder portions 607 of the activations generated in the ReLU stage 592 are input to the quantum stochastic rounding circuit 600. The rounding fractions or remainder values are optionally represented by rotation angles $\theta_0$ through $\theta_N$ for the qubits. Note that there are multiple fractions to be rounded for each tensor. They are input to the respective qubits $q_0$ to $q_N$ 608 and used to skew the PDF of the output of a respective detector 612. The $R_z$ and $R_x$ blocks 610 represent optional rotations applied to the qubits. Note that $R_z$ would use magnetic spin information. After appropriate calibration, the probability of detecting a particle in each qubit correlates with the value of the remainder. The operation of the quantum stochastic rounding circuit is similar to that of the quantum noise source circuit with the difference being that the quantum stochastic rounding circuit is operative to control the PDF of the output of the detector in accordance with the remainder values. The remainder values are used to bias the gate and drain of the quantum devices to skew the PDF of the detector output.

Figure 30:
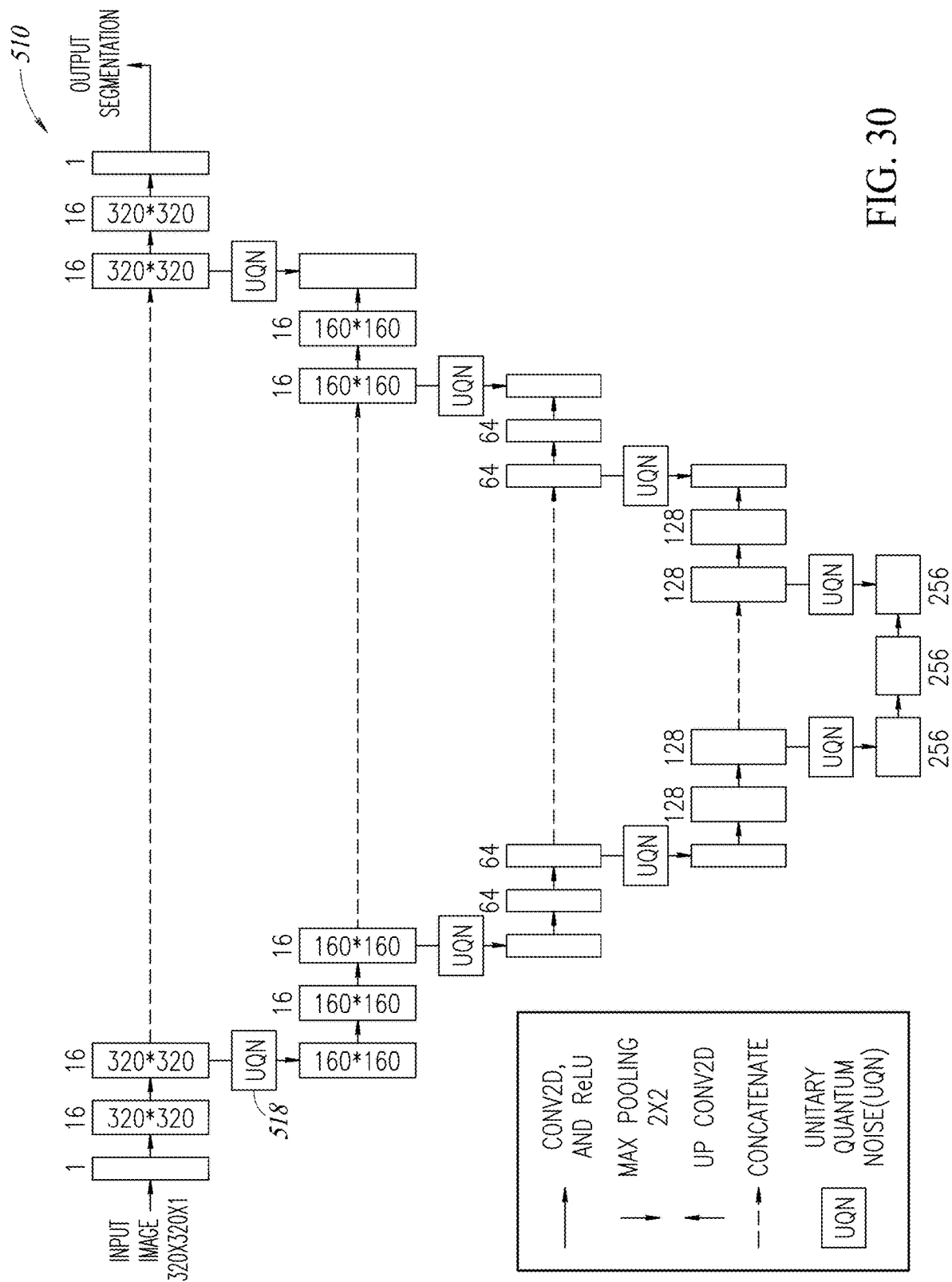
FIG. 30 is a diagram illustrating example U-net architecture with unitary noise injected after down-sampling.

Several examples of the use of quantum noise and quantum rounding in a neural network will now be presented. The U-Net architecture described supra in connection with FIG. 30 is used to demonstrate the advantages of unitary quantum noise. A diagram illustrating an example cell membrane training set is shown in FIG. 36. The first example is a small set of 30 consecutive 256×256 pixel monochrome images from a serial section transmission electron microscopy (ssTEM) dataset of the *Drosophila* first instar larva ventral nerve cord. Two examples of the raw images and the corresponding cell walls are shown which are the target for the semantic segmentation task.

The images are representative of actual images in the real world, i.e. (1) they include a small amount of noise, (2) there are image registration errors, (3) there is a small stitching error in one section. None of these issues, however, would lead to difficulties in the manual labeling of each element in the image stack by an expert human neuroanatomist. A software application that aims at removing or reducing human operation, however, must be able to cope with all these issues.

The metric for semantic segmentation is Dice similarity coefficient (DSC) which is a statistic used to gauge the similarity of two samples. Dice coefficient is computed as 2TP/(2TP +FP+FN), where TP is true positive, FP is false positive, and FN is false negative. It can be considered as two 'pancakes' (i.e. mask and segmented mask) overlaying on each other whereby only the overlapping parts of each one are counted as TP and FP, with FN sides jutting outside each one. An almost perfect match has a Dice score=0.99, while a complete mismatch has Dice score=0.00.

Figure 37:
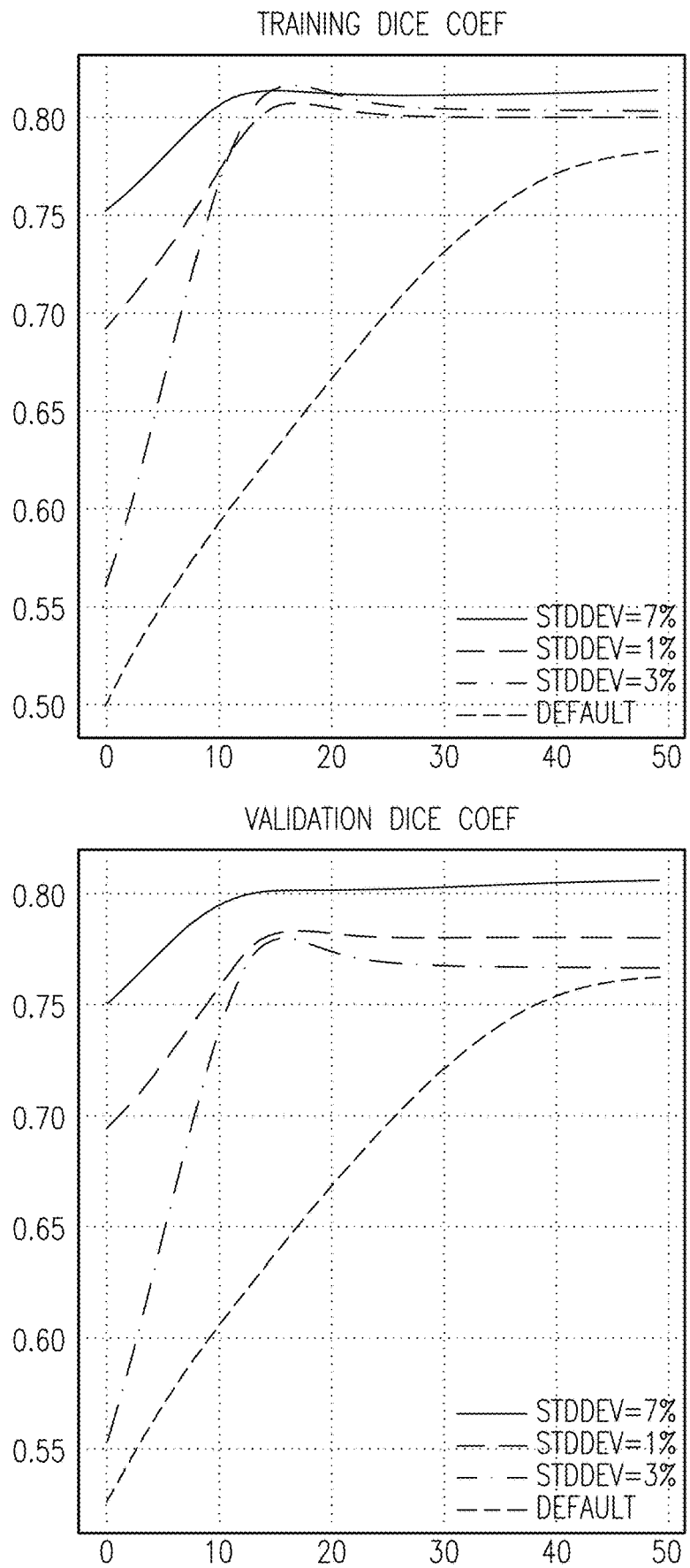
FIG. 37 is a diagram illustrating example training and validation metric for cell membrane segmentation.

As there are 30 images in the membrane dataset, with 22 for training and 8 for validation, clear improvements are shown for different magnitudes of unitary noise versus the default case. Unlike other solutions to this task, data augmentation or other techniques that would artificially expand the size of the training dataset are not used. In resource limited applications, data augmentation is not always an option. The training cycle is run with different amounts of standard deviation values for the unitary noise in order to compare its impact to the default training settings which have noise added. As shown in FIG. 37, the plot trace stddev =7% performs the best. In this particular example, the unitary noise is only added to the up-sampling operations in the network. If we allow the training to continue, the default training curve would keep rising gradually but it would not quite reach the same performance. Comparing the results from the prediction, there are visible improvements, especially inspecting the binary Dice coefficient shown in the rightmost plot. In these experiments, the default configuration uses dropout=0.1, and the image data is normalized. Adam optimized is used, with an initial learning rate=0.001, which then decays after five epochs.

Figure 38:
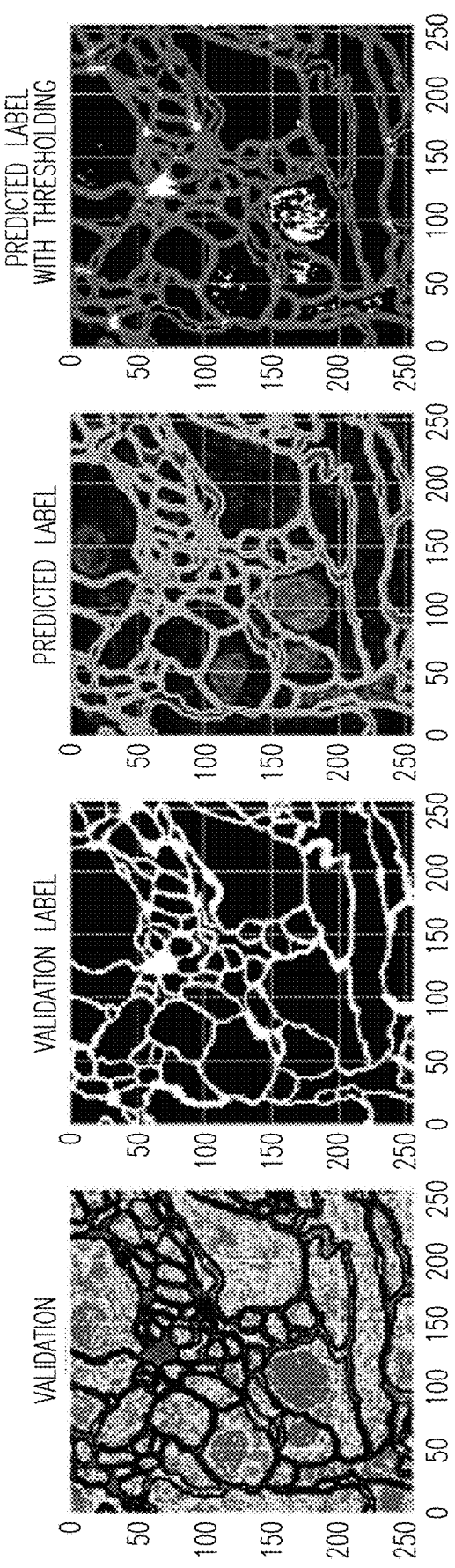
FIG. 38 is a diagram illustrating example default U-Net prediction with default configuration.
Figure 39:
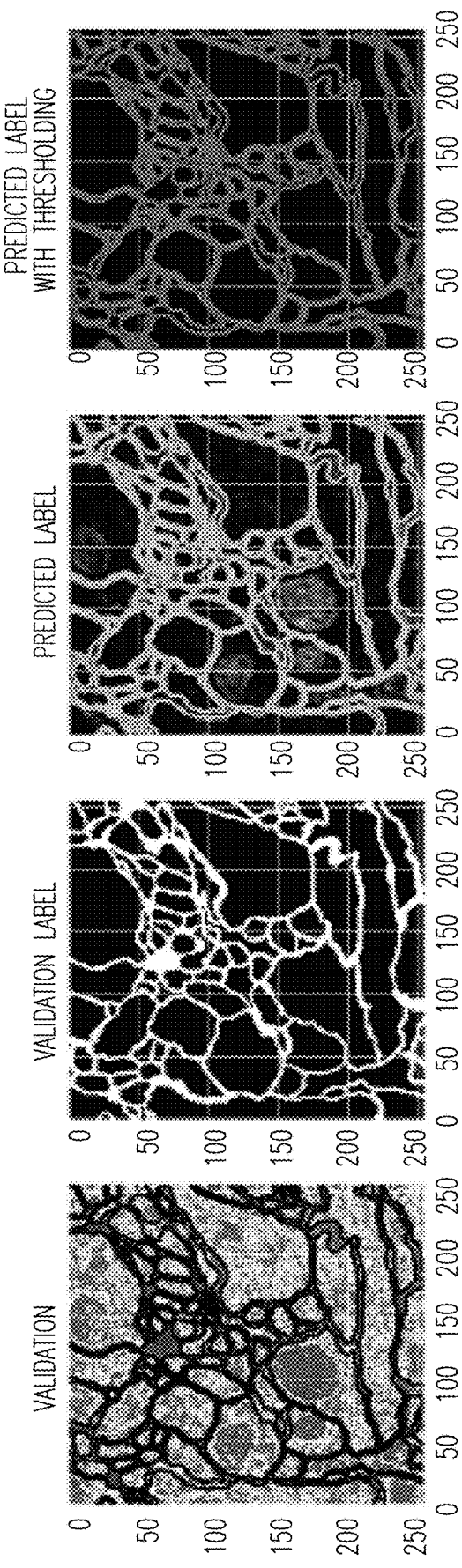
FIG. 39 is a diagram illustrating example default U-Net prediction with 5% standard deviation unitary noise added.

Employing this network to make predictions results in the improved dice coefficient scores. FIG. 38, showing default prediction, and FIG. 39, showing the model trained with the unitary noise, verify the efficacy of the technique. The clearest comparison can be seen in the rightmost image in FIG. 39 with segmentation, where larger thresholds are applied to create sharper imagery.

Figure 40:
FIG. 40 is a diagram illustrating an example satellite image.

An additional dataset representing satellite imagery is derived from www.crowdai.org, where satellite imagery is available for use by humanitarian organizations. During a disaster, it is helpful to map the impassable sections of roads for example, as well as the most damaged residential areas, the most vulnerable schools and public buildings, population movements, etc. The objective is to adapt as quickly as possible the intervention procedures to the evolution of the context generated by the crisis. In the first days following the disaster, it is essential to have as fine a mapping as possible of communication networks, housing areas and infrastructures, areas dedicated to agriculture, etc. The goal is to produce intervention specific maps with relevant features in a short time frame and from disparate data sources using a machine learning solution. The training data as shown in FIG. 40 contains individual tiles of satellite imagery in RGB format (shown as grayscale), and the labels (segmentation superimposed on the images) are the corresponding annotations of where an image exists. The goal is to train a model, which given a new tile (i.e. satellite image), can annotate all buildings. Even though the training dataset has 280,741 tiles (as 300×300 pixel RGB images), the testcase is restricted to only 0.5% of them to accelerate training times.

Figure 41:
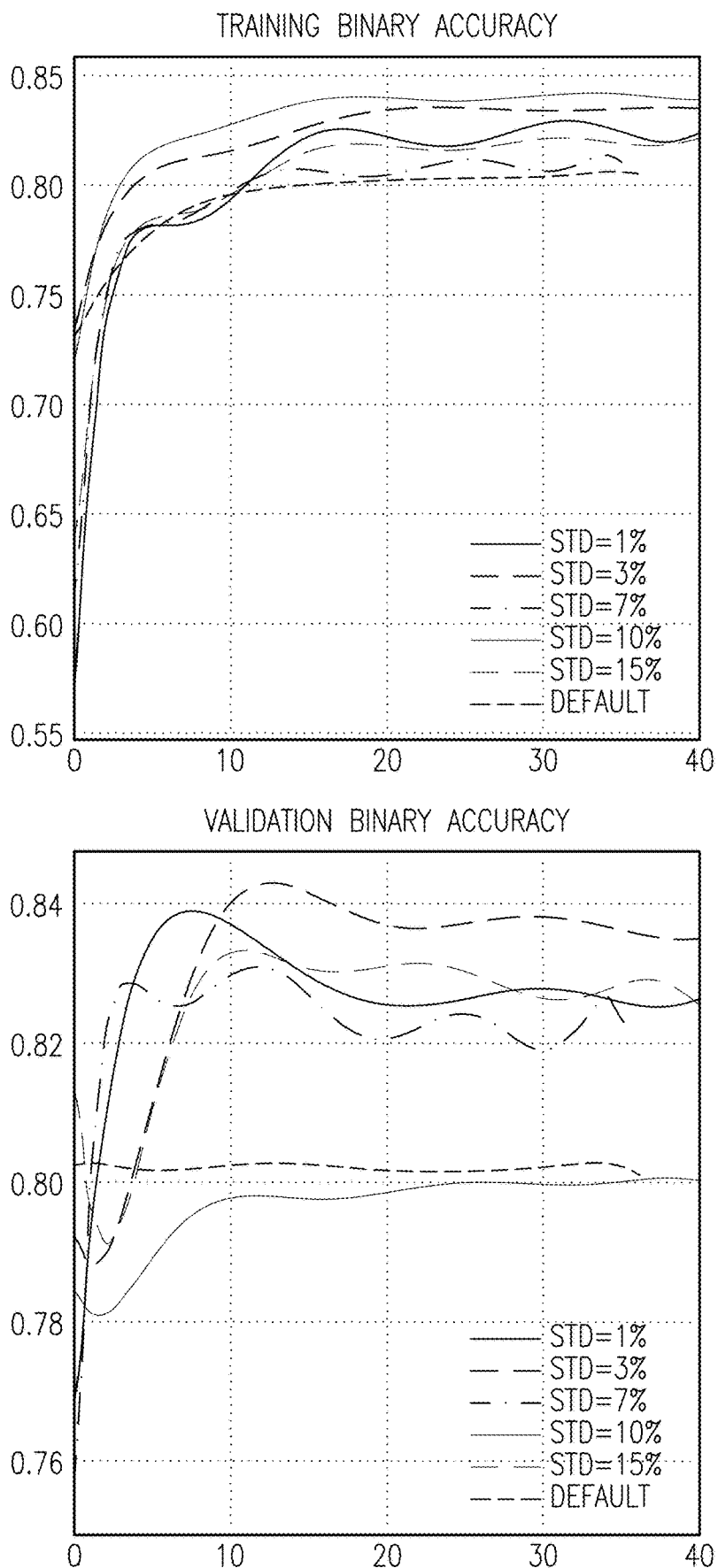
FIG. 41 is a diagram illustrating example training and validation metric for satellite images.

The model architecture used for this task is the same U-Net model described supra in connection with FIG. 30 but extended to support the RGB color information. As the tiles come from different sources, their sizes can vary widely; therefore, each image is resized to 320×320 in order to fit to our network. The plots shown in FIG. 41 show the performance with unitary noise of different levels of standard deviation. The default plot has a Gaussian noise layer added to the input. The performance graphs reveal clear improvements after 30 epochs for the cases with unitary noise added to the training cycles, and these improvements carry through to the validation performance.

Figure 42:
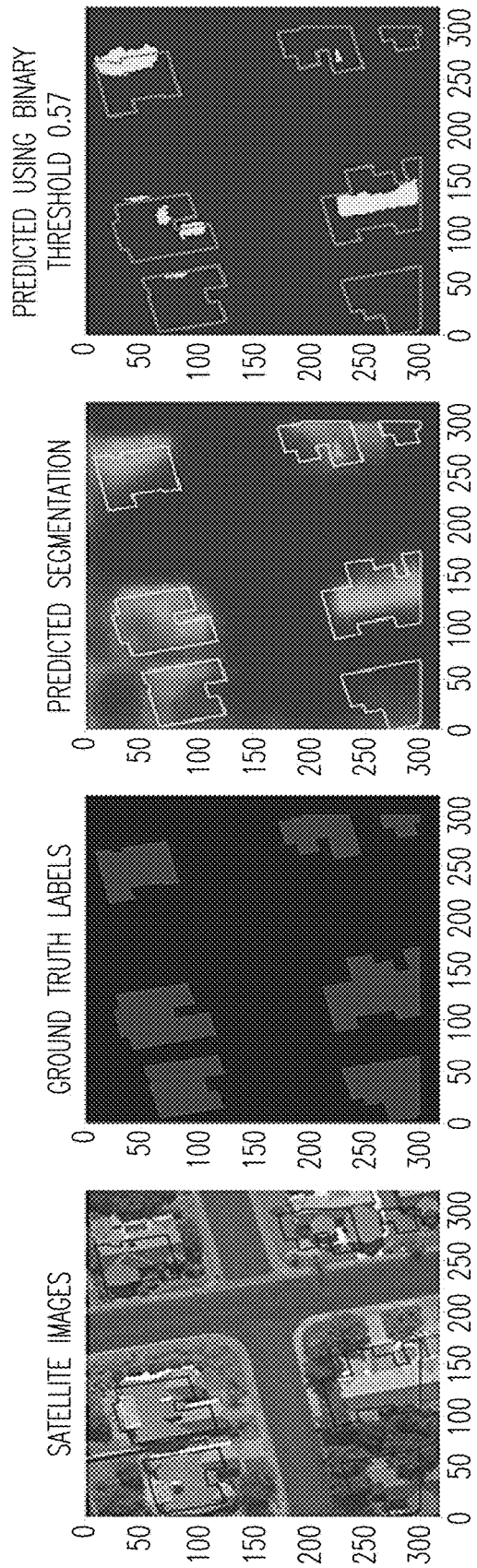
FIG. 42 is a diagram illustrating prediction using default model with a Gaussian layer added to the input.
Figure 43:
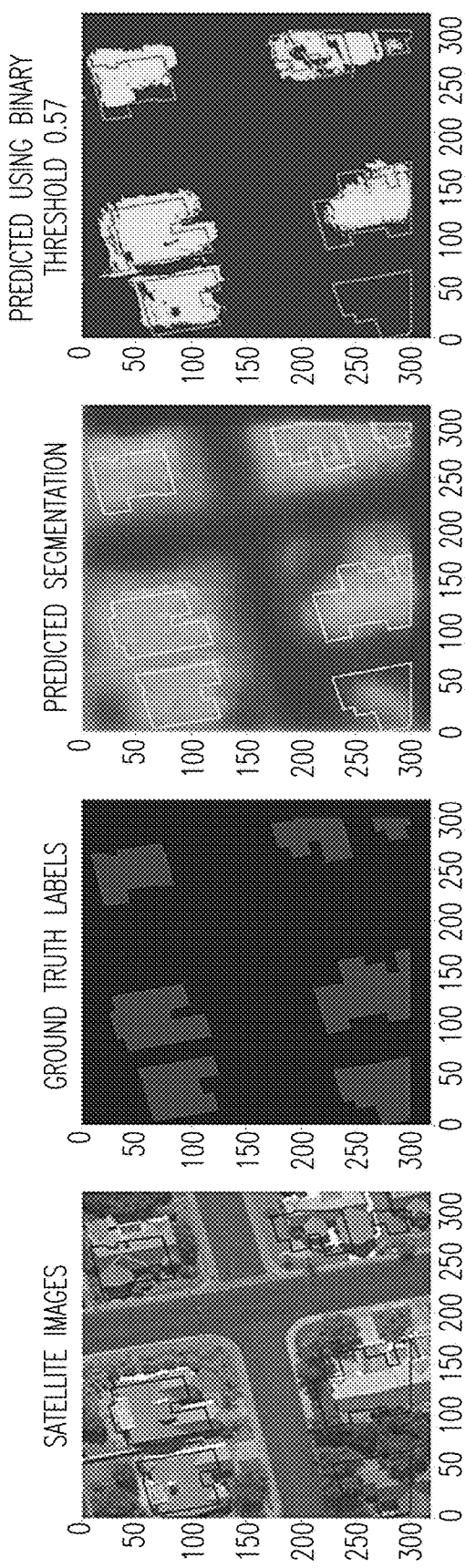
FIG. 43 is a diagram illustrating prediction using default model with unitary noise added.

From the trained model, some predictions are performed to see how these improvements come through visually. The results are illustrated in FIG. 42 for Gaussian noise and in FIG. 43 for unitary noise.

The plots that contain the unitary noise exhibit higher levels of segmentation, without losing sharpness or fidelity, as the binary segmentation image shows. Although some parts of the image were not identified, fine tuning of the noise levels should provide further improvements.

Figure 44:
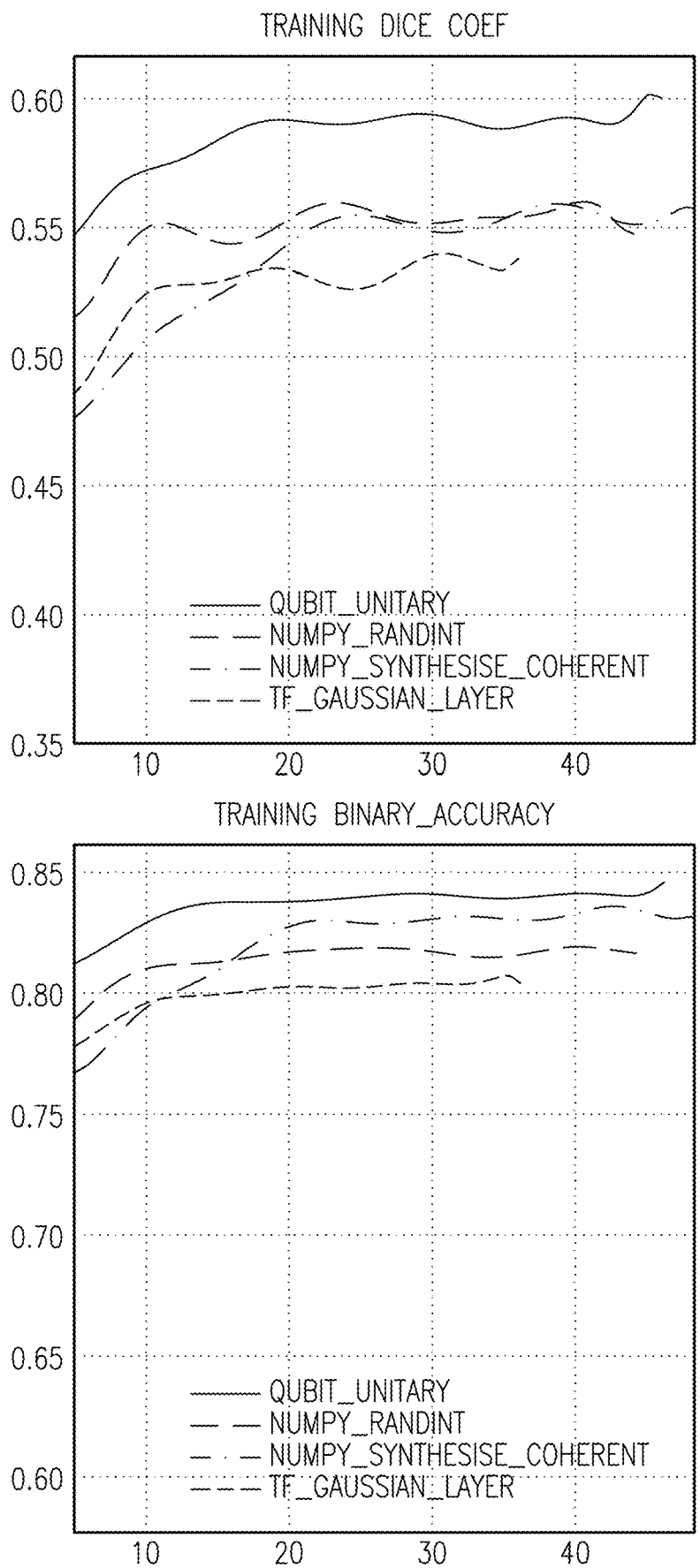
FIG. 44 is a diagram illustrating a first example performance comparison between different noise sources.

A comparison of the influence of different noise sources and their performance results are plotted in FIGS. 44 and 45. For these comparisons, various noise source configurations are used including (1) uniform random noise from Tensor2.x; (2) noise based on numpy.rand projected through the same trigonometric relationships described supra for $v_z$, $v_y$, $v_x$; (3) a Gaussian noise layer as part of keras; and (4) unitary quantum noise of the present invention.

The source of the unitary quantum noise is from measurements made by the detector circuits in the QDA as described in detail supra. The use of unitary quantum noise leads to the best performance across these metrics, reaching the highest scores early in the training cycles. Note that for this experiment no further noticeable improvements are made after epoch 30. From FIG. 45, the other noise sources introduced to the U-Net only achieve the same performance as using the Gaussian layer on the input.

It is appreciated that one skilled in the art can combine the above described embodiments, methods, and techniques in any desired combination to create additional systems that e.g., accelerate learning of a classic NN, accelerate inference of a classic NN, improve reliability, increase speed, reduce energy consumption, etc. For example, RCNNs may be used in the help NNs not just for inference but for training acceleration as well. In addition, quantum tomography may be used for both inference and training acceleration.

Those skilled in the art will recognize that the boundaries between logic and circuit blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the claims, any reference signs placed between parentheses shall not be construed as limiting the claim. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first," "second," etc. are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of quantum stochastic rounding, said method comprising:
   receiving a plurality of remainder values of input numbers on which rounding operations are to be performed;
   providing a quantum noise source operative to generate a digital unitary noise output signal; and
   applying pulsed biasing to said quantum noise source, for each remainder value, via a bias control circuit connected thereto in accordance with the remainder value to yield said unitary noise output signal having a skewed bi-modal probability density function (PDF) corresponding to said remainder value.

2. The method according to claim 1, wherein said quantum noise source comprises a semiconductor based electron tunneling device.

3. The method according to claim 1, wherein said quantum noise source comprises a plurality of semiconductor based electron tunneling devices, each having a quantum dot, whereby said quantum dots are located in sufficient proximity to each other to achieve entanglement between them.

4. The method according to claim 1, further comprising applying said unitary noise output signal to one or more layers of an artificial neural network (ANN) to implement stochastic rounding in the one or more layers of the ANN.

5. A method of quantum stochastic rounding, said method comprising:
   providing a semiconductor qubit structure coupled to a detector circuit, said qubit structure including an electron tunneling device having a particle reservoir and a quantum dot and exhibiting at least two possible energy levels;
   generating an output of said detector circuit corresponding to whether a particle successfully tunneled from said reservoir to said quantum dot;
   receiving a plurality of remainder values of input numbers on which stochastic rounding operations are to be performed; and
   applying pulsed biasing to said qubit structure, for each remainder value, via a bias control circuit connected thereto in accordance with the remainder value such that the probability of detecting said particle via said detector circuit is skewed in accordance with said remainder.

6. The method according to claim 5, further comprising:
   generating a series of pulses applied to said electron tunneling device to lower a barrier sufficiently to enable quantum resonate tunneling between said particle reservoir and said quantum dot;
   detecting for each pulse either said particle tunneling to said quantum dot or said particle not tunneling to said quantum dot; and
   generating a digital output signal in accordance with said detecting.

7. The method according to claim 5, wherein said step of biasing said qubit structure in accordance with each remainder to effect the output of said detector applies stochastic rounding to each input number.

8. The method according to claim 5, further comprising applying said detector circuit output to one or more layers of an artificial neural network (ANN) to implement stochastic rounding in the one or more layers of the ANN.

9. A method of quantum stochastic rounding, said method comprising:
   providing a semiconductor qubit structure coupled to a detector circuit, said qubit structure including:
      a doped region containing a reservoir of particles;
      a quantum dot;
      a gate adapted to function as a barrier between said doped region and said quantum dot;
      wherein said quantum structure exhibits at least two possible energy levels;
   generating an output of said detector circuit corresponding to whether a particle successfully tunneled from said doped region to said quantum dot;
   receiving a plurality of remainder values on which stochastic rounding operations are to be performed; and
   applying pulsed biasing, for each remainder, to said qubit structure via a bias control circuit connected thereto in accordance with the remainder such that the probability of detecting said particle via said detector circuit corresponds to said remainder.

10. The method according to claim 9, further comprising:
    generating a series of pulses applied to said qubit structure to lower said barrier sufficiently to enable quantum resonate tunneling between said doped region and said quantum dot;

detecting for each pulse either said particle tunneling to said quantum dot or said particle not tunneling to said quantum dot; and generating a digital output signal in accordance with said detecting.

11. The method according to claim 9, wherein said step of biasing said qubit structure in accordance with each remainder to effect the output of said detector applies stochastic rounding to each input number.

12. The method according to claim 9, further comprising applying said detector circuit output to one or more layers of an artificial neural network (ANN) to implement stochastic rounding therein.

13. An apparatus for quantum stochastic rounding, comprising:
   a quantum noise source operative to generate a unitary noise output signal;
   a first circuit operative to receive a plurality of remainder values of input numbers on which rounding operations are to be performed; and
   a bias control circuit operative, for each remainder value, to apply pulsed biasing to said quantum noise source such that a bi-modal probability density function (PDF) of said unitary noise output signal is skewed in accordance with each remainder value.

14. The apparatus according to claim 13, wherein said quantum noise source comprises a semiconductor based electron tunneling device.

15. The apparatus according to claim 13, wherein said quantum noise source comprises a plurality of semiconductor based electron tunneling devices, each having a quantum dot, whereby said quantum dots are located in sufficient proximity to each other to achieve entanglement between them.

16. The apparatus according to claim 13, further comprising a second circuit operative to apply said unitary noise output signal to one or more layers of an artificial neural network (ANN) to implement stochastic rounding in the one or more layers of the ANN.

17. An apparatus for quantum stochastic rounding, comprising:
   a semiconductor based electron tunneling device including:
      a substrate;
      a low doped or undoped layer fabricated on said substrate, a portion of which functions as a quantum dot;
      a doped region containing a reservoir of particles;
      a gate fabricated on said low doped or undoped layer whereby said doped region is located of one side of said gate and said quantum dot on another side of said gate, said gate operative to function as a barrier between said doped region and said quantum dot;
   a circuit operative to receive a plurality of remainder values corresponding to numbers on which rounding operations are to be performed;
   a bias control circuit coupled to said gate and operative to generate and apply, for each remainder value, one or more pulsed bias control signals to said electron tunneling device in accordance with each remainder such that the probability of detecting said particle via a detector circuit corresponds to each remainder value; and
   said detector circuit coupled to said doped region and operative to detect for each pulse either said particle tunneling to said quantum dot or said particle not tunneling to said quantum dot and generating a digital output signal accordingly.

18. The apparatus according to claim 17, wherein said bias control circuit is operative to generate and apply a series of pulses to said gate to enable quantum resonate tunneling between said doped region and said quantum dot.

19. The apparatus according to claim 17, wherein a skewed output of said detector is used to perform stochastic rounding on each said number.

20. The apparatus according to claim 17, further comprising an output of said detector to one or more layers of an artificial neural network (ANN) to implement stochastic rounding in the one or more layers of the ANN.

* * * * *